United States Patent
Lin et al.

(10) Patent No.: US 12,557,375 B2
(45) Date of Patent: Feb. 17, 2026

(54) SEMICONDUCTOR DEVICES AND METHODS OF MANUFACTURING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Chun-Jun Lin, Hsinchu (TW); Kuo-Hua Pan, Hsinchu (TW); Jhon Jhy Liaw, Hsinchu (TW); Hsiu-Yu Kang, Taipei (TW); Yu-Hsuan Lu, Kaohsiung (TW); Hui-Chi Chuang, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 837 days.

(21) Appl. No.: 17/714,085

(22) Filed: Apr. 5, 2022

(65) Prior Publication Data
US 2023/0009852 A1  Jan. 12, 2023

Related U.S. Application Data

(60) Provisional application No. 63/219,427, filed on Jul. 8, 2021.

(51) Int. Cl.
*H10D 84/83* (2025.01)
*H10D 30/01* (2025.01)
(Continued)

(52) U.S. Cl.
CPC ......... *H10D 84/834* (2025.01); *H10D 30/024* (2025.01); *H10D 30/6211* (2025.01);
(Continued)

(58) Field of Classification Search
CPC .............. H10D 84/834; H10D 30/024; H10D 30/6211; H10D 30/6219; H10D 62/115;
(Continued)

(56) References Cited

U.S. PATENT DOCUMENTS 9,105,490 B2  8/2015  Wang et al.
9,236,267 B2  1/2016  De et al.
(Continued)

FOREIGN PATENT DOCUMENTS

TW  201916365  4/2019
TW  202013510  4/2020
TW  202115873  4/2021

OTHER PUBLICATIONS

Office Action in corresponding German patent application No. 102022108886.3 issued on Sep. 5, 2023, and an English translation thereof.

*Primary Examiner* — Marlon T Fletcher
*Assistant Examiner* — Da Wei Lee
(74) *Attorney, Agent, or Firm* — HAYNES AND BOONE, LLP

(57) ABSTRACT

According to the present disclosure, hybrid fins positioned between two different epitaxial source/drain features are recessed to prevent conductive material from entering interior air gaps of the hybrid fins, thus, preventing short circuit between source/drain contacts and gate electrodes. Recessing the hybrid fins may be achieved by enlarging mask during semiconductor fin etch back, therefore, without increasing production cost.

20 Claims, 61 Drawing Sheets

(51) Int. Cl.
 *H10D 30/62* (2025.01)
 *H10D 62/10* (2025.01)
 *H10D 84/01* (2025.01)
 *H10D 84/03* (2025.01)

(52) U.S. Cl.
 CPC ....... *H10D 30/6219* (2025.01); *H10D 62/115* (2025.01); *H10D 84/013* (2025.01); *H10D 84/0151* (2025.01); *H10D 84/0158* (2025.01); *H10D 84/038* (2025.01)

(58) Field of Classification Search
 CPC ............. H10D 84/013; H10D 84/0151; H10D 84/0158; H10D 84/853; H10D 84/017
 See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2015/0028454 A1* | 1/2015 | Cheng | H10D 84/0193 438/478 |
| 2016/0020150 A1* | 1/2016 | You | H01L 21/02529 438/283 |
| 2016/0343623 A1* | 11/2016 | Fogel | H10D 84/0191 |
| 2020/0098888 A1 | 3/2020 | Lin et al. | |
| 2020/0381257 A1 | 12/2020 | Lin et al. | |
| 2021/0057023 A1 | 2/2021 | Liaw | |
| 2021/0074819 A1* | 3/2021 | Wang | H10D 84/0193 |
| 2021/0202714 A1 | 7/2021 | Yu et al. | |
| 2021/0327764 A1* | 10/2021 | Lin | H01L 21/0228 |

* cited by examiner

SEMICONDUCTOR DEVICES AND METHODS OF MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
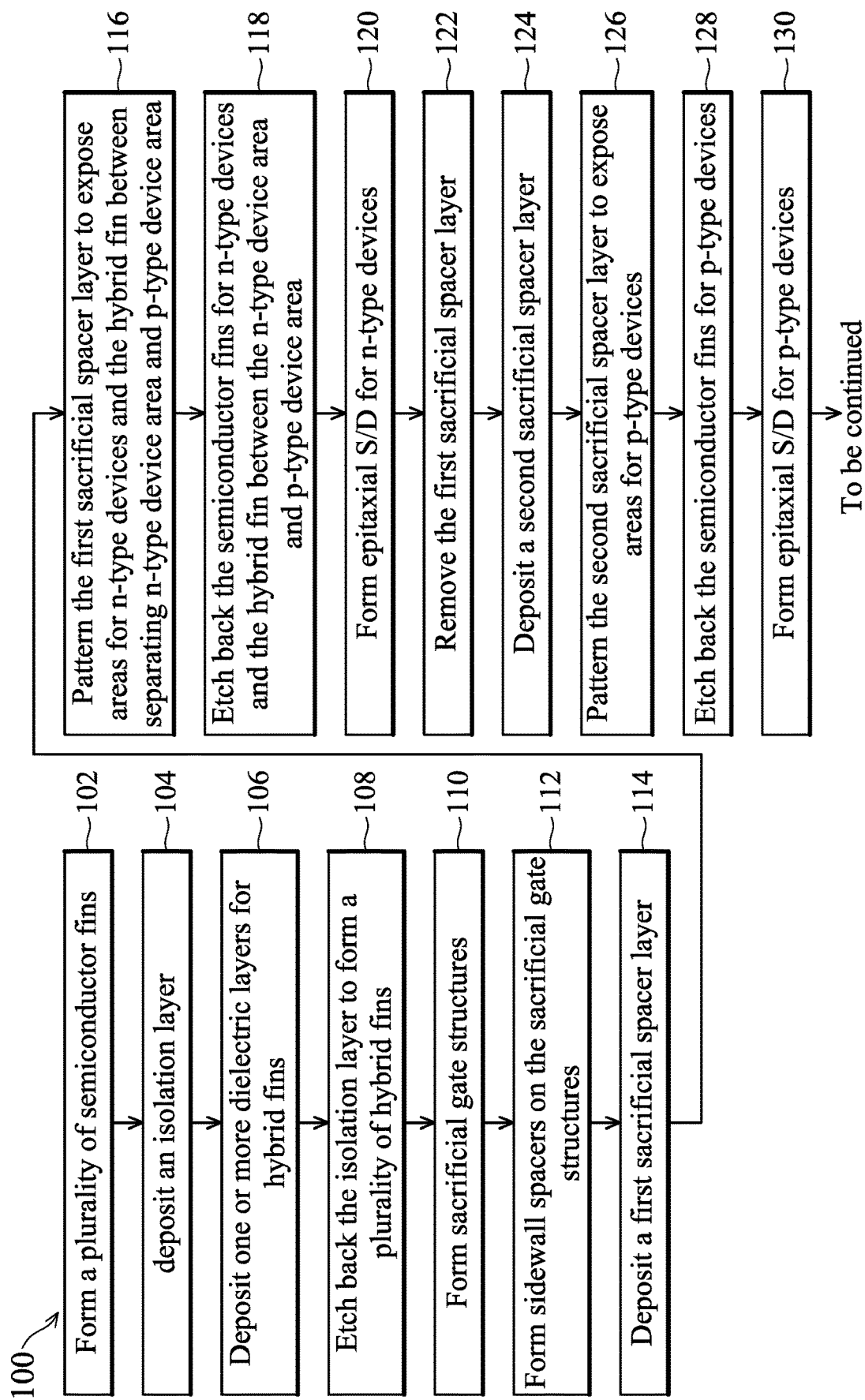
FIG. 1 is a flow chart of a method for manufacturing of a semiconductor device according to embodiments of the present disclosure.
Figure 1:
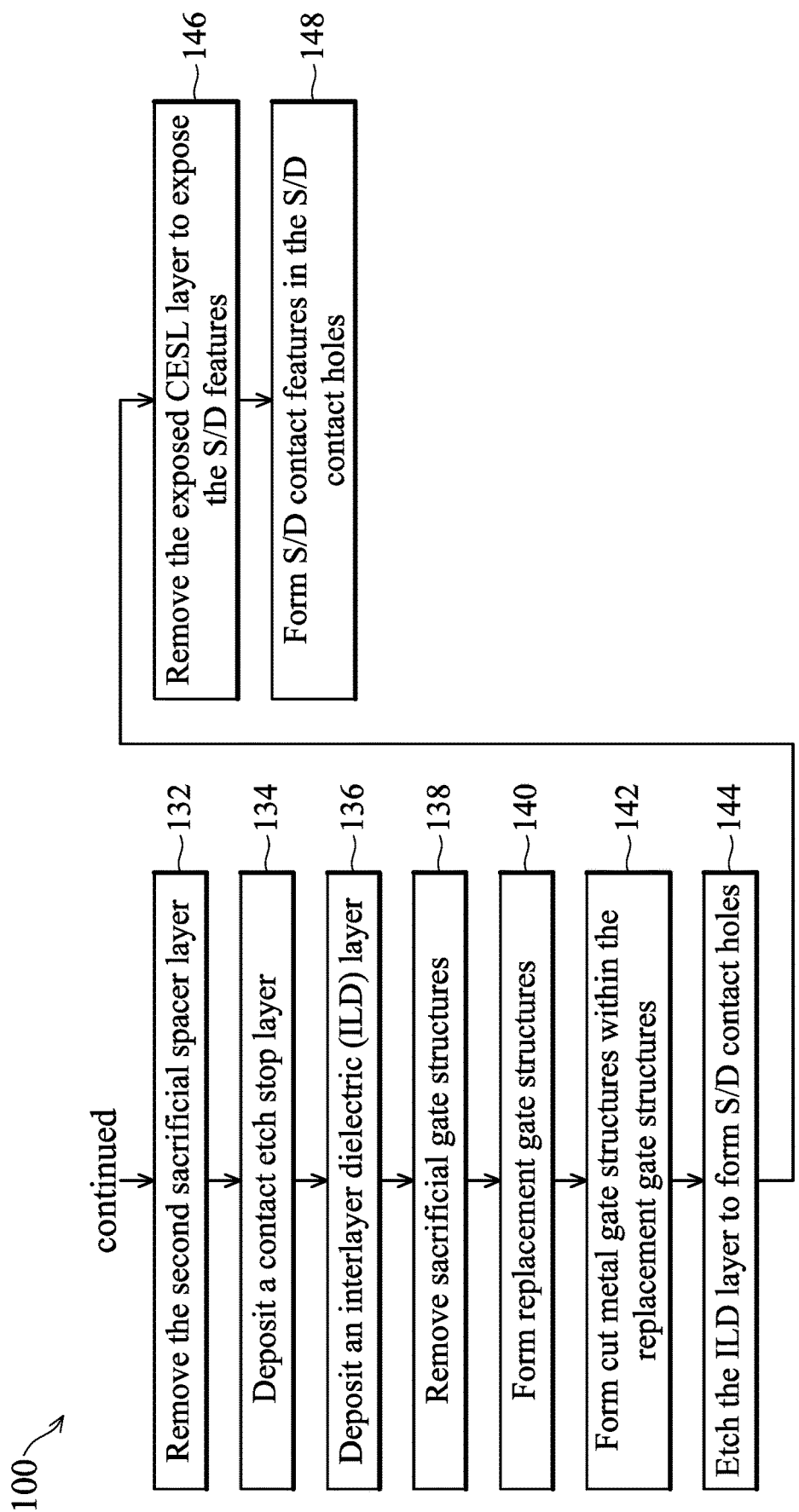

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanostructure FETs (e.g. nanowire transistor, nanosheet transistor, gate all around transistor, etc.), implementations of some aspects of the present disclosure may be used in other processes and/or in other devices, such as planar FETs, Fin-FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The present disclosure relates to a semiconductor device having source/drain contacts with improved RC delay and reduced resistance. Particularly, semiconductor devices according to the present disclosure include height varying hybrid fins between boundaries of p-type device area and n-type device area.

FIG. 1 is a flow chart of a method 100 for manufacturing of a semiconductor device according to embodiments of the present disclosure. FIGS. 2-28 schematically illustrate various stages of manufacturing a semiconductor device 200 according to embodiments of the present disclosure. Particularly, the semiconductor device 200 may be manufactured according to the method 100 of FIG. 1. FIGS. 2-28 are schematic perspective views of the semiconductor device 200.

Figure 2:
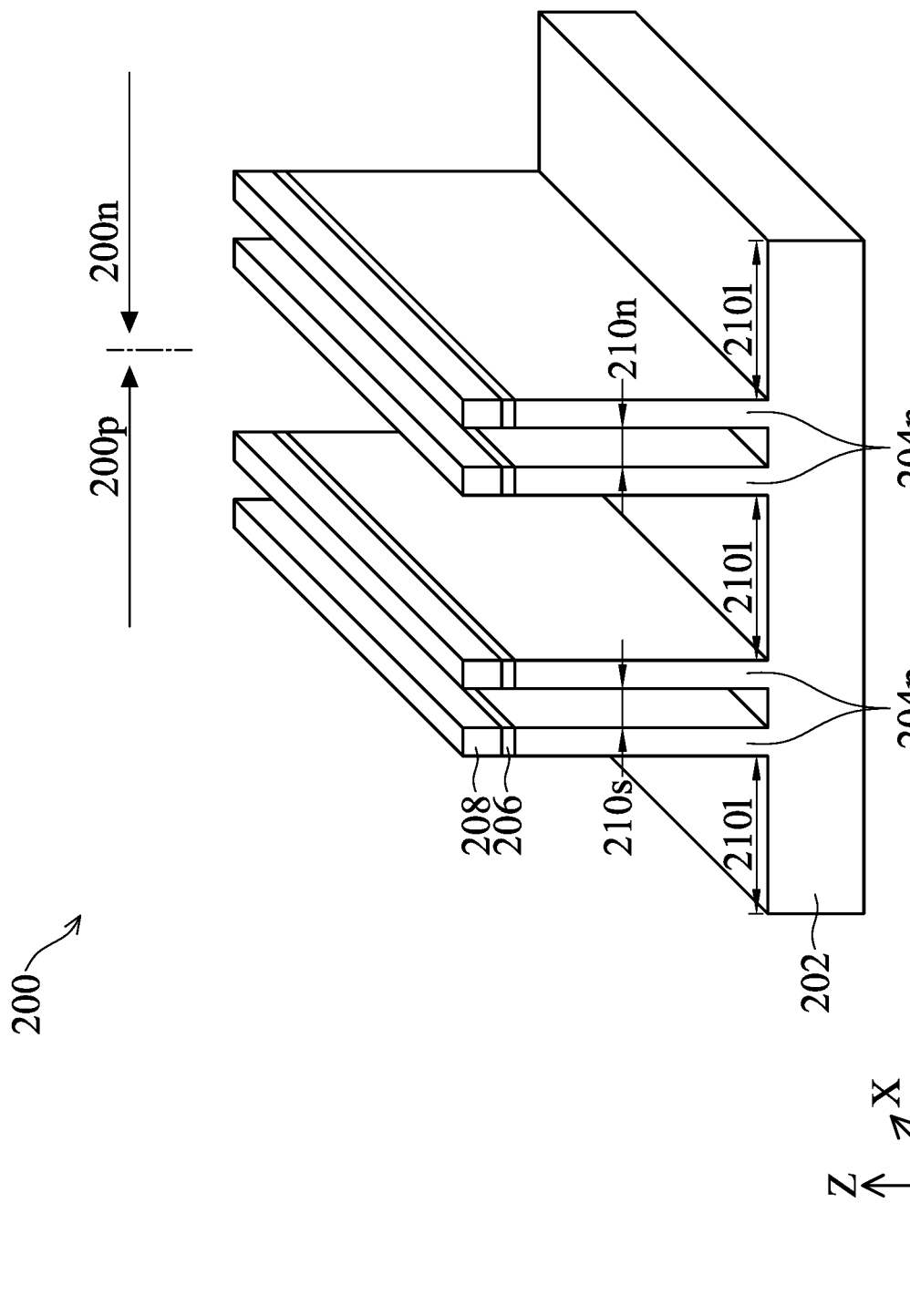
FIGS. 2-28, and 28A-28E schematically illustrate various stages of manufacturing a semiconductor device according to embodiments of the present disclosure.

At operation 102 of the method 100, semiconductor fins 204 are formed on a substrate 202, as shown in FIG. 2. FIG. 2 is a schematic perspective view of the semiconductor device 200 according to the present disclosure. The substrate 202 may be a bulk silicon substrate. Alternatively, the substrate 202 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. The substrate 202 may also be a silicon-on-insulator (SOI) substrate. SOI substrates are fabricated using separation by implantation of oxygen (SIMOX), wafer bonding, and/or other suitable methods.

The substrate 202 may include various doping configurations depending on circuit design. For example, the substrate 202 may include one or more p-doped regions and one or more n-doped regions. The p-doped regions may be doped with p-type dopants, such as boron or BF2. The n-doped region may be doped with n-type dopants, such as phosphorus or arsenic. The doped regions may be formed directly on the substrate 202, in a P-well structure, in an N-well structure, in a dual-well structure, and/or using a raised structure. The substrate 202 may further include various active regions, such as regions configured for an N-type metal-oxide-semiconductor transistor device and regions configured for a P-type metal-oxide-semiconductor transistor device. The semiconductor fins 204$n$, 204$p$ (collectively 204) may be formed by suitable patterning and etching processes. N-type devices are subsequently formed from the semiconductor fins 204$n$ while p-type devices are subsequently formed from the semiconductor fins 204$p$. The semiconductor fins 204$n$ are formed over a n-type device area 200$n$ and the semiconductor fins 204$p$ are formed over a p-type device area 200$p$.

In some embodiments, a pad layer 206 and a mask layer 208 are deposited on the substrate 202, then patterned, and used as a mask to form the semiconductor fins 204. The pad layer 206 and mask layer 208 may be formed over the substrate 202 be blanket deposition. A patterned photo-sensitive layer, not shown, may then formed over the mask layer 208. The pad layer 206 and the mask layer 208 may be patterned using one or more photolithography processes with the patterned photo-sensitive layer. In some embodiments, the double-patterning or multi-patterning processes may be used to pattern the pad layer 206 and the mask layer 208. The patterned pad layer 206 and the mask layer 208 are then used as a mask to etch the substrate 202 to form the semiconductor fins 204. In some embodiments, the pad layer 206 may be a thin film comprising silicon oxide formed, for example, using a thermal oxidation process. The pad layer 206 may act as an adhesion layer between the substrate 202 and the mask layer 208. In some embodiments, the mask layer 208 includes silicon nitride, for example, silicon nitride formed using low-pressure chemical vapor deposition (LPCVD) or plasma enhanced chemical vapor deposition (PECVD).

As shown in FIG. 2, the semiconductor fins 204$p$, 204$n$ extends along the x-direction from the substrate 202. Trenches 210 (210$s$, 210$l$) are formed between neighboring semiconductor fins 204$p$, 204$n$. The trenches 210 are formed along the x-direction. As shown in FIG. 2, the trenches 210 may have different widths along the y-direction to according to circuit design. In some embodiments, hybrid fins or dielectric fins are to be formed in some of trenches 210. In some embodiments, the hybrid fins may function to provide electric isolation between active regions of the different devices. In other embodiments, hybrid fins function to provide support to subsequently formed gate structures, particularly when to provide support to sacrificial gate structures between wide trenches 210$l$. The trenches 210$l$ denote wider trenches in which hybrid fins are subsequently formed, and the trenches 210$s$ denote narrow trenches in which no hybrid fins are to be formed.

Figure 3:
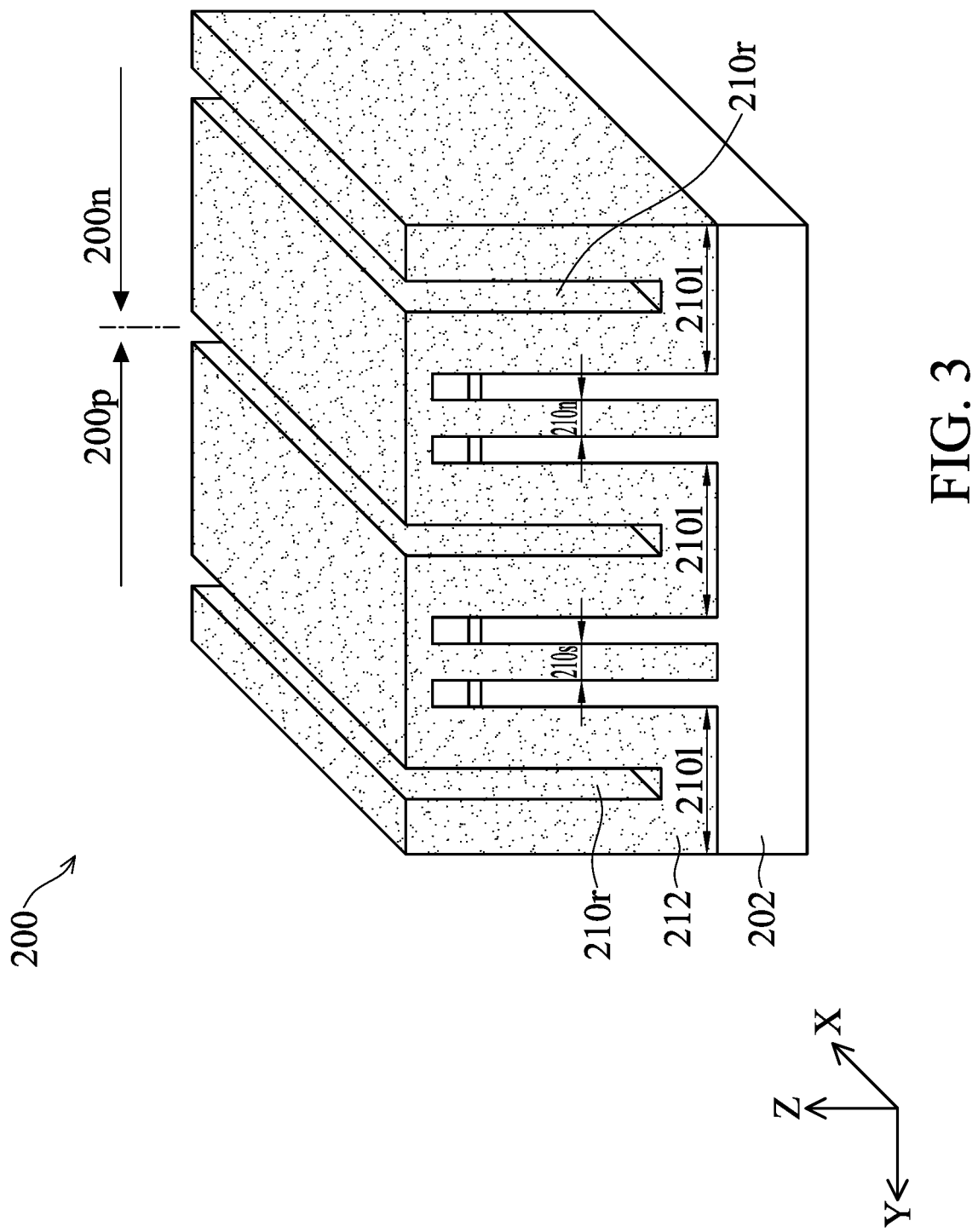

At operation 104 of the method 100, an isolation layer 212 deposited over the semiconductor fins 204, as shown in FIG. 3. In some embodiments, the mask layer 208 and the pad layer 206 may remain on the semiconductor fins 204 during deposition of the isolation layer 212. In some embodiments, the isolation layer 212 may be conformally deposited at a target thickness such that the narrow trenches 210$n$ are filled with the isolation layer 212 while a trench 210$r$ remains in the wider trench 210$l$. Trenches 210$r$ may be sized for a hybrid fin to be formed therein. The isolation layer 212 may be formed by a high-density plasma chemical vapor deposition (HDP-CVD), a CVD (CVD), an atomic layer deposition (ALD), or other suitable deposition process. In some embodiments, the isolation layer 212 may include silicon oxide, silicon nitride, silicon oxynitride, fluorine-doped silicate glass (FSG), a low-k dielectric, combinations thereof.

Figure 4:
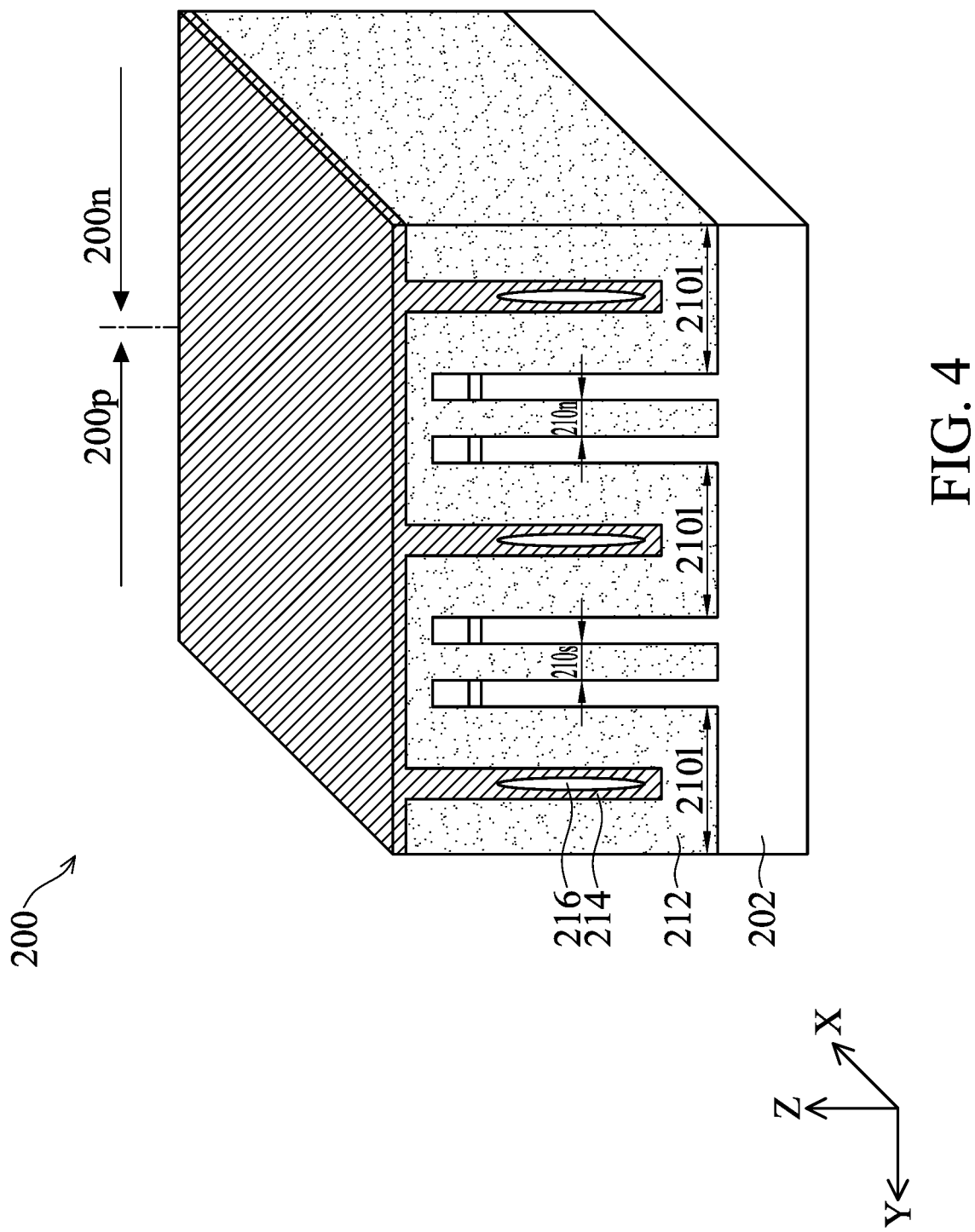

At operation 106 of the method 100, a dielectric fin layer 214 is deposited over the substrate 202, as shown in FIG. 4. The dielectric fin layer 214 fill in the trenches 210$r$ so that dielectric fin or hybrid fin is formed in the trench 210$r$. In some embodiments, the dielectric fin layer 214 is formed by a suitable deposition process to fill the trenches 210$r$.

The dielectric fin layer 214 may include one single layer of dielectric material or two or more layers of the dielectric materials sequentially deposited therein. In some embodiments, the dielectric fin layer 214 may include a dielectric material having etch selectivity relative to the isolation layer 212. In some embodiment, the dielectric fin layer 214 may be silicon nitride (SiN), oxynitride, silicon carbon (SiC), silicon oxynitride (SiON), oxide, $SiO_2$, $Si_3N_4$, SiOCN, and the like. The dielectric fin layer 214 may be formed by methods utilized to form such a layer, such as CVD, plasma enhanced CVD, sputter, or other suitable methods.

In some embodiments, the dielectric fin layer 214 may include a high-k dielectric material, such as metal oxides, such as $HfO_2$, $ZrO_2$, $HfAlO_x$, $HfSiO_x$ and the like. The dielectric fin layer 214 may be formed by CVD, plasma enhanced CVD, sputter, and other suitable methods. In some embodiments, the dielectric fin layer 214 may be made from other high-k materials other than metal dielectric materials.

In some embodiments, the dielectric fin layer 214 includes an outer dielectric layer and an inner dielectric layer. The outer dielectric layer may be deposited first to cover sidewalls of the trenches 210$r$ and the inner dielectric layer is then deposited over the outer dielectric layer. In some embodiment dielectric layer may be silicon nitride (SiN), oxynitride, silicon carbon (SiC), silicon oxynitride (SiON), oxide, $SiO_2$, $Si_3N_4$, SiOCN, or a metal oxide layer. The inner dielectric layer may be a low-k dielectric layer, for example a silicon oxide layer.

In some embodiments, the dielectric fin layer 214 may include air gaps 216 formed therein. In some embodiments, the air gaps 216 may be formed because the trenches 210$r$ has a high aspect ratio. During deposition, opening of the trenches 210$r$ are pinched close before the trenches 210$r$ are fully filled forming the air gaps 216. The air gaps 216 may be desirable because the air gaps 216 lower dielectric value of the dielectric fin layer 214, thus, reduce RC delay. In FIG. 4, one air gap 216 with an oval cross sectional is shown to form within each trench 210$r$. However, more air gaps of various dimensions, shapes, may be present at various locations depending on the dimension of the trench 210$r$ and the processes used in depositing the dielectric fin layer 214. In some embodiments, the air gap 216 may extends along the x-direction within the dielectric fin layer 214.

Figure 5:
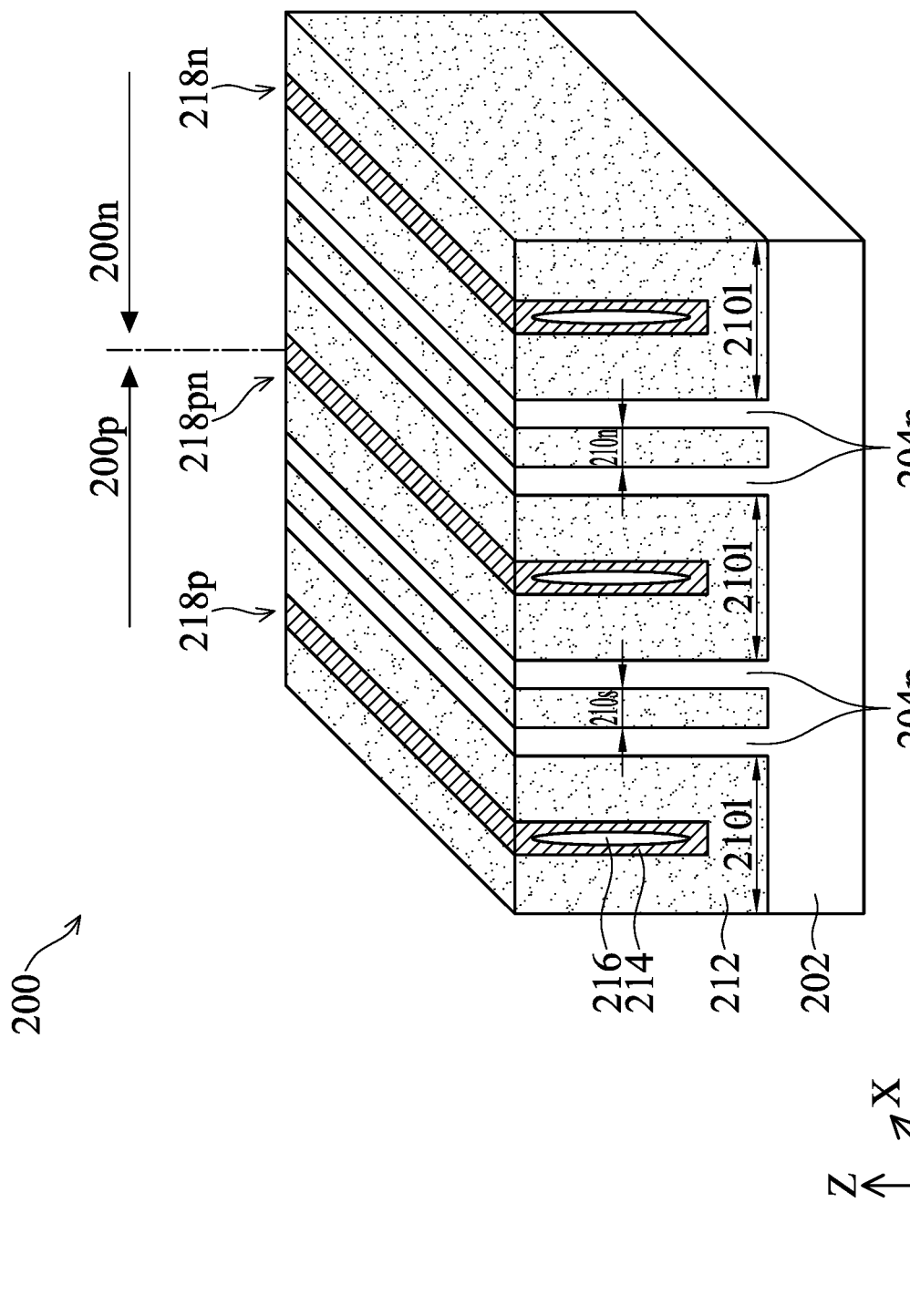
Figure 6:
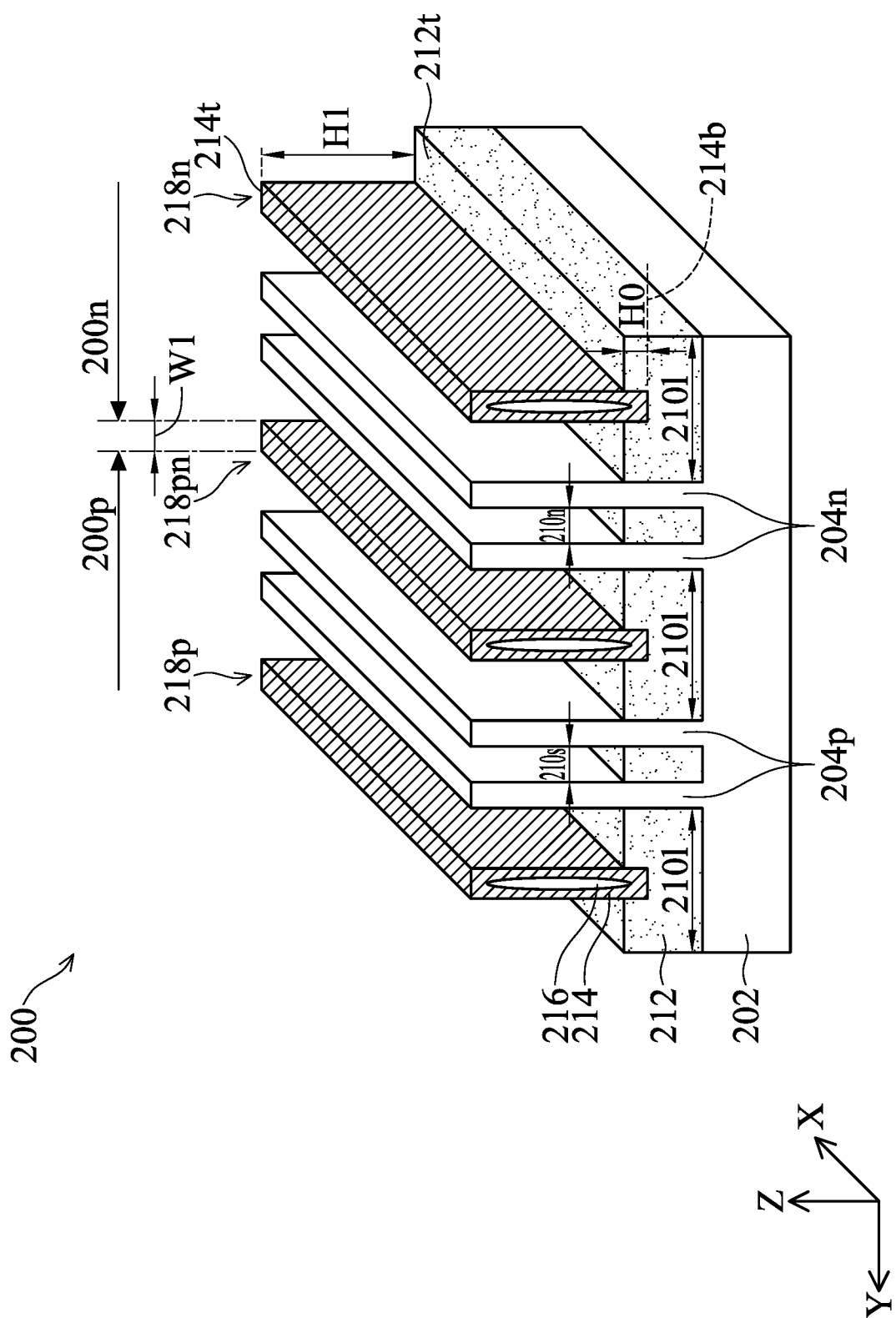

At operation 108 of the method 100, hybrid fins 218$p$, 218$pn$, and 218$n$ (collectively 218) are formed adjacent the semiconductor fins 204, as shown in FIGS. 5 and 6. After filling the trenches 210$r$, a planarization process may be performed to expose the semiconductor fins 204 and the isolation layer 212, as shown in FIG. 5. An etch back process is then performed to expose portions of the hybrid fins 218 and the semiconductor fins 204 as shown in FIG. 6. The etch back process may be performed using a suitable anisotropic etching process to etch back the isolation layer 212 and expose portions of the semiconductor fins 204 and the hybrid fins 218.

After operation 108, the semiconductor fins 204 and the hybrid fins 218 extend from the isolation layer 212. In some embodiments, the semiconductor fins 204 and the hybrid fins 218 have substantially the same height over a top surface 212$t$ of the isolation layer 212 after etching back. In some embodiments, the semiconductor fins 204 and hybrid fins 218 have a protruding fin height H1 over the isolation layer 212. For example, the protruding fin height H1 may be defined by the distance between a top surface 214t of the hybrid fins 218 and the top surface 212t of the isolation layer 212. The protruding fin height H1 may vary according to circuit design. In some embodiments, the protruding fin height H1 is in a range between about 20 nm to about 100 nm. Portions of the hybrid fins 218 are embedded in the isolation layer 212. In some embodiments, an embedded fin height H0 of the hybrid fins 218 are embedded in the isolation layer 212. For example, the embedded fin height H0 may be defined by the distance between a bottom surface 214b of the hybrid fins 218 and the top surface 212t of the isolation layer 212. The hybrid fins 218 may have a width W1 along the y-direction. The width W1 of the hybrid fins 218 may vary according to circuit design. In some embodiments, the width W1 is in a range between about 10 nm to about 20 nm.

The hybrid fins 218 are substantially bar shaped extending along the x-direction. The hybrid fins 218 includes one or more dielectric fin layer 214. One or more air gaps 216 may be formed in the hybrid fin 218. In some embodiments, the air gaps 216 is positioned in an inner volume of the hybrid fin 218 and extends along the x-direction.

The hybrid fins 218p are located in the p-type device area 200p. The hybrid fins 218p may be positioned between two semiconductor fins 204p or adjacent to a semiconductor fin 204p. The hybrid fins 218n are located in the n-type device area 200n. The hybrid fins 218n may be positioned between two semiconductor fins 204n or adjacent to a semiconductor fin 204n. The hybrid fin 218pn is positioned at a boundary between the n-type device area 200n and the p-type device area 200p. The hybrid fin 218pn is positioned between one semiconductor fin 204n and one semiconductor fin 204p.

Figure 7:
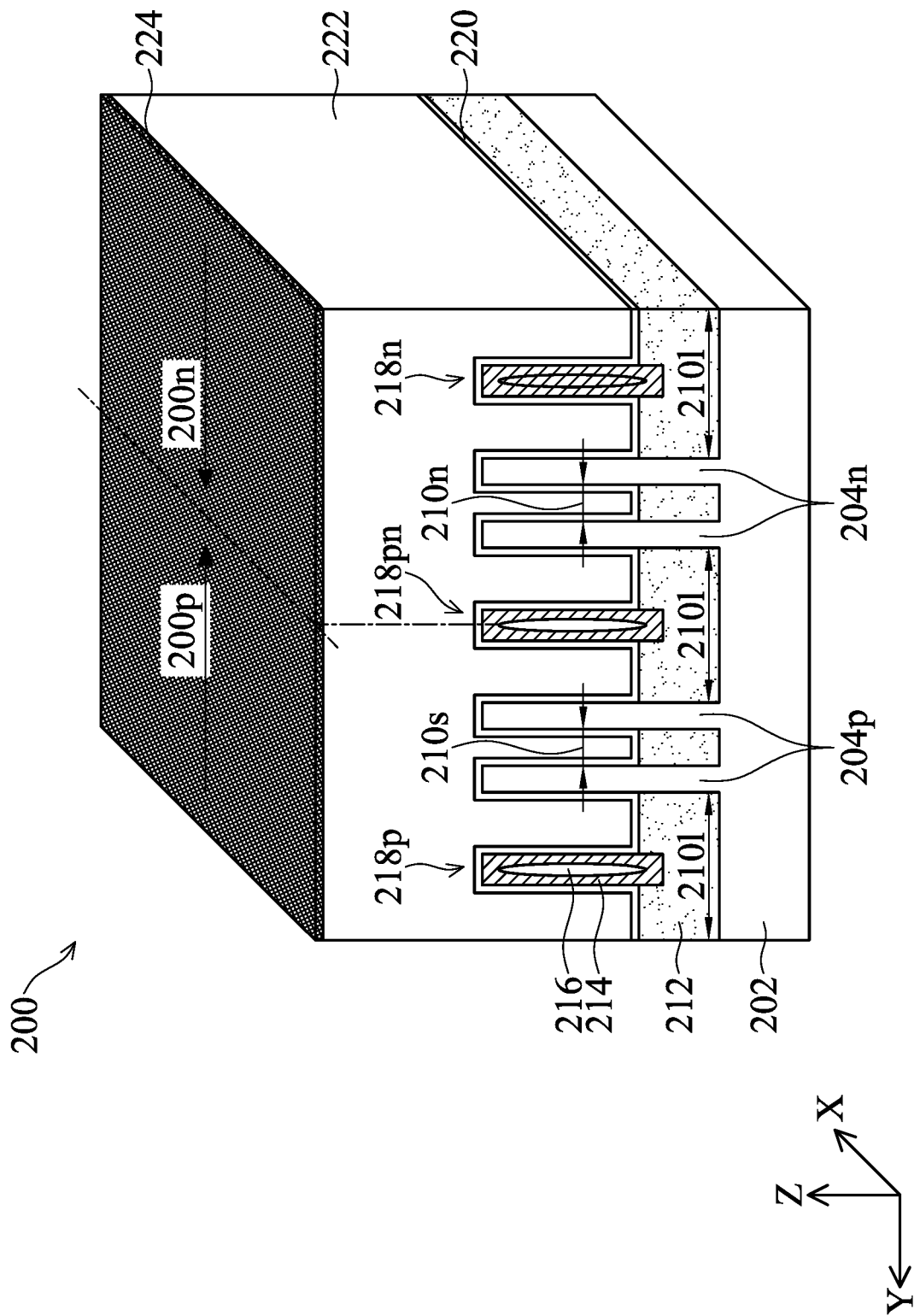
Figure 8:
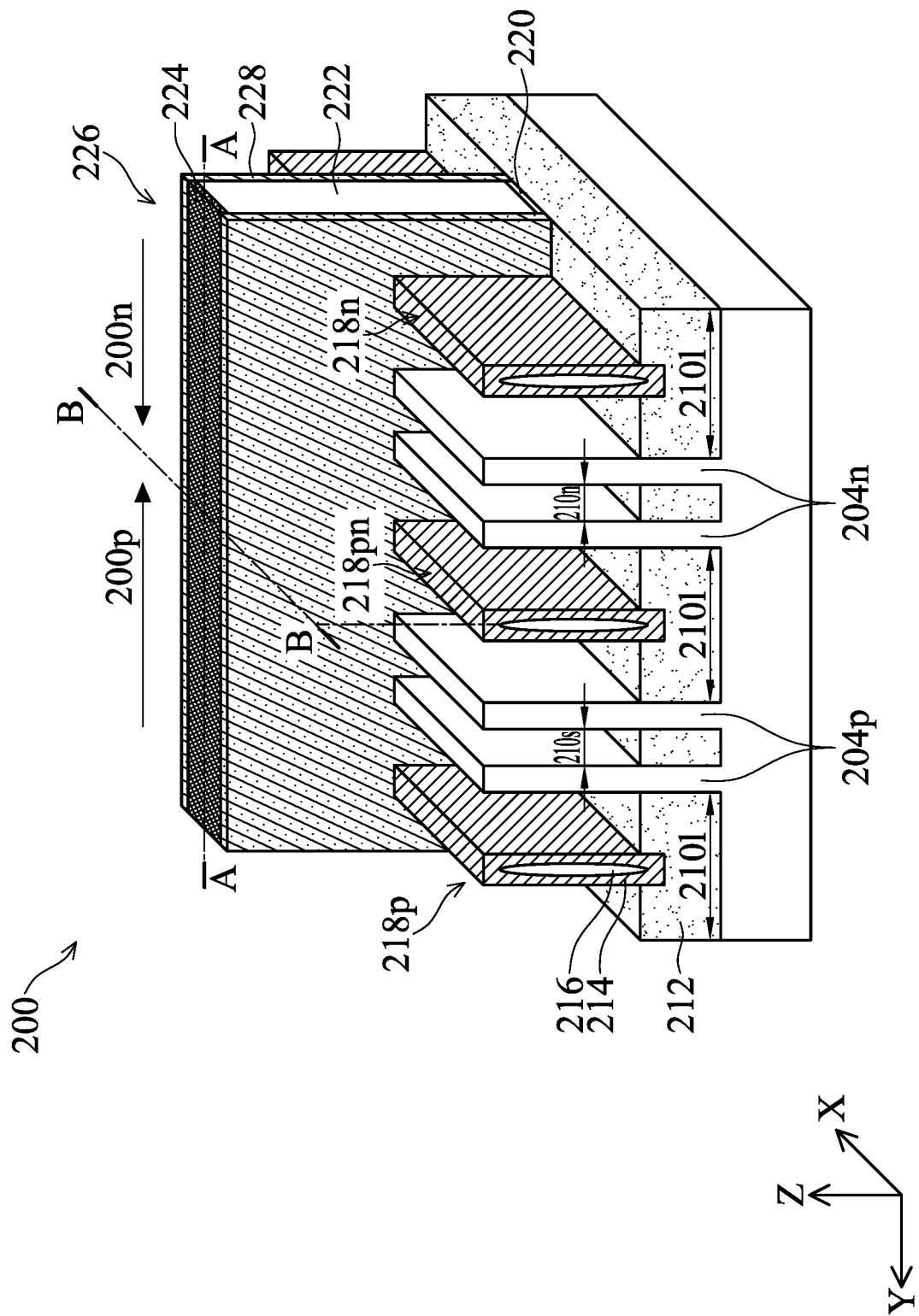

At operation 110 of the method 100, sacrificial gate structures 226 are formed over the semiconductor fins 204, the hybrid fins 218, and the isolation layer 212, as shown in FIGS. 7 and 8. A sacrificial gate dielectric layer 220 is conformally deposited over the semiconductor fins 204, the hybrid fins 218, and the isolation layer 212. The sacrificial gate dielectric layer 220 may include silicon oxide, silicon nitride, a combination thereof, or the like. The sacrificial gate dielectric layer 220 may be deposited or thermally grown according to acceptable techniques, such as thermal CVD, CVD, ALD, and other suitable methods.

A sacrificial gate electrode layer 222 is deposited on the sacrificial gate dielectric layer 220. The sacrificial gate electrode layer 222 includes silicon, such as polycrystalline silicon, amorphous silicon, poly-crystalline silicon-germanium (poly-SiGe), or the like. The sacrificial gate electrode layer 222 may be deposited using CVD, including LPCVD and PECVD, PVD, ALD, or other suitable process. In some embodiments, a planarization process may be performed after deposition of the sacrificial gate electrode layer 222.

A mask layer 224 is sequentially deposited over the sacrificial gate electrode layer 222. In some embodiments, a pad layer, not shown, may be deposited between the mask layer 224 and the sacrificial gate electrode layer 222. The pad layer may include silicon nitride. The mask layer 224 may include silicon oxide. A patterning operation is performed on the mask layer 224, the pad layer if present, the sacrificial gate electrode layer 222, and the sacrificial gate dielectric layer 220 to form the sacrificial gate structures 226 using one or more etching processes, such as one or more plasma etching processes or one or more wet etching processes. In some embodiments, the mask layer 224 may be first patterned using a patterning process. The sacrificial gate electrode layer 222 is then patterned using the patterned mask layer 224 as an etching mask. In some embodiments, the sacrificial gate electrode layer 222 may be etched by an anisotropic etching, such as a reactive ion etching (RIE) process. The anisotropic etching has a greater etching rate along the Z direction than etching rates along the X and Y directions. During the etching of the sacrificial gate electrode layer 222, the sacrificial gate dielectric layer 220 on the semiconductor fins 204 may act as an etch stop to prevent the etchant from removing the semiconductor fins 204.

In some embodiments, after patterning the sacrificial gate electrode layer 222, any exposed residual sacrificial gate dielectric layer 220 is removed by a suitable etch process. In some embodiments, the residual sacrificial gate dielectric layer 220 can be etched by tuning one or more parameters, such as etchant, etching temperature, etching solution concentration, etching pressure, source power, radio frequency (RF) bias voltage, etchant flow rate, of the etch process for etching the sacrificial gate electrode layer 222. As shown in FIG. 8, the sacrificial gate structure 226 covers a portion of the semiconductor fins 204 and the hybrid fins 218. The portion of the semiconductor fins 204 covered by the sacrificial gate structures 226 eventually form a channel region in a transistor.

Figure 8A:
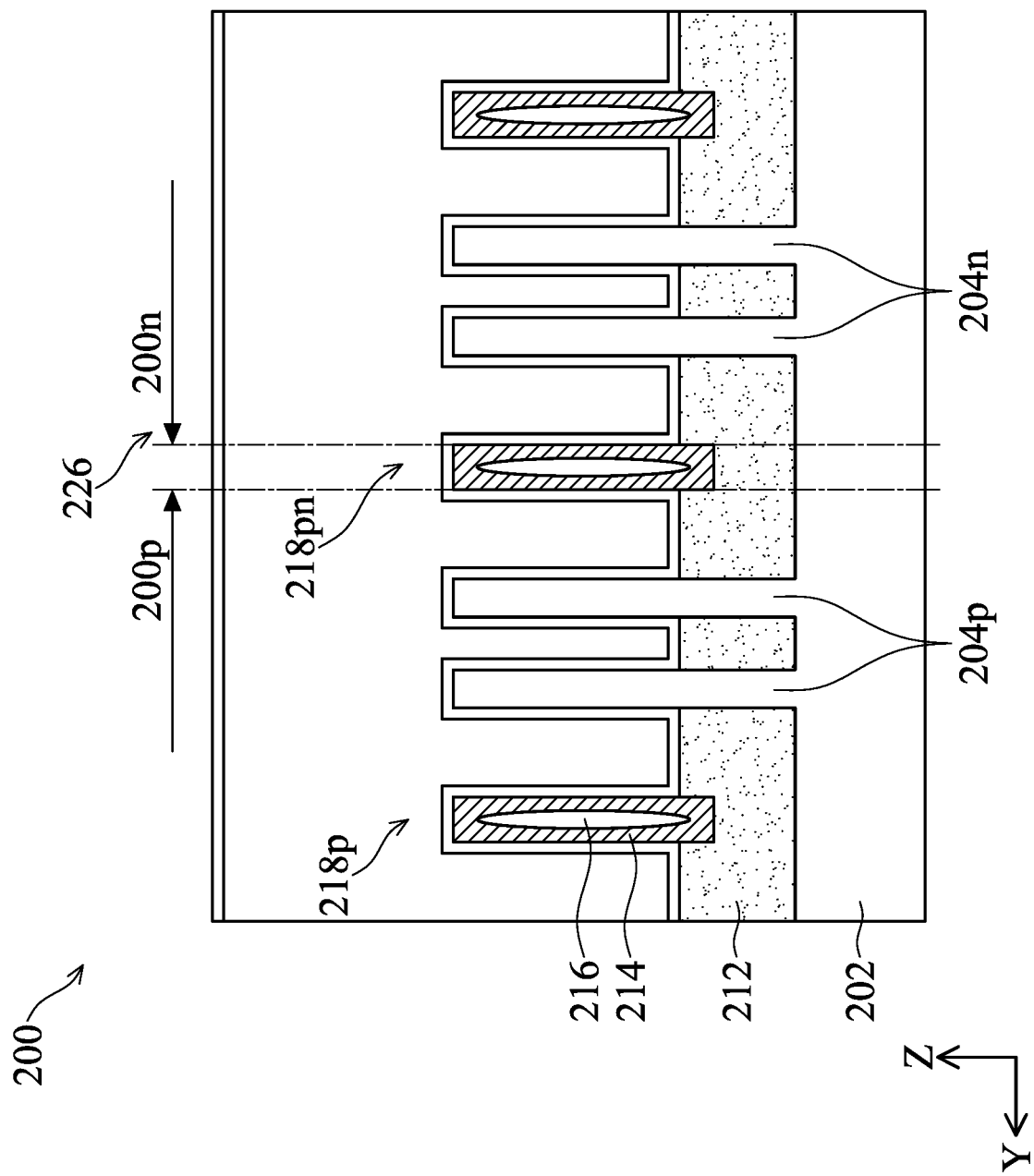
Figure 8B:
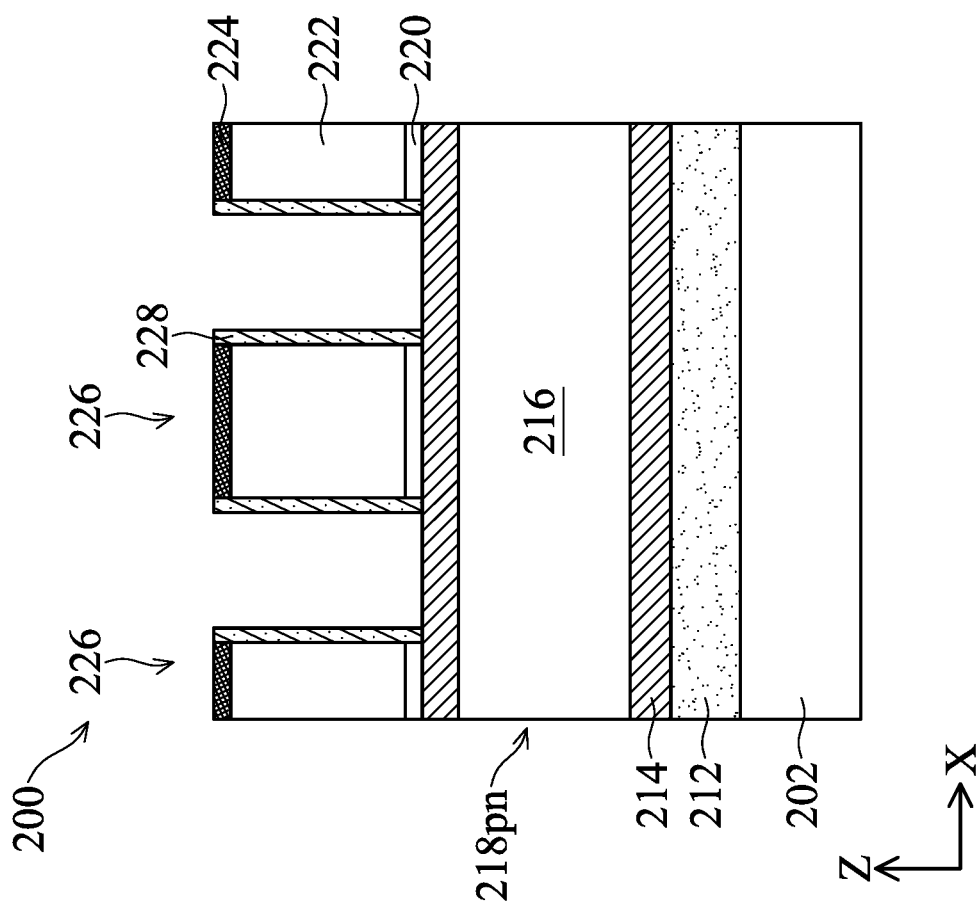

At operation 112 of the method 100, sidewall spacers 228 are formed on sidewalls of the sacrificial gate structures 226, as shown in FIGS. 8, 8A and 8B. FIG. 8A is a schematical sectional view of the semiconductor device 200 along the A-A line in FIG. 8. FIG. 8B is a schematical sectional view of the semiconductor device 200 along the B-B line in FIG. 8.

The sidewall spacers 228 are formed on sidewalls of each sacrificial gate structures 226. After the sacrificial gate structures 226 are formed, the sidewall spacers 228 are formed by a blanket deposition of one or more layers of insulating material. After deposition of the insulating material, an anisotropic etching is performed to remove portions of the insulating material from horizontal surfaces. In some embodiments, the insulation material may also be removed from sidewalls of the semiconductor fins 204. In some embodiments, portions of the sidewall spacers 228 may remain on sidewalls of the semiconductor fins 204 (not shown). In some embodiments, the insulating material of the sidewall spacers 228 is a silicon nitride-based material, such as SiN, SiON, SiOCN or SiCN and combinations thereof. The sidewall spacers 228 may have a thickness in a range between about 4 nm and about 7 nm.

FIG. 8A schematically demonstrates a sectional view within the sacrificial gate structure 226. FIG. 8B schematically demonstrates a sectional view within the hybrid fin 218pn. In FIG. 8B, two additional sacrificial gate structures 226 are shown to demonstrate arrangement of the sacrificial gate structures 226. As shown in FIG. 8B, the air gap 216 within the hybrid fin 218 may extend along the x-direction through the hybrid fin 218.

Figure 9:
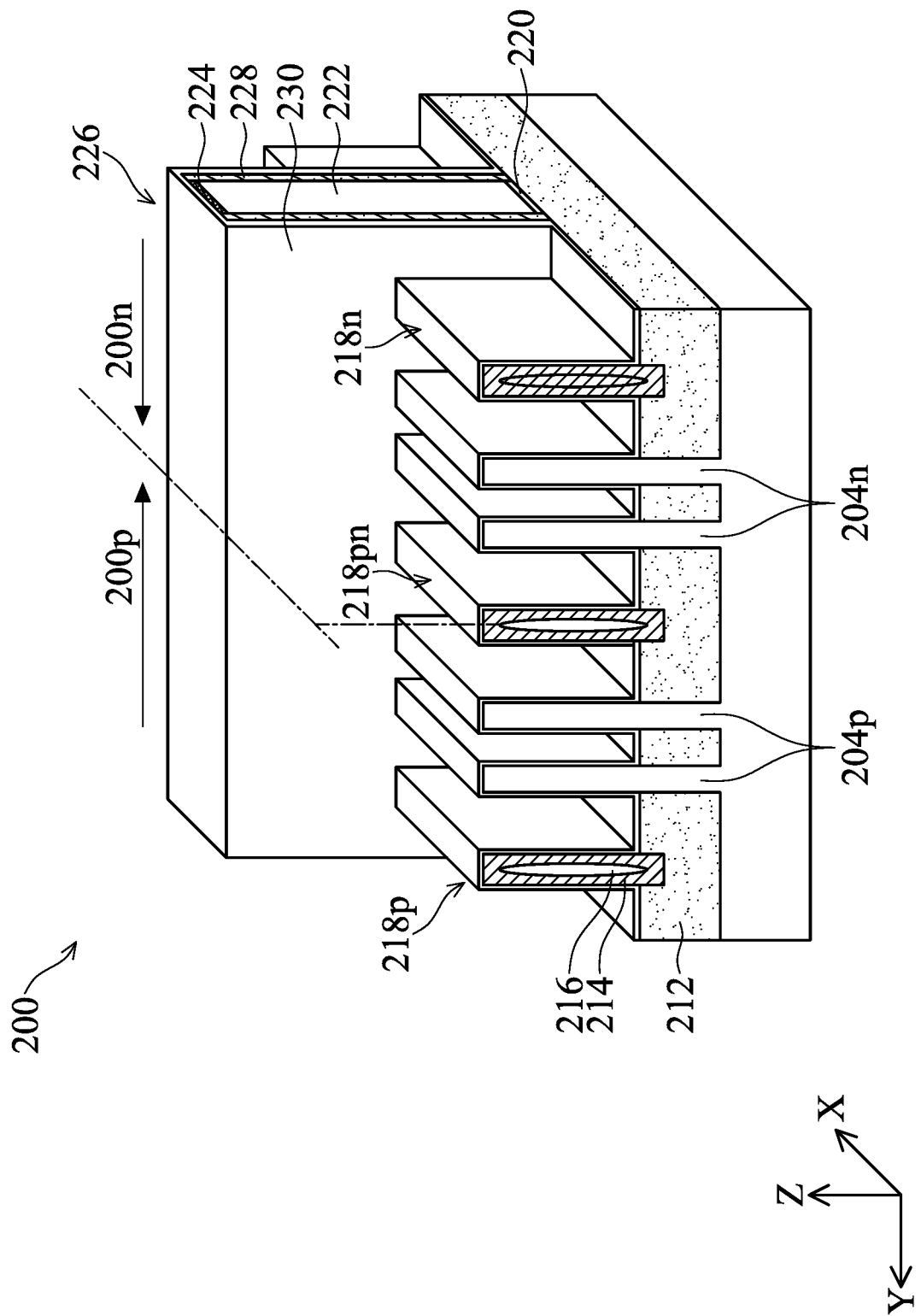

At operation 114 of the method 100, a sacrificial spacer layer 230 is disposed over the semiconductor device 200, as shown in FIG. 9. The sacrificial spacer layer 230 may be a dielectric layer used to protect regions not being processed during subsequent source/drain formation. The sacrificial spacer layer 230 may be selected from any material with etch selectivity over materials of semiconductor fins 204 and hybrid fins 218. In some embodiments, the sacrificial spacer layer 230 includes silicon nitride, silicon oxide, silicon oxynitride or a combination thereof. In some embodiments, the sacrificial spacer layer 230 is formed by CVD, ALD and/or other suitable technique.

Figure 10:
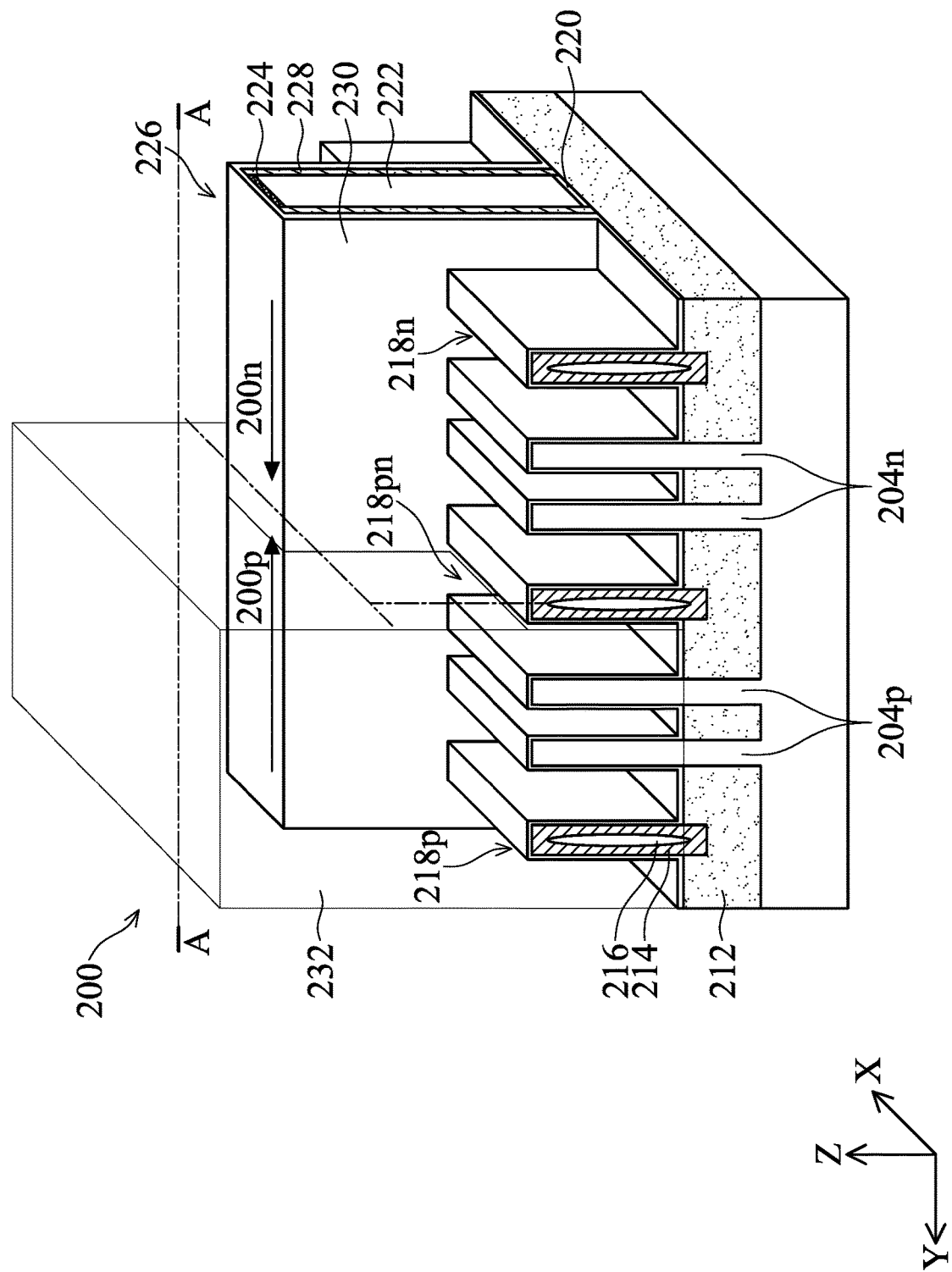
Figure 11:
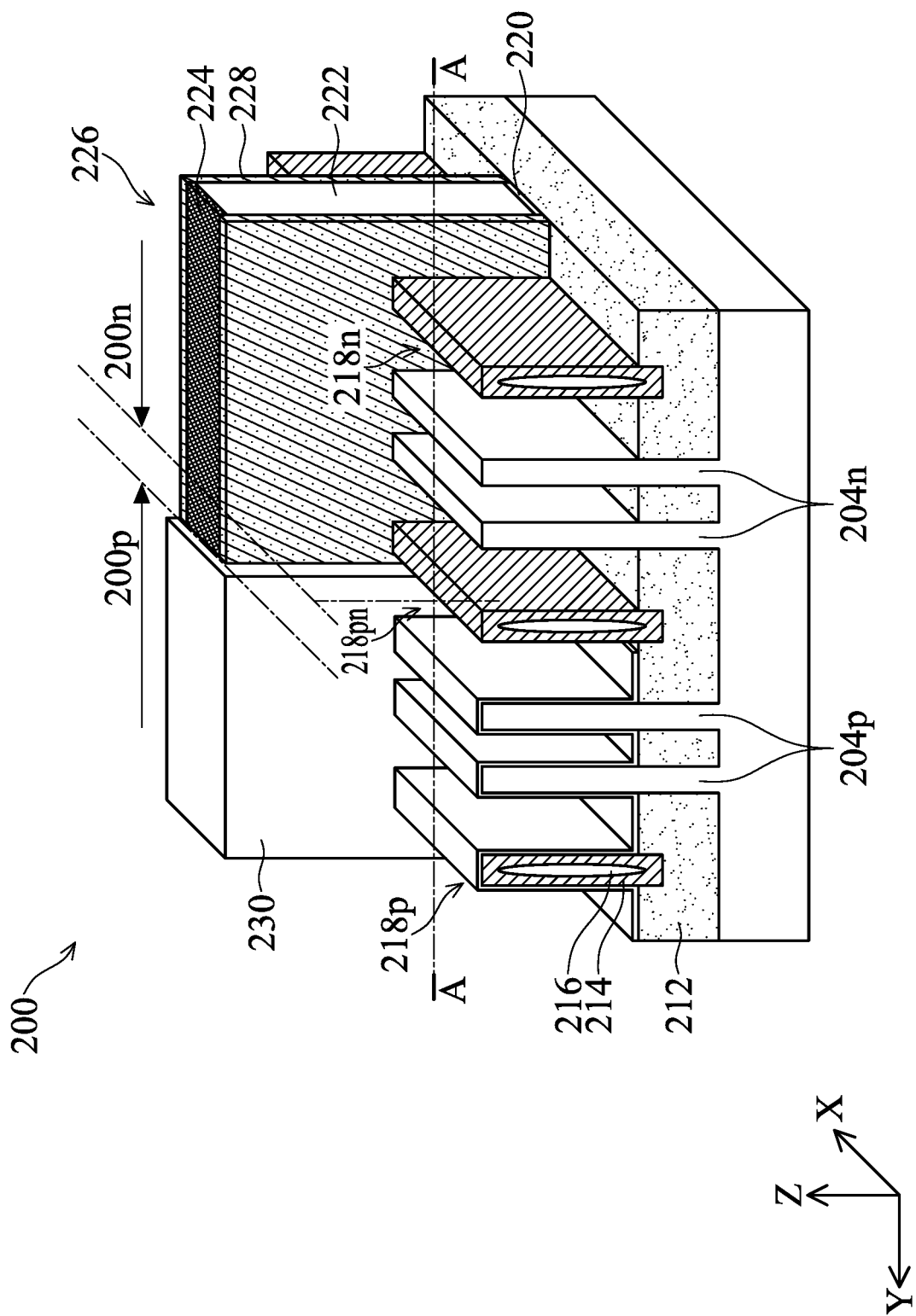

At operation 116 of the method 100, the sacrificial spacer layer 230 is patterned to expose the hybrid fin 218*pn* separating the n-type device area 200*n* and the p-type device area 200*p*, and one type of device area, such as the n-type device area 200*n* or the p-type device area 200*p*, as shown in FIGS. 10 and 11. A photoresist layer 232 may be formed over the sacrificial spacer layer 230. The photoresist layer 232 then patterned and used as mask to remove the sacrificial spacer layer 230 over the hybrid fin 218*pn* and one type of device area connected to the hybrid fin 218*pn*.

According to embodiments of the present disclosure, the hybrid fins positioned between device areas to be processed and device areas to be covered are exposed and etched back during the semiconductor fin etch back process. In some embodiments, the device areas to be processed and the device areas to be covered may be different type device areas. In other embodiments, the device areas to be processed and the device areas to be covered may be the same type of device areas.

Figure 10A:
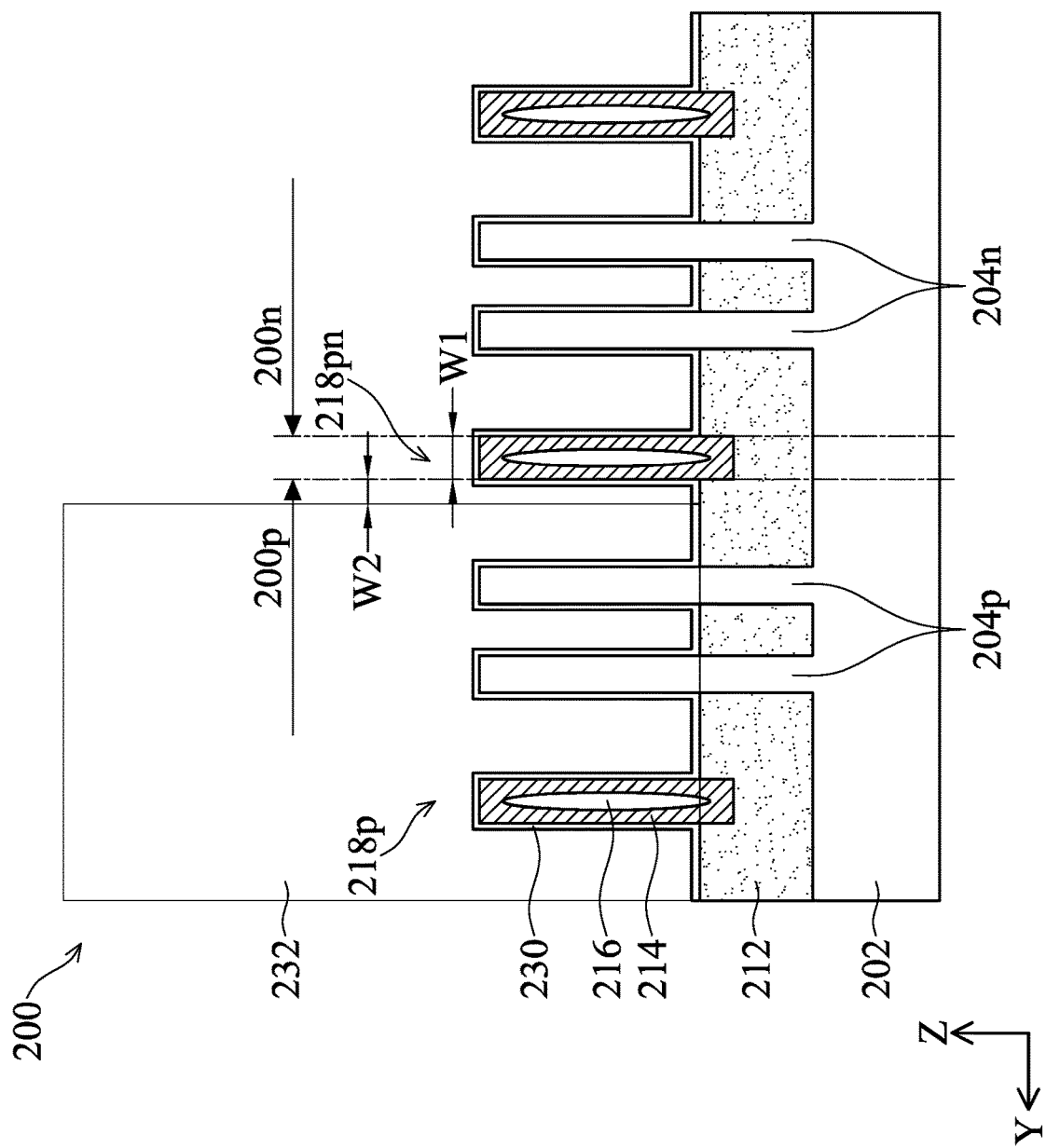

As shown in FIG. 10A, the photoresist layer 232 is patterned to expose the sacrificial spacer layer 230 over the hybrid fin 218*pn* and the n-type device area 200*n*. In some embodiments, the photoresist layer 232 may be patterned to expose a portion of non-processed device area. In FIGS. 10 and 10A, a small portion of the non-processed device area, the p-type device area 200*p*, is exposed by the patterned photoresist layer 232. FIG. 10A is a schematical sectional view of the semiconductor device 200 along the A-A line in FIG. 10. In some embodiments, the exposed portion the non-processed device area may have a width W2 along the y-direction, or a direction perpendicular to the length of the hybrid fins 218. In some embodiments, the width W2 may be in a range between about 0 nm and 20 nm. In some embodiments, the width W1 may be in a range between about 6 nm and 20 nm.

Figure 11A:
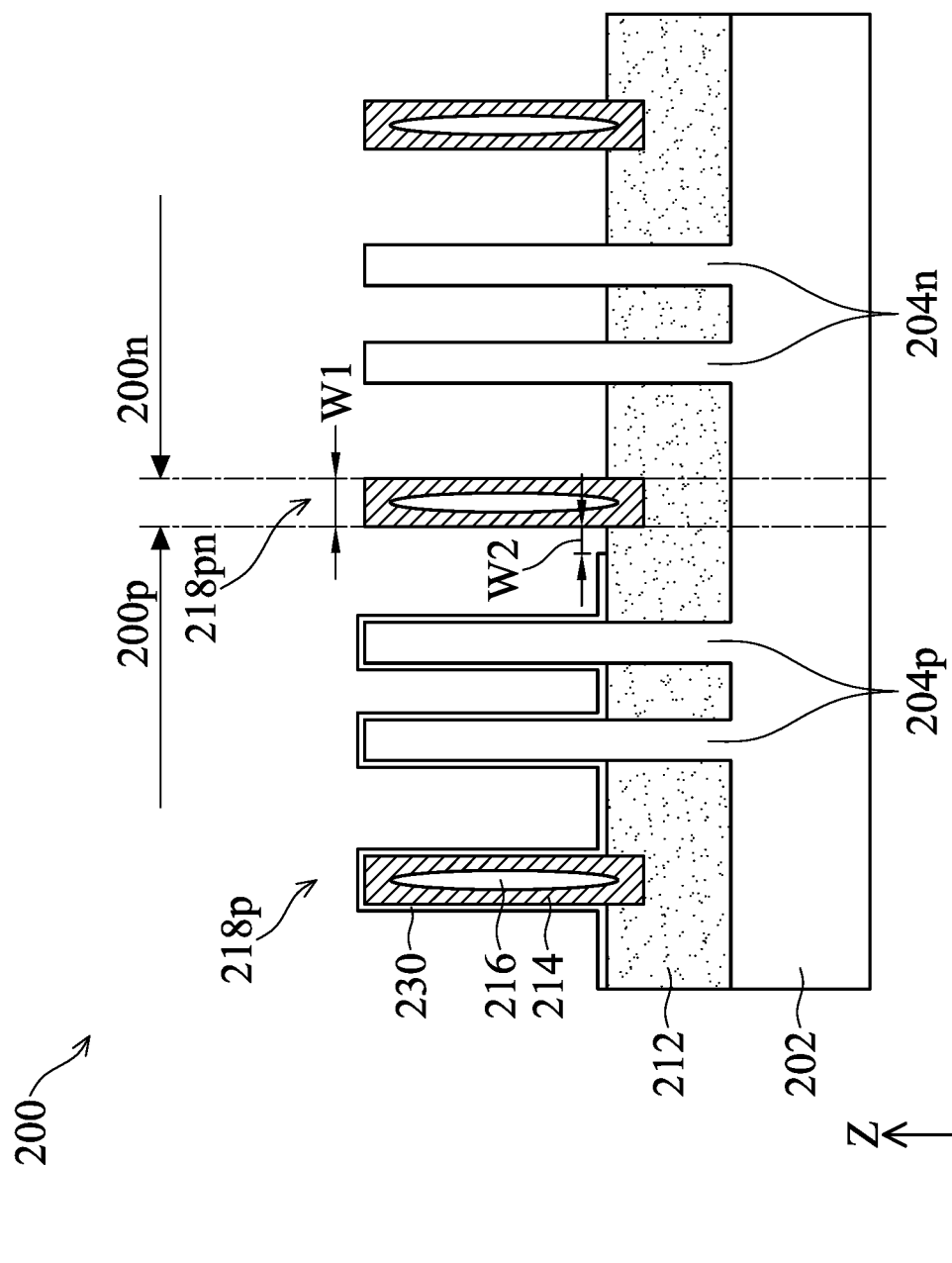

After photoresist layer 232 is patterned, the sacrificial spacer layer 230 is patterned to expose the n-type device area 200*n*, the hybrid fin 218*pn*, and a portion of the p-type device area 200*p*, as shown in FIGS. 11 and 11A. FIG. 11A is a schematical sectional view of the semiconductor device 200 along the A-A line in FIG. 11.

Figure 12:
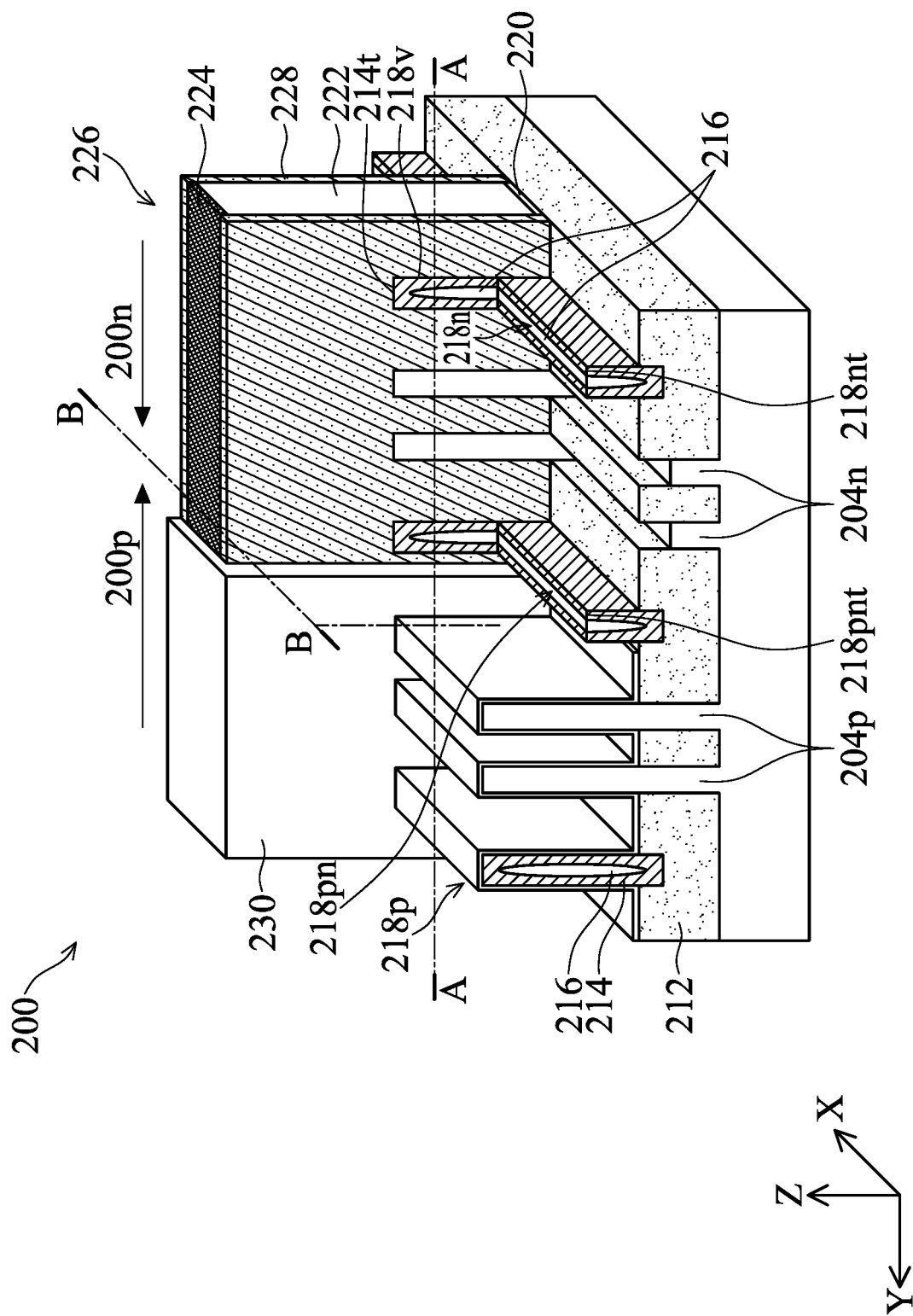
Figure 12A:
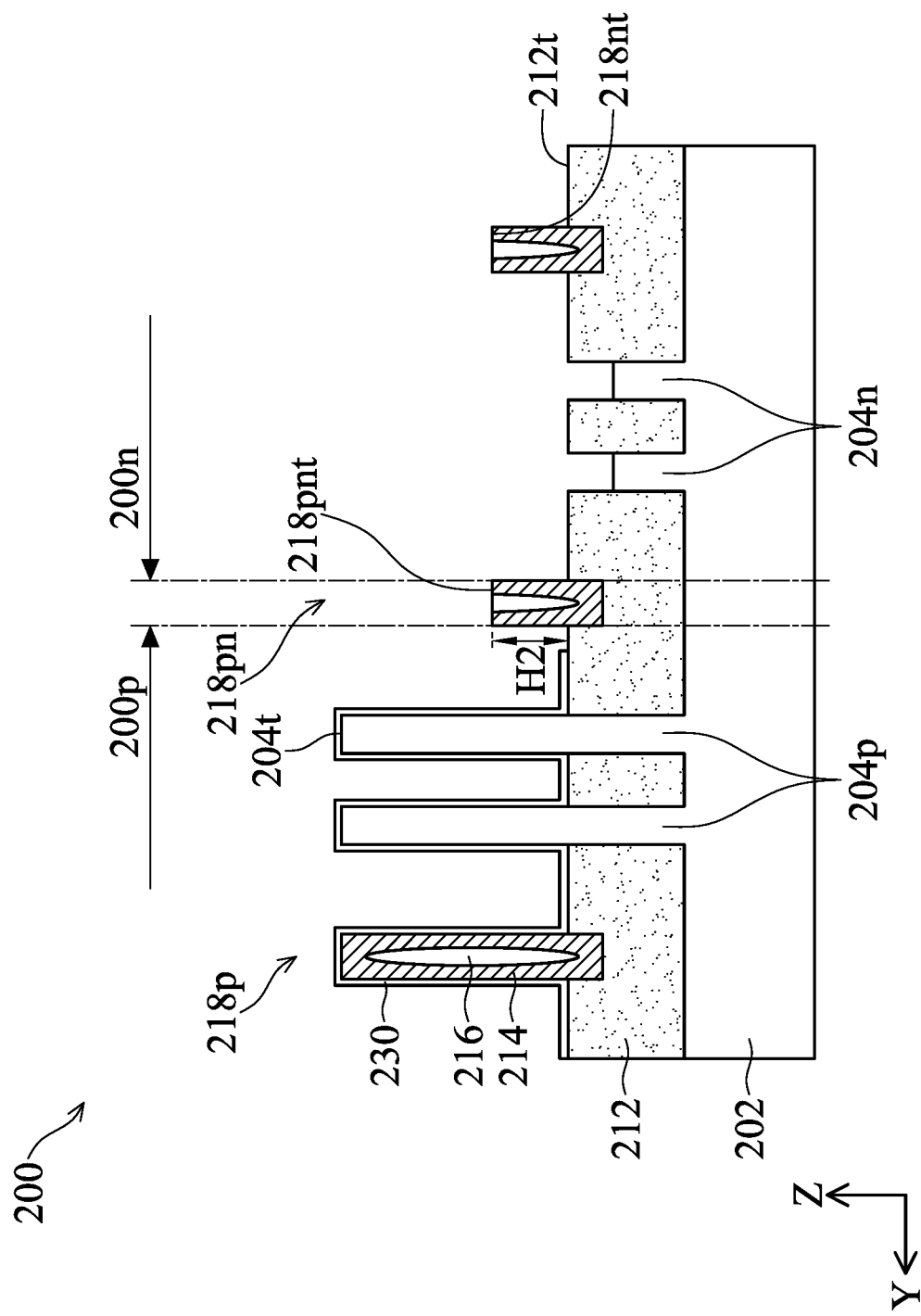
Figure 12B:
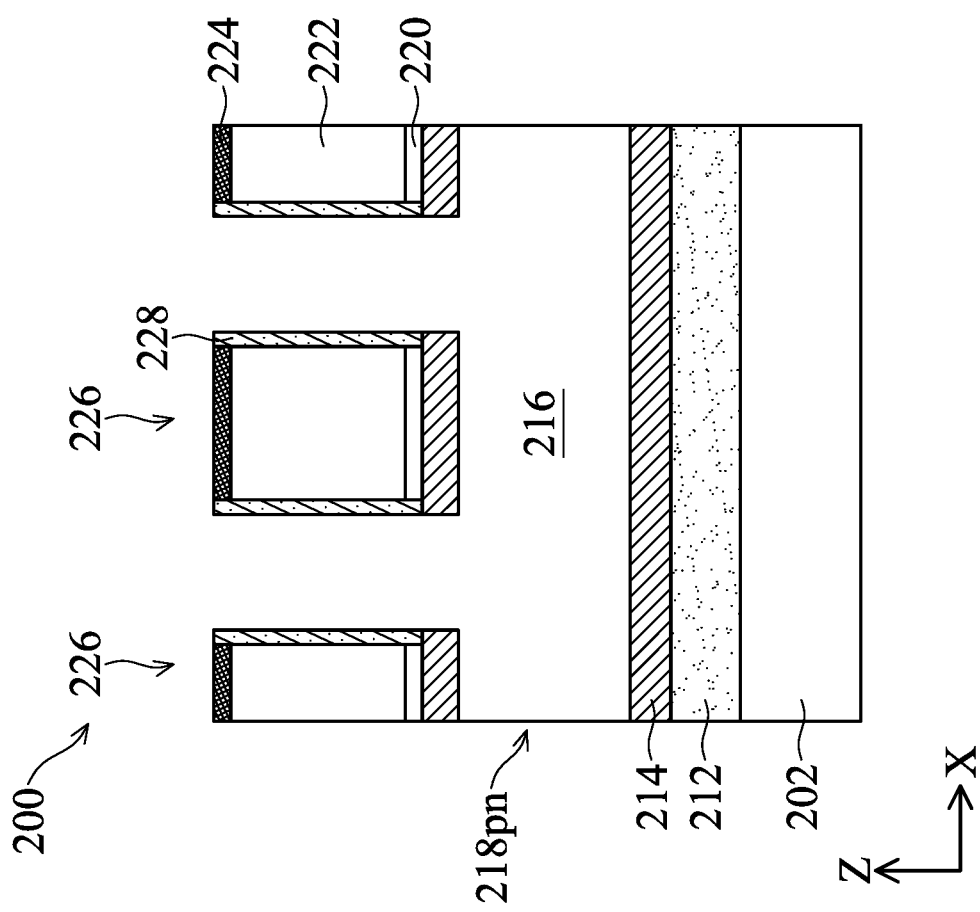

At operation 118 of the method 100, one or more etch processes are performed to etch back portions of the semiconductor fins 204 and the hybrid fins 218 exposed by the sacrificial spacer layer 230, as shown in FIGS. 12, 12A and 12B. FIG. 12A is a schematical sectional view of the semiconductor device 200 along the A-A line in FIG. 12. FIG. 12B is a schematical sectional view of the semiconductor device 200 along the B-B line in FIG. 12.

In some embodiments, the semiconductor fins 204*n* are recess etched by a desired level for subsequent formation of source/drain features therefrom. In some embodiments, the semiconductor fins 204*n* may be recessed to a level below the top surface 212*t* of the isolation layer 212 as shown in FIG. 12A.

The exposed hybrid fins 218*n*, 218*pn* are also recess etched to below a top surface 204*t* of the semiconductor fins 204 as originally formed. In some embodiments, the exposed hybrid fins 218*n*, 218*pn* may be etched back. As a result of the recess etch, the hybrid fins 218*n*, 218*pn* have a cut top surface 218*nt*, 218*pnt* respectively, and a vertical cut surface 218*v*. The vertical cut surface 218*v* is substantially flush with the sidewall spacer 228. The cut top surface 218*nt*, 218*pnt* may be at a protruding fin height H2 above the top surface 212*t* of the isolation layer 212. The protruding fin height H2 may be selected to above exposure of the hybrid fins 218*n*, 218*pn* to a landing plane of source/drain contact features. In some embodiments, the air gaps 216 formed in the hybrid fins 218*n*, 218*pn* may become open and exposed at the cut top surface 218*nt*, 218*pnt* and/or the vertical cut surface 218*v*.

The recess may be performed by any suitable process, such as dry etch, wet etch, or a combination thereof. In some embodiments, etchant such as tetramethylammonium hydroxide (TMAH), $CF_4$, $CHF_3$, $O_2$, $H_3$, $CH_4$, Ar, $Ch_3F$, HBr, He, or combinations thereof may be used to recess the materials. For example, combinations such as $CH_4$ plus Ar, $Ch_3F$ plus $O_2$ plus $CH_4$, or HBr plus He may be used to recess the materials. The etchant is selected so different materials have different etch rates. For example, the semiconductor material of the semiconductor fins 204*n* may have a first etch rate by the etchant, the hybrid fins 218*pn*, 218*n* may have a second etch rate by the etchant. The composition of the etchant may be selected to achieve the target heights of the semiconductor fins 204*n* and the hybrid fins 218*n*, 218*pn*.

In some embodiments, sidewall spacers 228 may remain on the semiconductor fins 204 after the operation 112. In some embodiments, portions of the sidewall spacers 228 may remain on the isolation layer 212 after the recess etch of the semiconductor fins 204. Heights of the sidewall spacers 228 may be used to control shape of the source/drain features to be formed.

Figure 13:
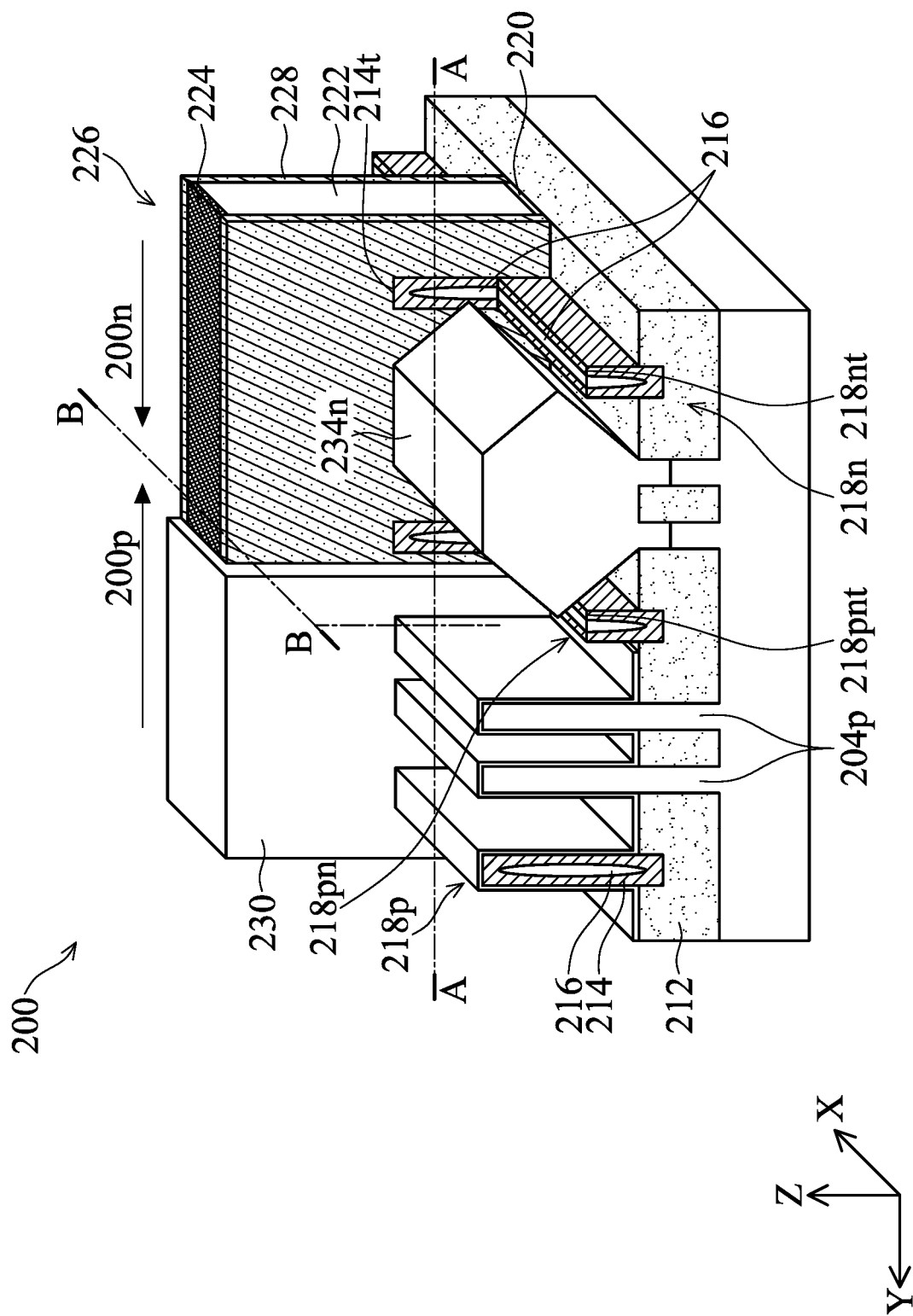
Figure 13A:
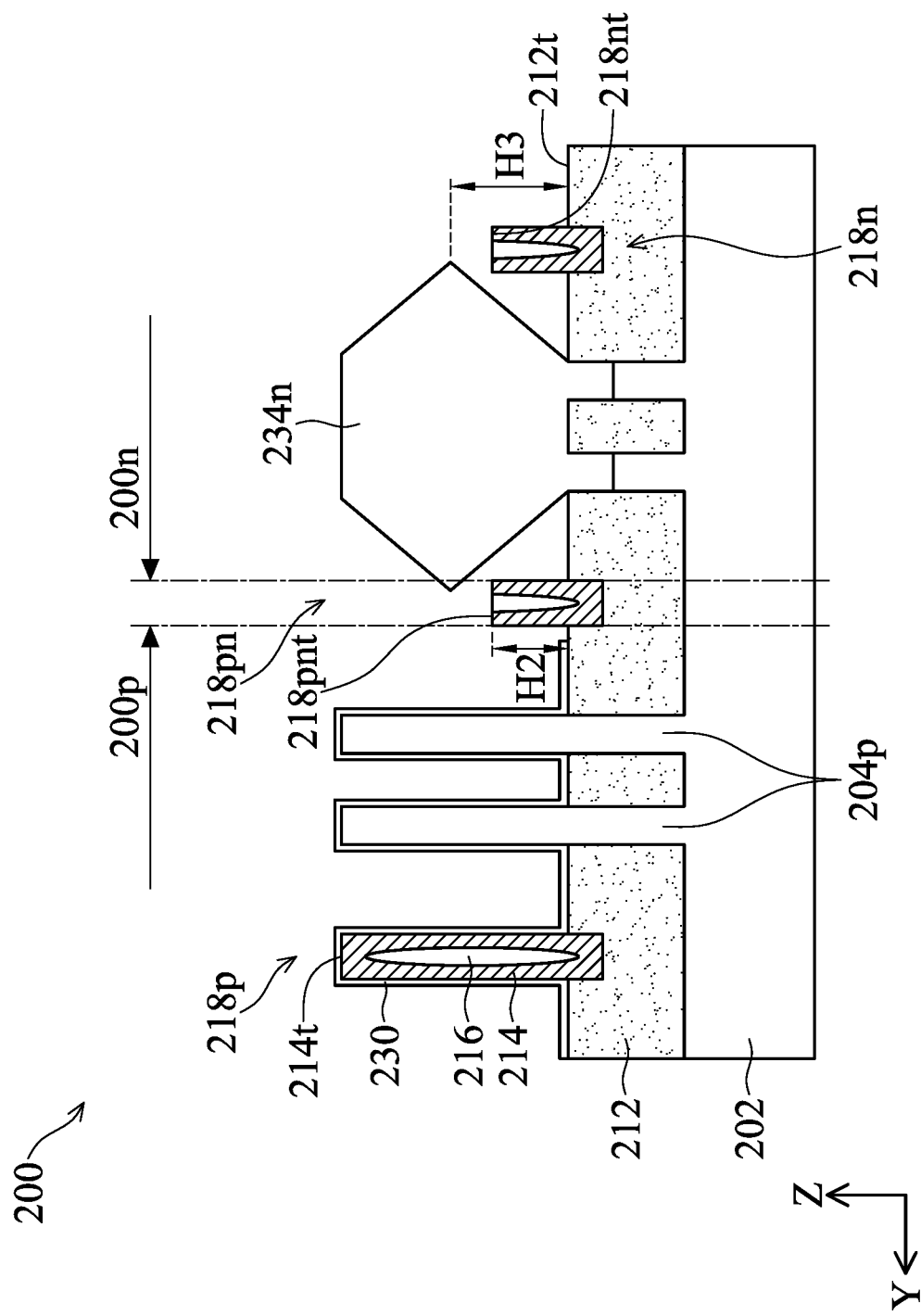

At operation 120, epitaxial source/drain features 234*n* are formed from the semiconductor fins 204*n*, as shown in FIGS. 13 and 13A. FIG. 13A is a schematical sectional view of the semiconductor device 200 along the A-A line in FIG. 13.

In some embodiments, a pre-clean process may be performed to remove any undesirable silicon oxide that is formed as a result of the oxidation of the exposed surfaces. In some embodiments, the pre-clean process may be performed using inductively coupled plasma of a cleaning agent. In some embodiment, the cleaning agent includes Ar, $NF_3$, and $NH_3$. The pre-cleaning process may be performed in a temperature range between about 25° C. and about 74° C. for a time period between 80 seconds and about 400 seconds. Alternatively, the pre-cleaning process may be performed using an HF-based gas or a SiCoNi based gas.

The epitaxial source/drain features 234*n* may be formed by any suitable method, such as by CVD, CVD epitaxy, molecular beam epitaxy (MBE), or any suitable deposition technique. The epitaxial source/drain features 234*n* may include one or more layers of Si, SiP, SiC and SiCP. The epitaxial source/drain features 234*n* also include n-type dopants, such as phosphorus (P), arsenic (As), etc. In some embodiments, the epitaxial source/drain features 234*n* may be a Si layer including phosphorus dopants. In some embodiments, the epitaxial source/drain features 234*n* include a dopant concentration of between about 1E20 atoms/cm$^3$ and about 5E21 atoms/cm$^3$.

The shape and dimension of the epitaxial source/drain features 234*n* may be controlled by adjusting processing parameters and/or height of sidewall spacers, if present. In some embodiments, the cross section of the epitaxial source/drain features 234*n* may have a wider middle portion and narrower upper and lower portion, such as an oval shape or a hexagon shape. In some embodiments, the widest middle portion along the y-direction may have a center height H3 from the top surface 212*t* of the isolation layer 212. In some embodiments, the center height H3 may be greater than the protruding fin height H2 of the hybrid fin 218.

Figure 14:
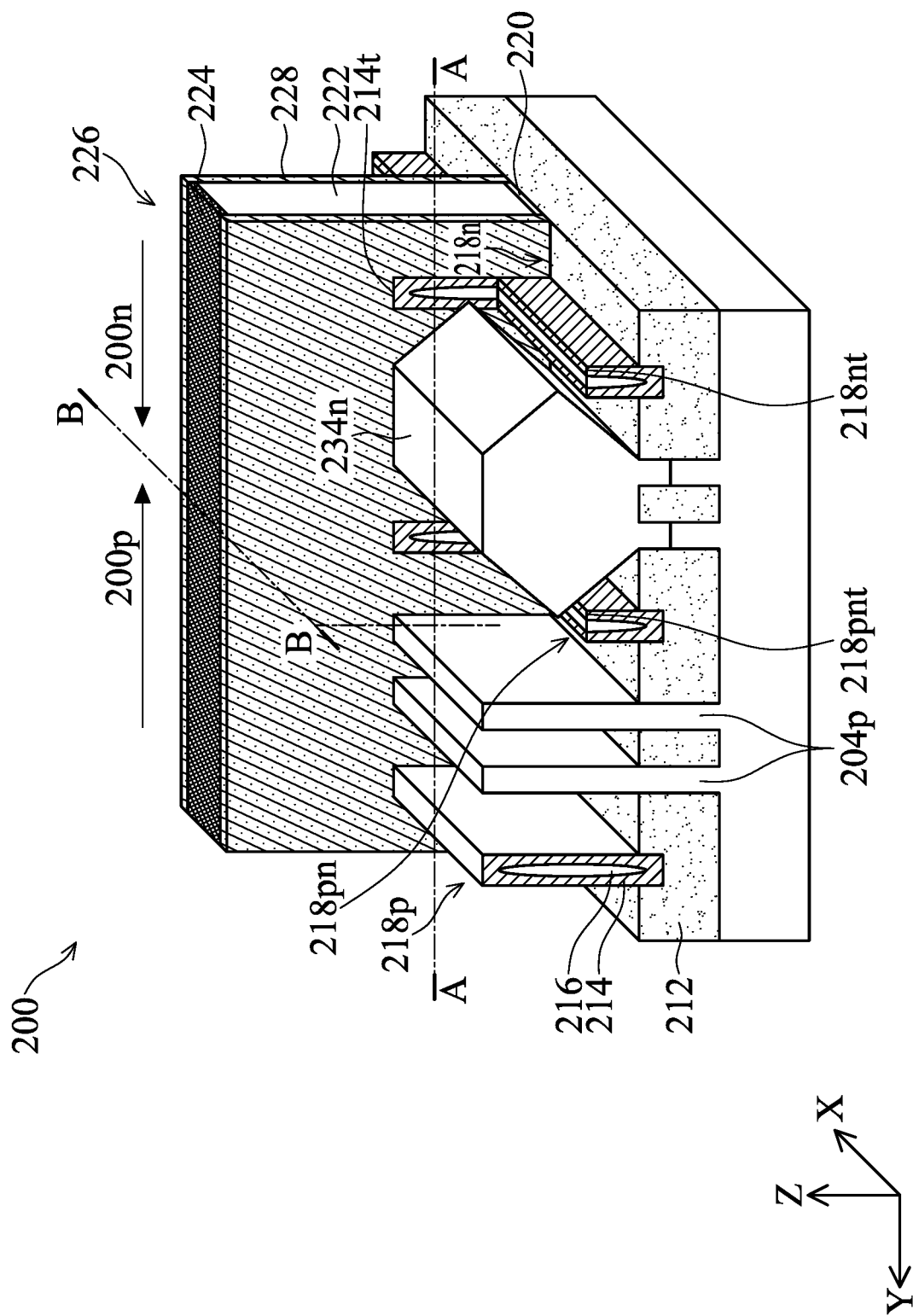

At operation 122, the sacrificial spacer layer 230 is removed, as shown in FIG. 14. The semiconductor fins 204p in the p-type device area 200p are exposed for processing. The sacrificial spacer layer 230 may be removed by any suitable etching method.

Figure 15:
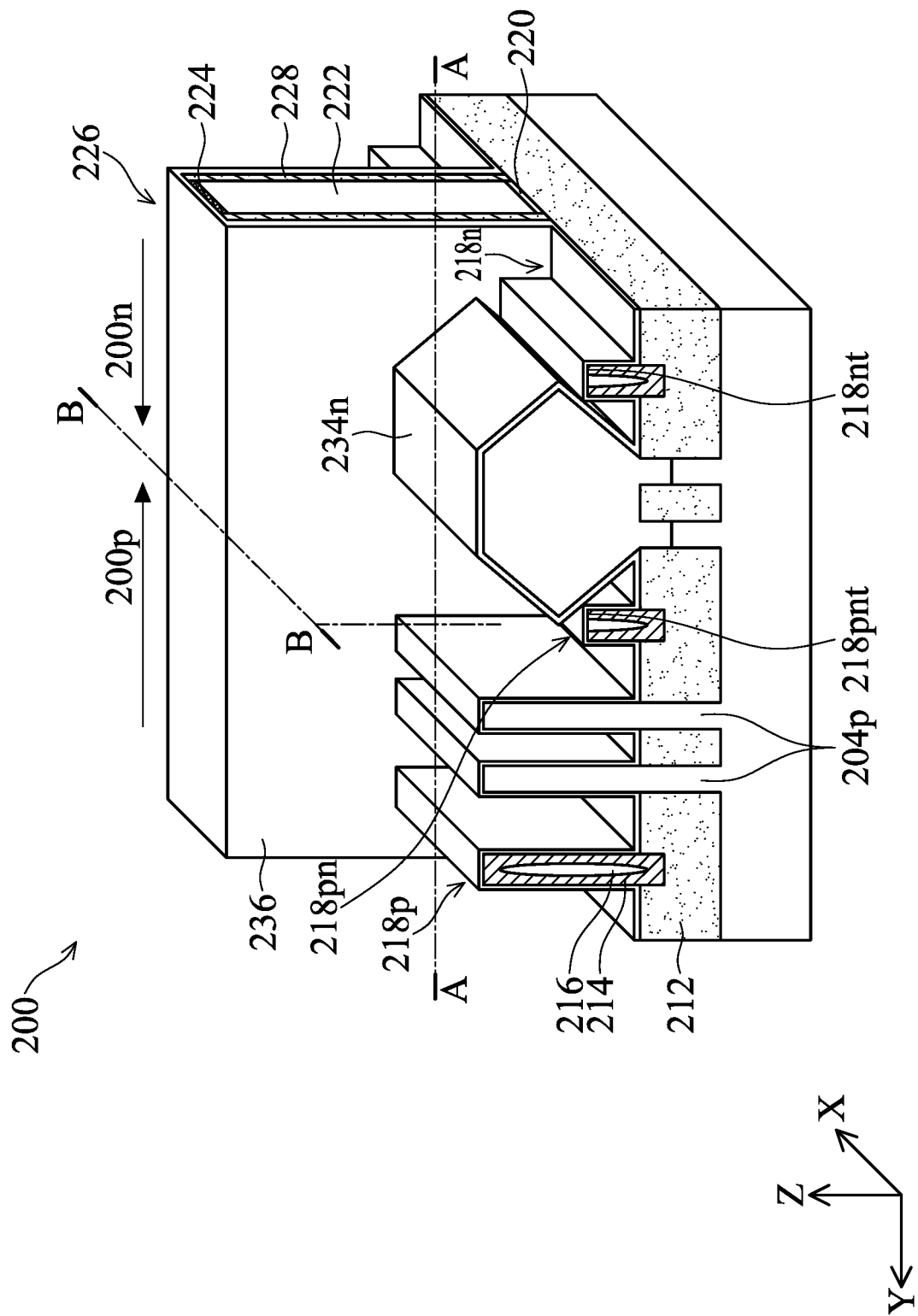

At operation 124, a sacrificial spacer layer 236 is deposited by a blanket deposition, as shown in FIG. 15. The sacrificial spacer layer 236 may be a dielectric layer used to protect regions not being processed during subsequent processing operations. For example, the sacrificial spacer layer 236 will protect the epitaxial source/drain structures 234n. Similar to the sacrificial spacer layer 230, the sacrificial spacer layer 236 may be selected from silicon nitride, silicon oxide, silicon oxynitride or a combination thereof. In some embodiments, the sacrificial spacer layer 236 is formed by CVD, ALD and/or other suitable technique.

Figure 16:
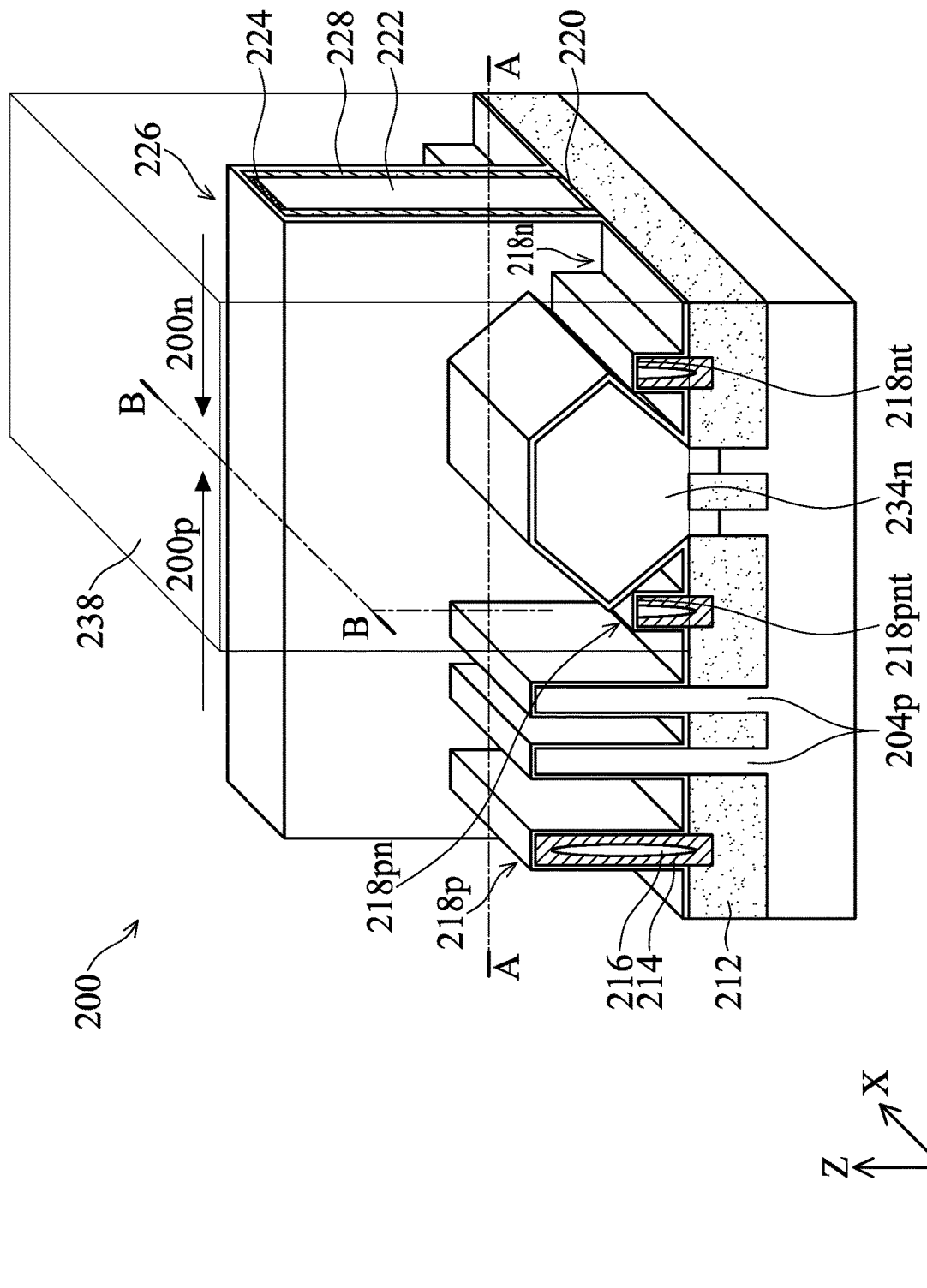
Figure 17:
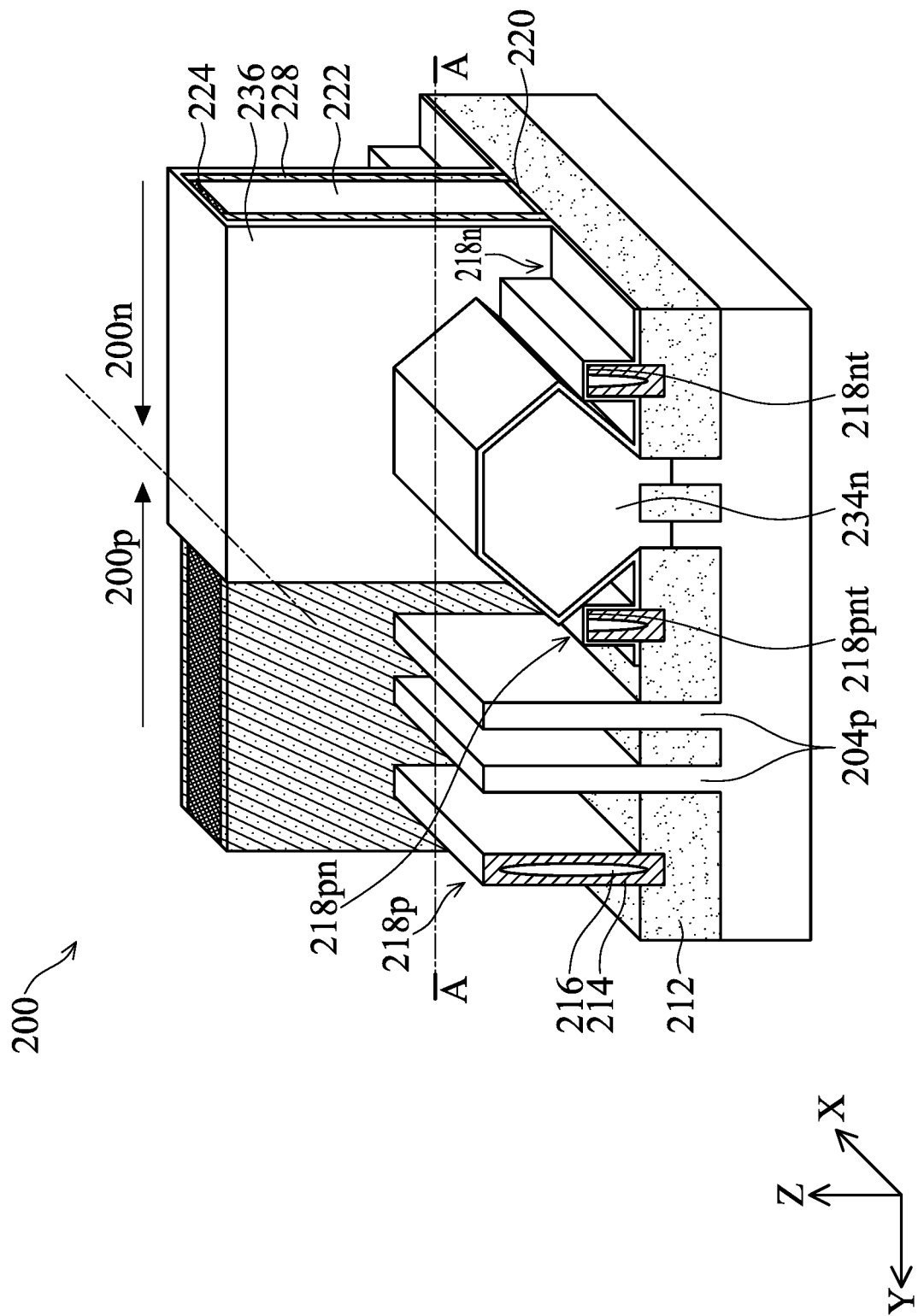

At operation 126 of the method 100, the sacrificial spacer layer 236 is patterned to expose the p-type device area 200p, as shown in FIGS. 16 and 17. A photoresist layer 238 is formed over the sacrificial spacer layer 236. The photoresist layer 238 is then patterned and used as a mask to remove the sacrificial spacer layer 236 over portions of the p-type device area 200p to expose the semiconductor fins 204p and the hybrid fins 218p. After photoresist layer 238 is patterned, the pattern is transferred to the sacrificial spacer layer 236 by a suitable etching method.

In some embodiments, the hybrid fin 218pn between the p-type device area 200p and the n-type device area 200n remains covered by the sacrificial spacer layer 236, as shown in FIG. 17. Covering the hybrid fin 218pn insures that the epitaxial source/drain features 234n are protected by the sacrificial spacer layer 236 especially when portions of the epitaxial source/drain features 234n expand over the hybrid fins 218pn.

Figure 18:
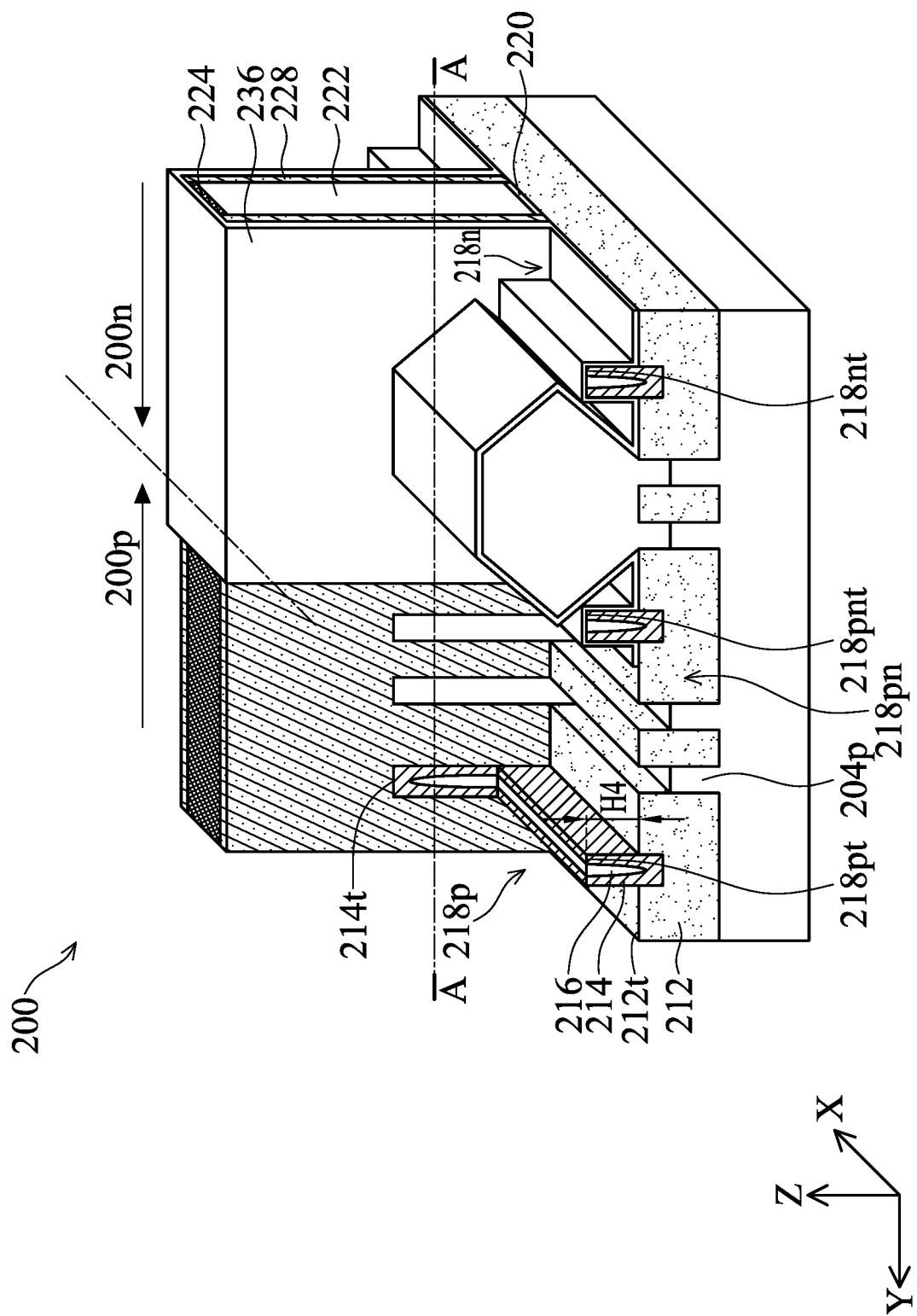

At operation 128 of the method 100, one or more etch processes are performed to etch back portions of the semiconductor fins 204 and the hybrid fins 218 exposed by the sacrificial spacer layer 236, as shown in FIG. 18.

In some embodiments, the semiconductor fins 204p are recess etched by a desired level for subsequent formation of source/drain features therefrom. In some embodiments, the semiconductor fins 204p may be recessed to a level below the top surface 212t of the isolation layer 212. The exposed hybrid fins 218p are also recess etched to below a top surface 204t of the semiconductor fins 204 as originally formed. The recess may be performed by any suitable process, such as dry etch, wet etch, or a combination thereof. In some embodiments, the exposed hybrid fins 218p may be etched to a protruding fin height H4 above the top surface 212t of the isolation layer 212. For example, the protruding fin height H4 may be defined by the distance between a cut top surface 218pt of the hybrid fins 218p and the top surface 212t of the isolation layer 212. In some embodiments, the recess etch may be similar to the etch method used at the operation 118.

Figure 19:
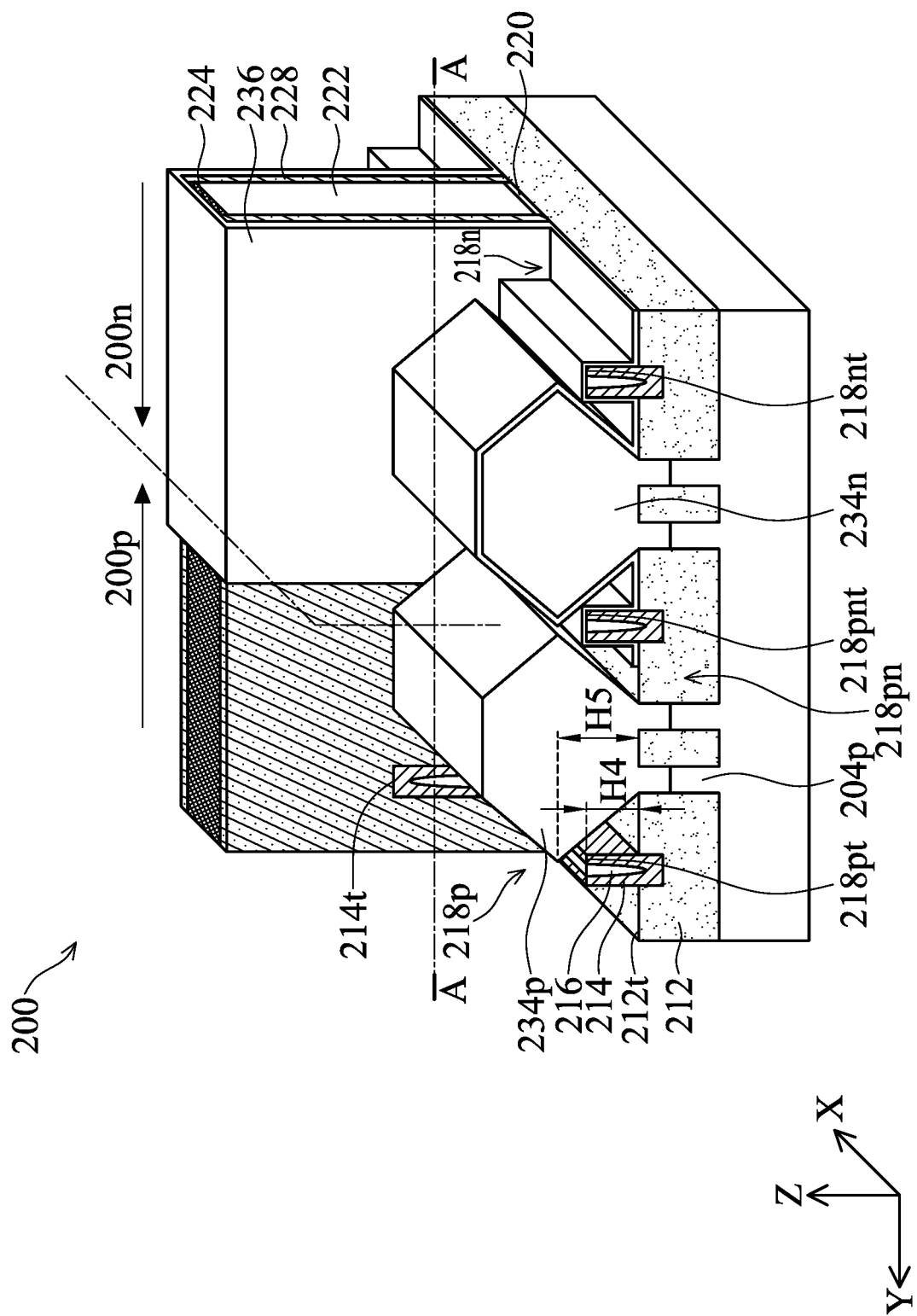

At operation 130 of the method 100, epitaxial source/drain features 234p are formed from the semiconductor fins 204p, as shown in FIG. 19. In some embodiments, a pre-clean process may be performed to remove any undesirable silicon oxide that is formed as a result of the oxidation of the exposed surfaces. The epitaxial source/drain features 234p may be formed by any suitable method, such as by CVD, CVD epitaxy, molecular beam epitaxy (MBE), or any suitable deposition technique. The epitaxial source/drain features 234p may include one or more layers of Si, SiGe, Ge with p-type dopants, such as boron (B), for a p-type device, such as pFET. In some embodiments, the epitaxial source/drain features 234p may be SiGeB material, wherein boron is a dopant. In some embodiments, the epitaxial source/drain features 234p is a SiGeB layer with a boron concentration of between about 5E18 atoms/cm$^3$ and about 1E21 atoms/cm$^3$.

The shape and dimension of the epitaxial source/drain features 234p may be controlled by adjusting processing parameters and/or height of sidewall spacers, if present. In some embodiments, the cross section of the epitaxial source/drain features 234p may have a wider middle portion and narrower upper and lower portion, such as a hexagon shape or an oval shape. In some embodiments, the widest middle portion along the y-direction may have a center height H5 from the top surface 212t of the isolation layer 212. In some embodiments, the widest middle portion occurs at near the middle of the semiconductor fins 204. The center height H5 is about 50% of the protruding fin height H1. In some embodiments, the center height H5 may be greater than the protruding fin height H4 of the hybrid fin 218p and the protruding fin height H2 of the hybrid fin 218pn.

Figure 20:
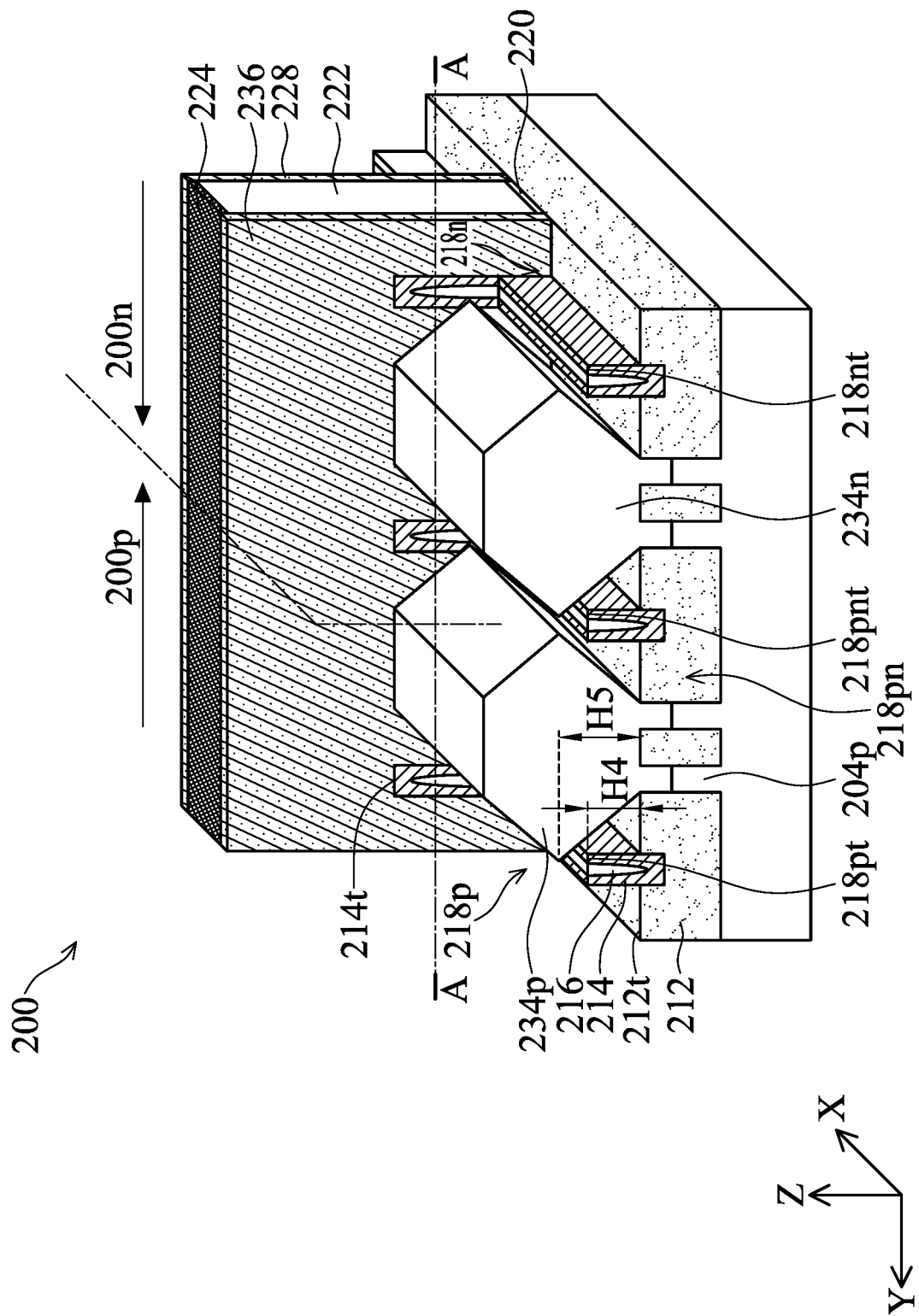

At operation 132 of the method 100, the sacrificial spacer layer 236 is removed, as shown in FIG. 20. The hybrid fins 218n, 218pn, and 218n and the epitaxial source/drain features 234n, 234p are exposed for subsequent processing. The sacrificial spacer layer 236 may be removed by any suitable etching method.

Figure 21:
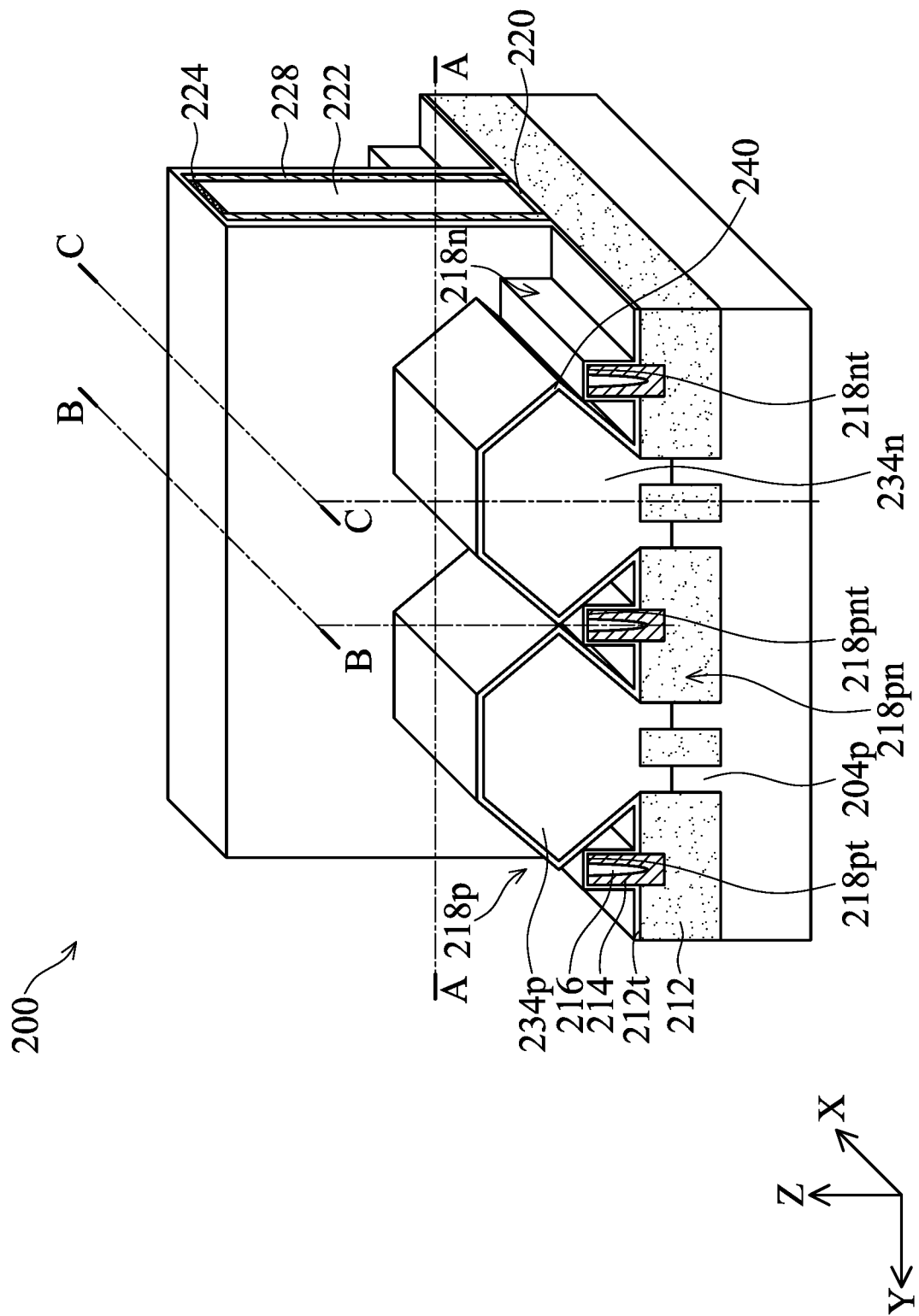
Figure 21A:
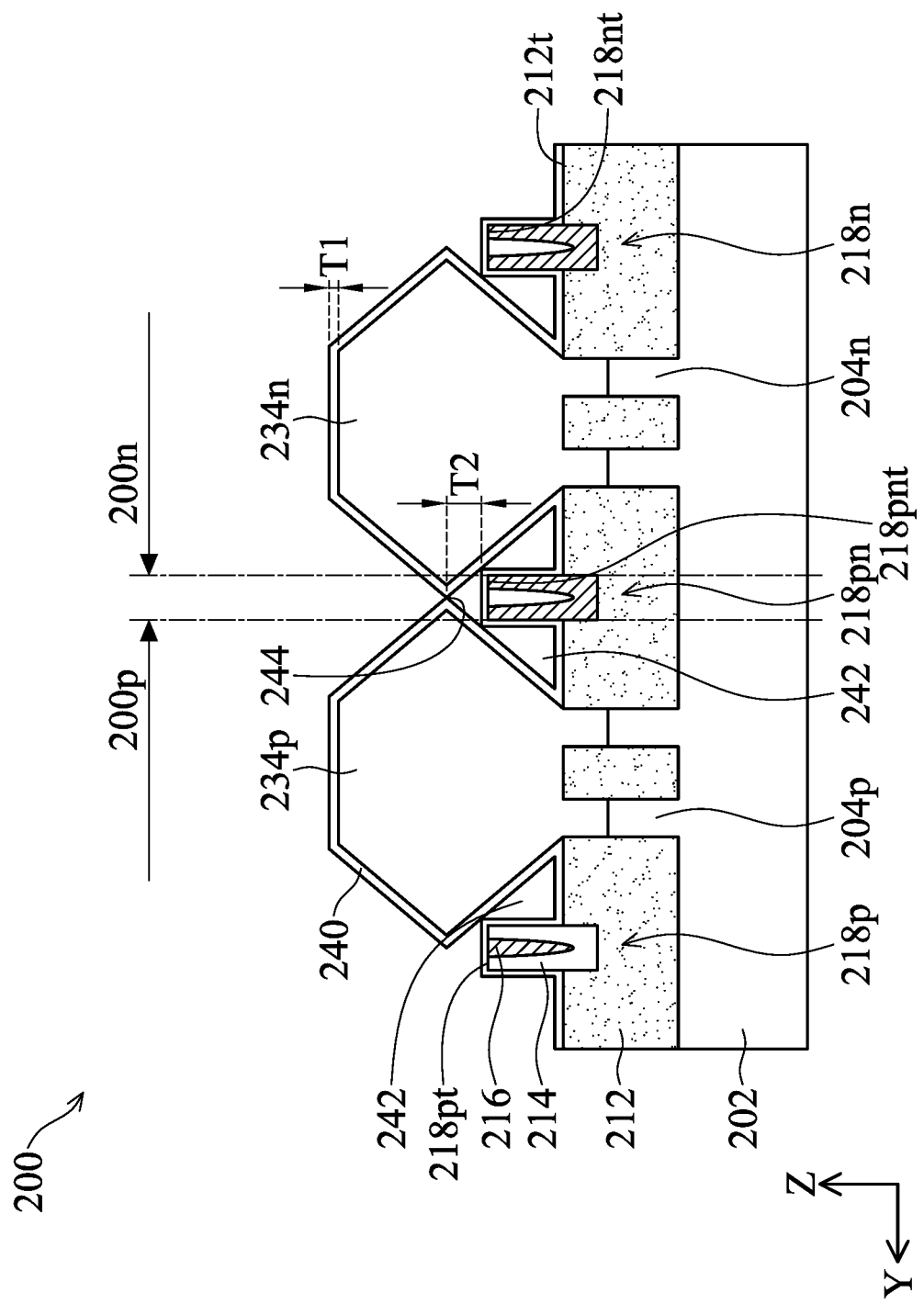
Figure 21C:
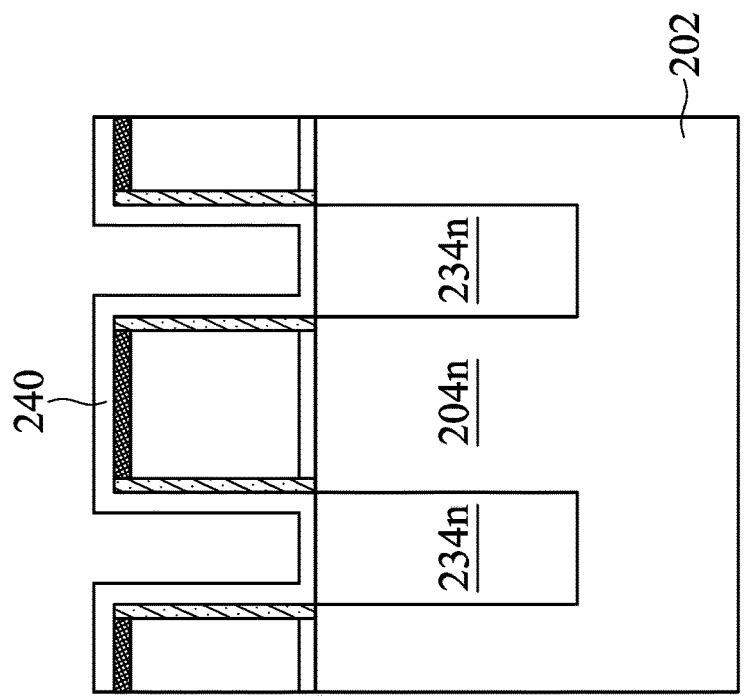
Figure 21B:
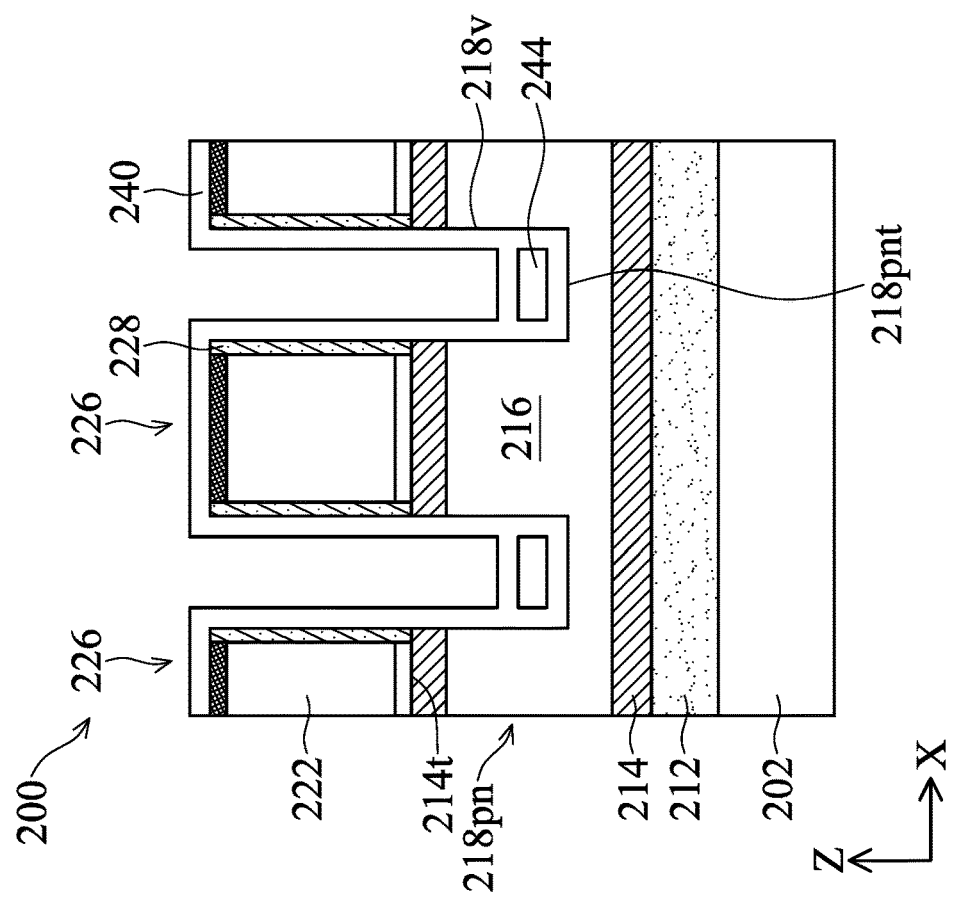

At operation 134 of the method 100, a contact etch stop layer (CESL) 240 is deposited over the semiconductor device 200, as shown in FIGS. 21, 21A, 21B, and 21C. FIG. 21A is a schematical sectional view of the semiconductor device 200 along the A-A line in FIG. 21. FIG. 21B is a schematical sectional view of the semiconductor device 200 along the B-B line in FIG. 21. FIG. 21C is a schematical sectional view of the semiconductor device 200 along the C-C line in FIG. 21. The CESL 240 is conformally formed over exposed surfaces of the semiconductor device 200. As shown in FIG. 21, the CESL 240 covers exposed surfaces of the epitaxial source/drain features 234n, 234p, the hybrid fins 218n, 218p, 218pn, the isolation layer 212, the sidewall spacers 228. The CESL 240 may include SiN, SiON, SiCN or any other suitable material, and may be formed by CVD, PVD, or ALD.

In some embodiments, the CESL 240 may have a thickness T1 on the exposed surfaces of the epitaxial source/drain features 234n, 234p. In some embodiments, the thickness T1 of the CESL 240 on the epitaxial source/drain features 234n, 234p may be maintained in an enough value to protect the epitaxial source/drain features 234n, 234p during the contact hole etching process. In some embodiments, the thickness T1 may be in a range from about 1 nm to about 10 nm.

As shown in FIGS. 21A and 21B, the air gaps 242 may be formed between the epitaxial source/drain features 234n, 234p and the hybrid fin 218n, 218p, 218pn disposed next to the epitaxial source/drain features 234n, 234p. The air gaps 242 are formed during deposition of the CESL 240 layer when the entrance to the space between the epitaxial source/drain features 234n, 234p and the hybrid fin 218n, 218p, 218pn is pinched off. Depending on the dimension and shape of the epitaxial source/drain features 234n, 234p and the adjacent hybrid fins 218n, 218p, and 218pn, the CESL 1240 around the air gaps 242 may be thinner than the thickness T1. Alternatively, the CESL 240 may fill the space between the epitaxial source/drain features 234n, 234p and the adjacent hybrid fins 218 without forming any air gaps therebetween. In some embodiments, the air gaps 242 may be formed during formation of the epitaxial source/drain features 234n, 234p, thus no CESL material is disposed within the air gaps 242.

As shown in FIGS. 21A and 21B, the CESL 240 may be deposited on the cut top surface 218nt, 218pnt, 218pt and vertical cut surface 218v of the hybrid fins 218n, 218pn, 218p. The CESL 240 may seal any air gaps 216 that is exposed in the cut top surface 218nt, 218pnt, 218pt and vertical cut surface 218v. Because the cut top surfaces 218nt, 218pnt, 218pt of the hybrid fins 218 are at a level below the widest portion of the epitaxial source/drain features 234n, 234p, the CESL 240 deposited on the widest portion of the epitaxial source/drain features 234n, 234p is also located above the cut top surface 218h of the hybrid fins 218. Therefore, the recessed hybrid fins 218 may have additional layers of the CESL 240 for protection. In other words, the CESL 240 disposed above the cut top surface 218nt, 218pnt, 218pt may have thickness greater than the thickness T1. For example, the CESL 240 may have a thickness T2 over the cut top surface 218nt, 218pnt, 218pt. In some embodiments, a ratio between the thickness T2 over the thickness T1 may be in a range between 1.5 and 6.0. A ratio less than 2.0, the CESL 240 may be able to seal the air gaps 216 in the hybrid fin 218 below during etching of the CESL 240 during contact hole formation. A ratio greater than 4.0 may increase CR delay without additional benefit for sealing protection.

In some embodiments, an air gap 244 may form within the CESL 240 region above the CESL 240 region depending on the dimension and geometry of the space between the epitaxial source/drain features 234n, 234p and the hybrid fin 218pn, and deposition parameter of CESL 240. Alternatively, air gaps 244 may be present in the CESL 240 above the hybrid fin 218.

Figure 22:
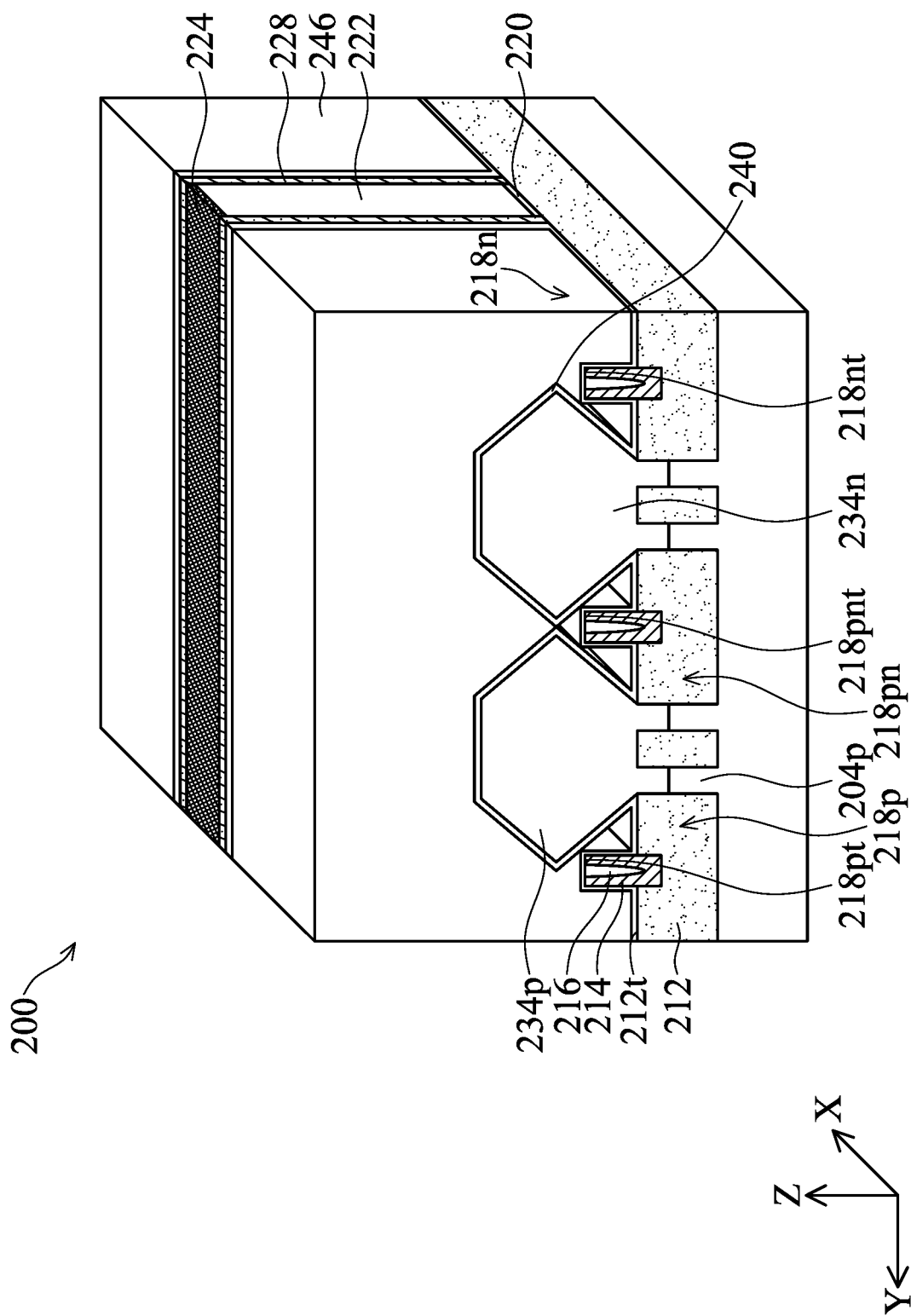

At operation 136 of the method 100, an interlayer dielectric (ILD) layer 246 is formed over the CESL 240, as shown in FIG. 22. The materials for the ILD layer 246 include compounds comprising Si, 0, C, and/or H, such as silicon oxide, SiCOH and SiOC. Organic materials, such as polymers, may be used for the ILD layer 246. In some embodiments, the ILD layer 246 may be formed by flowable CVD (FCV). The ILD layer 246 protects the epitaxial source/drain features 234n, 234p during the removal of the sacrificial gate structures 226. After deposition of the ILD layer 246, a planarization process may be performed to expose the sacrificial gate structure 226 for the subsequent replacement gate process.

Figure 23:
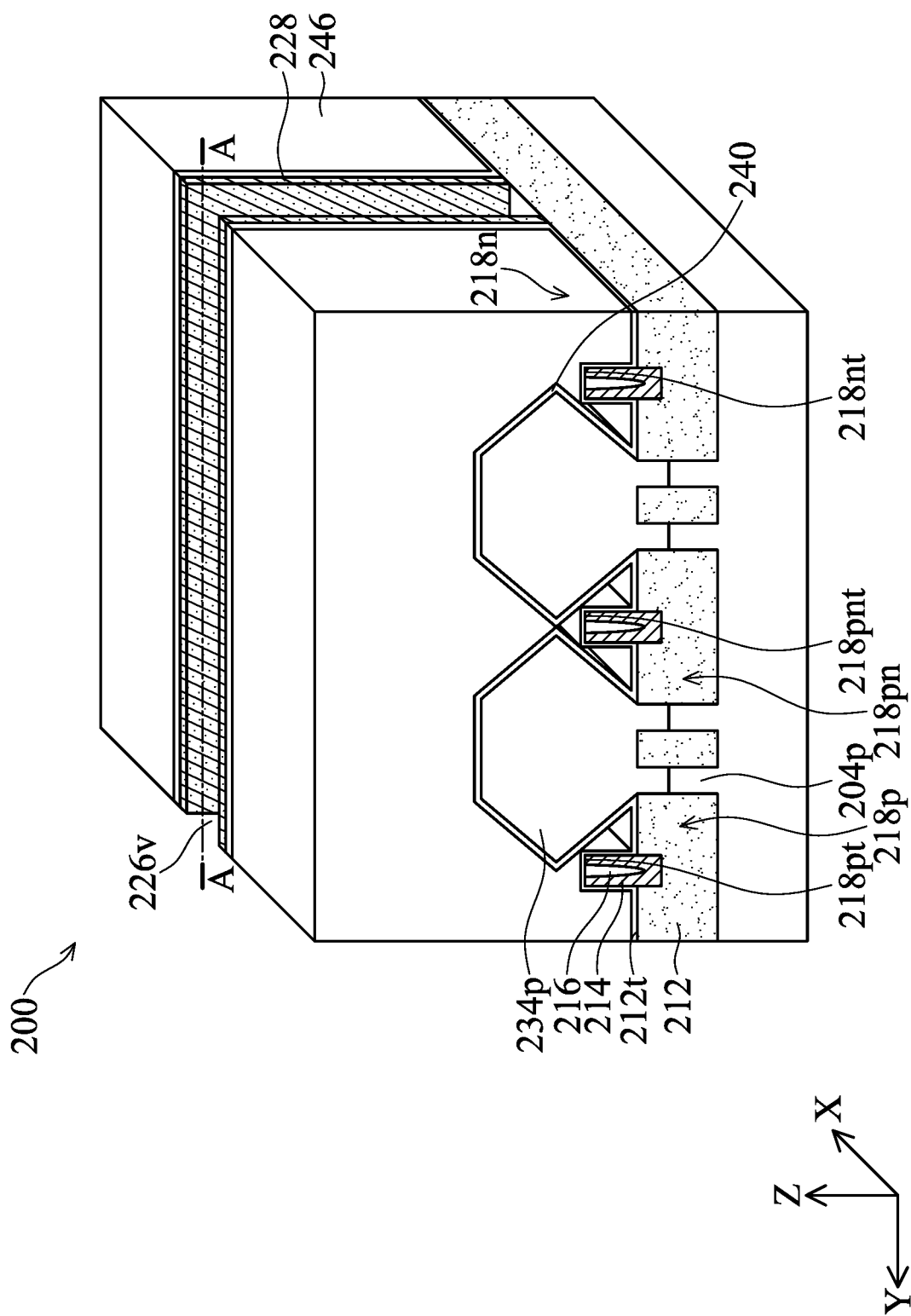
Figure 23A:
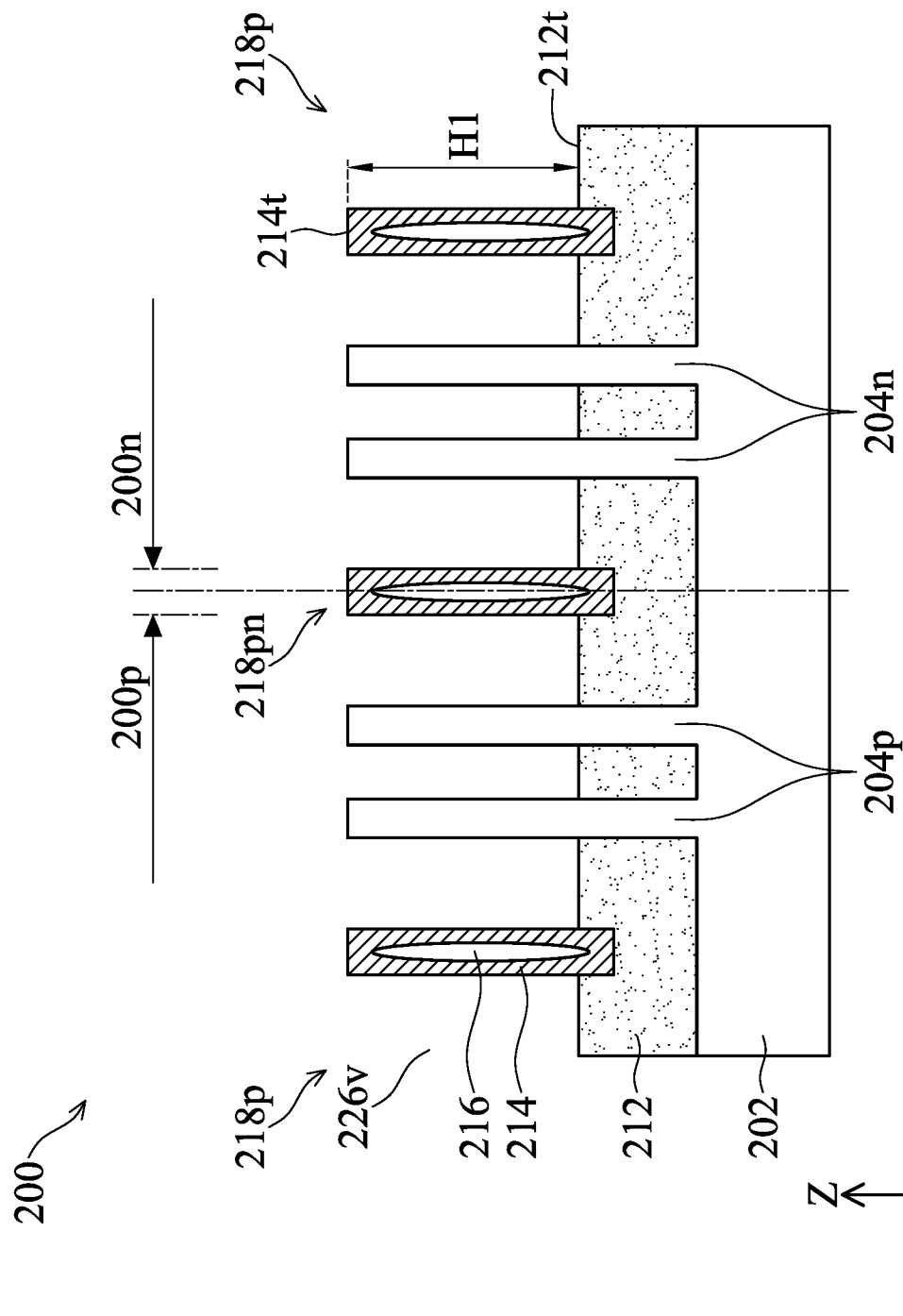

At operation 138 of the method 100, the sacrificial gate structure 226 is removed forming a gate cavity 226v between the sidewall spacers 228, as shown in FIG. 23. The sacrificial gate dielectric layer 220 and sacrificial gate electrode layer 222 are removed by one or more suitable process, such as dry etch, wet etch, or a combination thereof, to expose the semiconductor fins 204. In some embodiments, a wet etchant such as a tetramethylammonium hydroxide (TMAH) solution is used. FIG. 23A is a schematical sectional view of the semiconductor device 200 along the A-A line in FIG. 23. As shown in FIG. 21A, the hybrid fins 218p, 218pn, 218n remain substantially the protruding fin height H1 in the gate cavity 226v.

Figure 24:
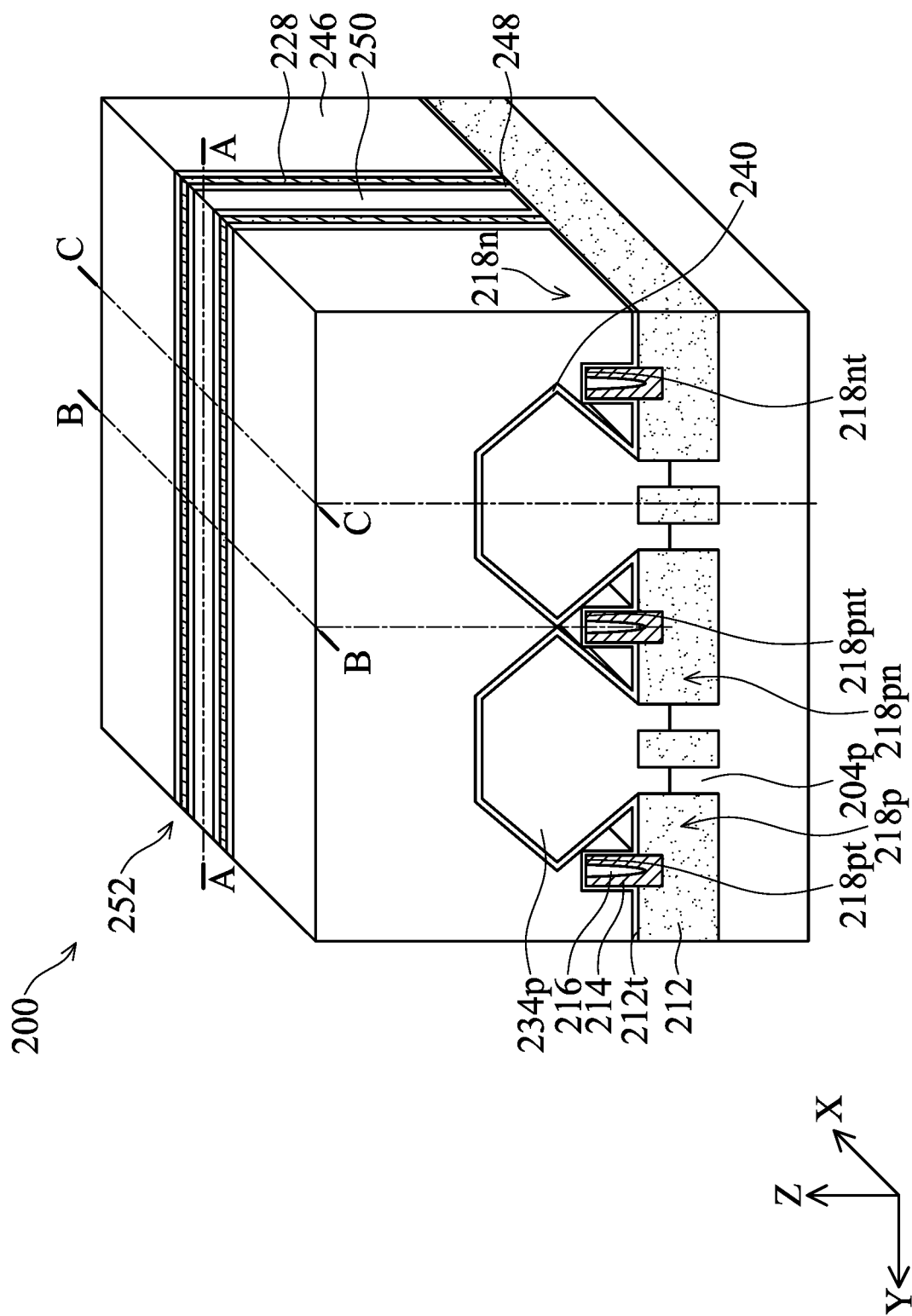
Figure 24A:
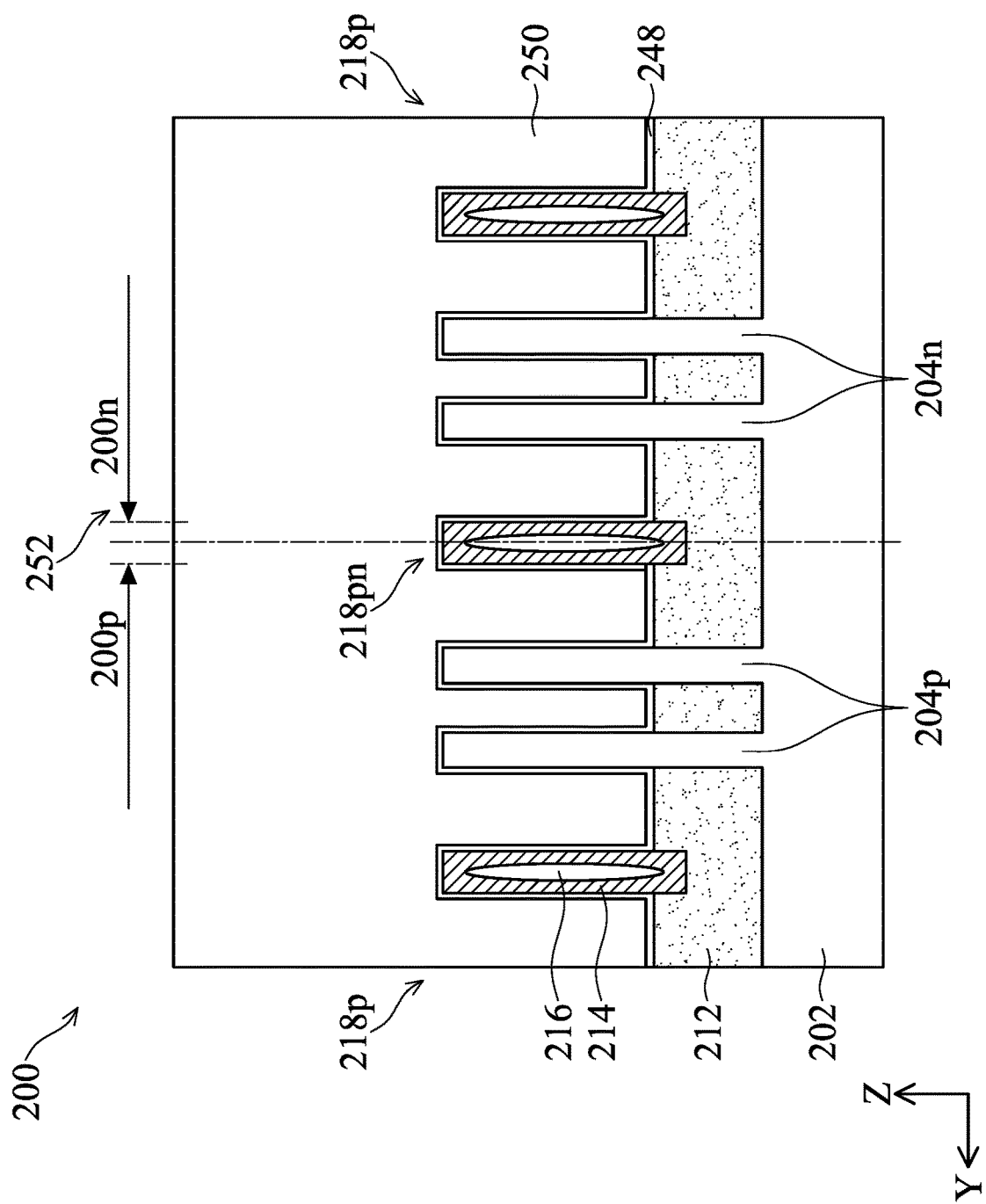
Figure 24C:
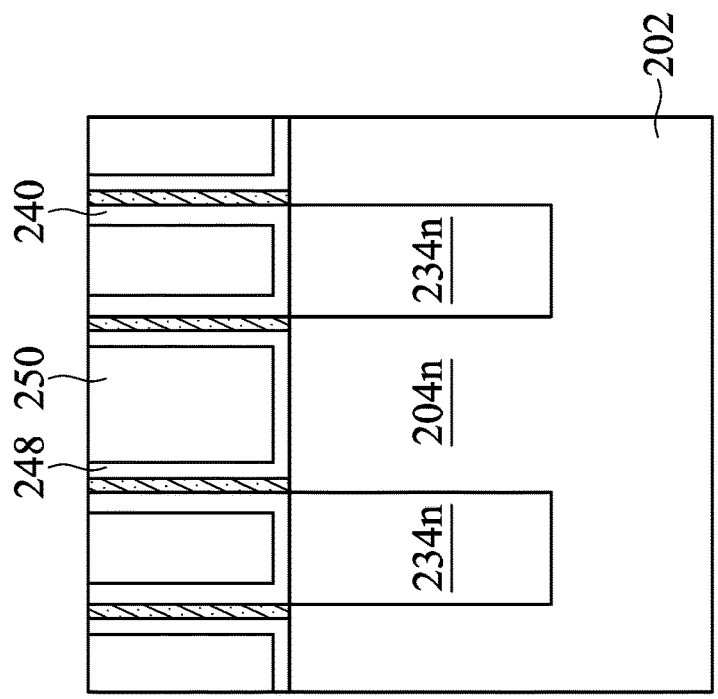
Figure 24B:
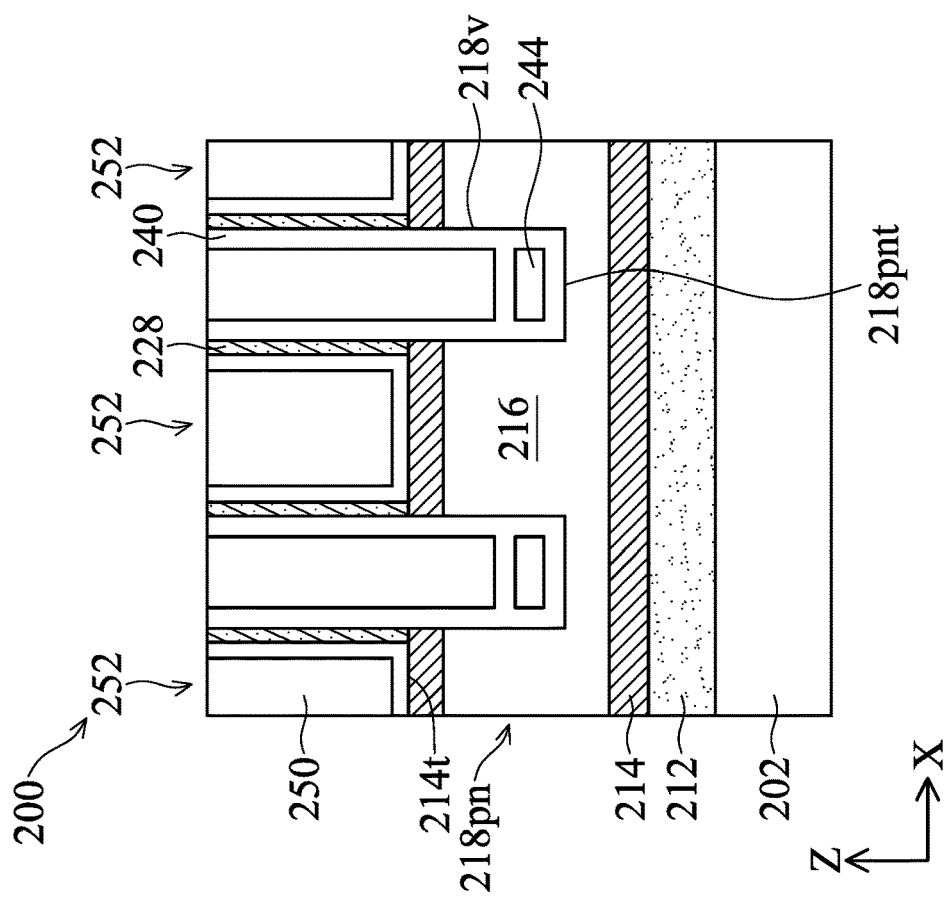

At operation 140 of the method 100, replacement gate structures 252 are formed, as shown in FIGS. 24, 24A, 24B, 24C. FIG. 24A is a schematical sectional view of the semiconductor device 200 along the A-A line in FIG. 24. FIG. 24B is a schematical sectional view of the semiconductor device 200 along the B-B line in FIG. 24. FIG. 24C is a schematical sectional view of the semiconductor device 200 along the C-C line in FIG. 24. The replacement gate structure 252 may include a gate dielectric layer 248 and a gate electrode layer 250.

The gate dielectric layer 248 may be conformally deposited on exposed surfaces in the gate cavity 226v. The gate dielectric layer 248 may have different composition and dimensions for N-type devices and P-type devices and are formed separately using patterned mask layers and different deposition recipes. The gate dielectric layer 248 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 248 may be formed by CVD, ALD or any suitable method.

The gate electrode layer 250 is then formed on the gate dielectric layer 248 to fill the gate cavities 226v. The gate electrode layer 250 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 250 may be formed by CVD, ALD, electro-plating, or other suitable method. After the formation of the gate electrode layer 250, a planarization process, such as a CMP process, is performed to remove excess deposition of the gate electrode material and expose the top surface of the ILD layer 246.

Figure 25:
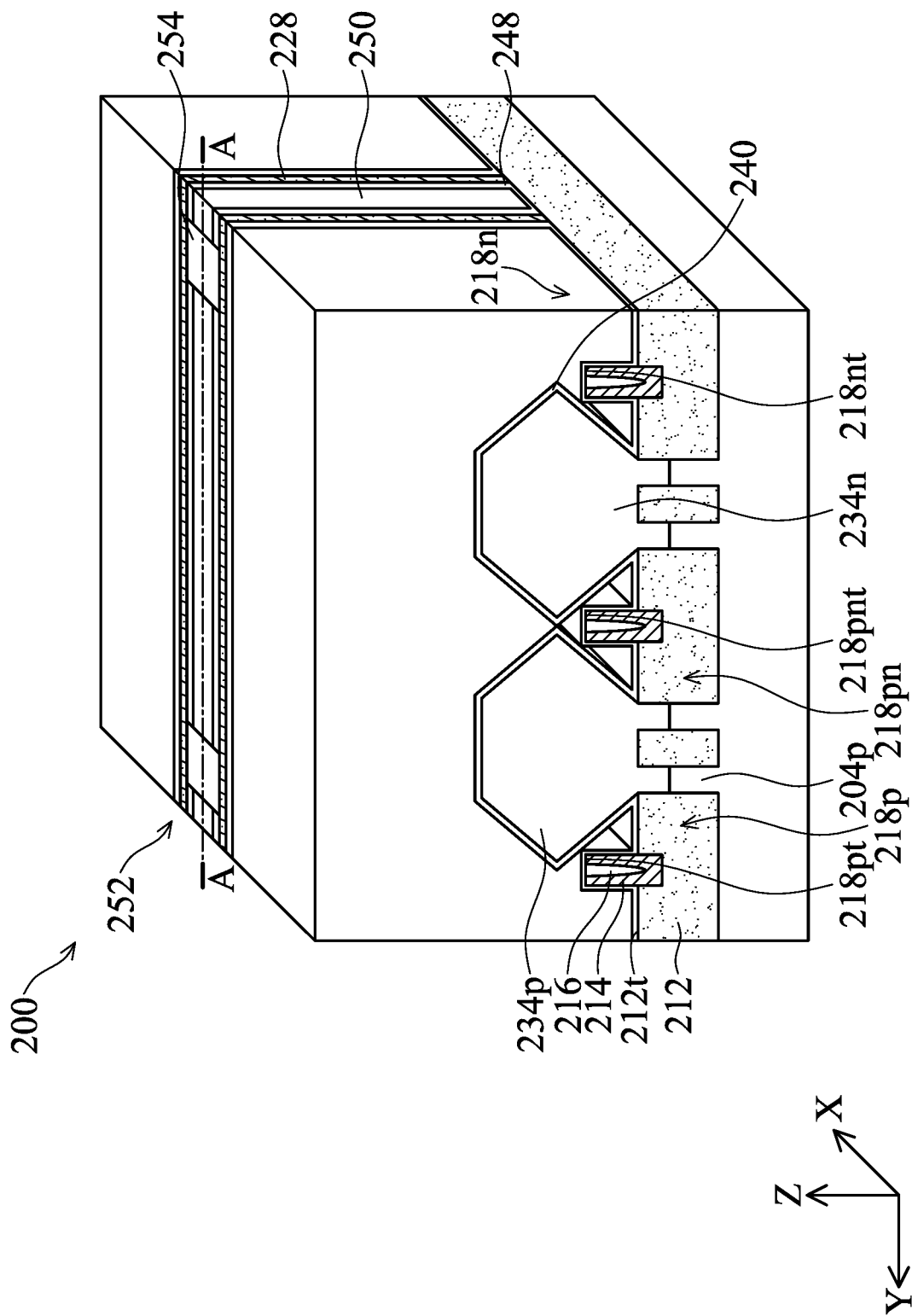
Figure 25A:
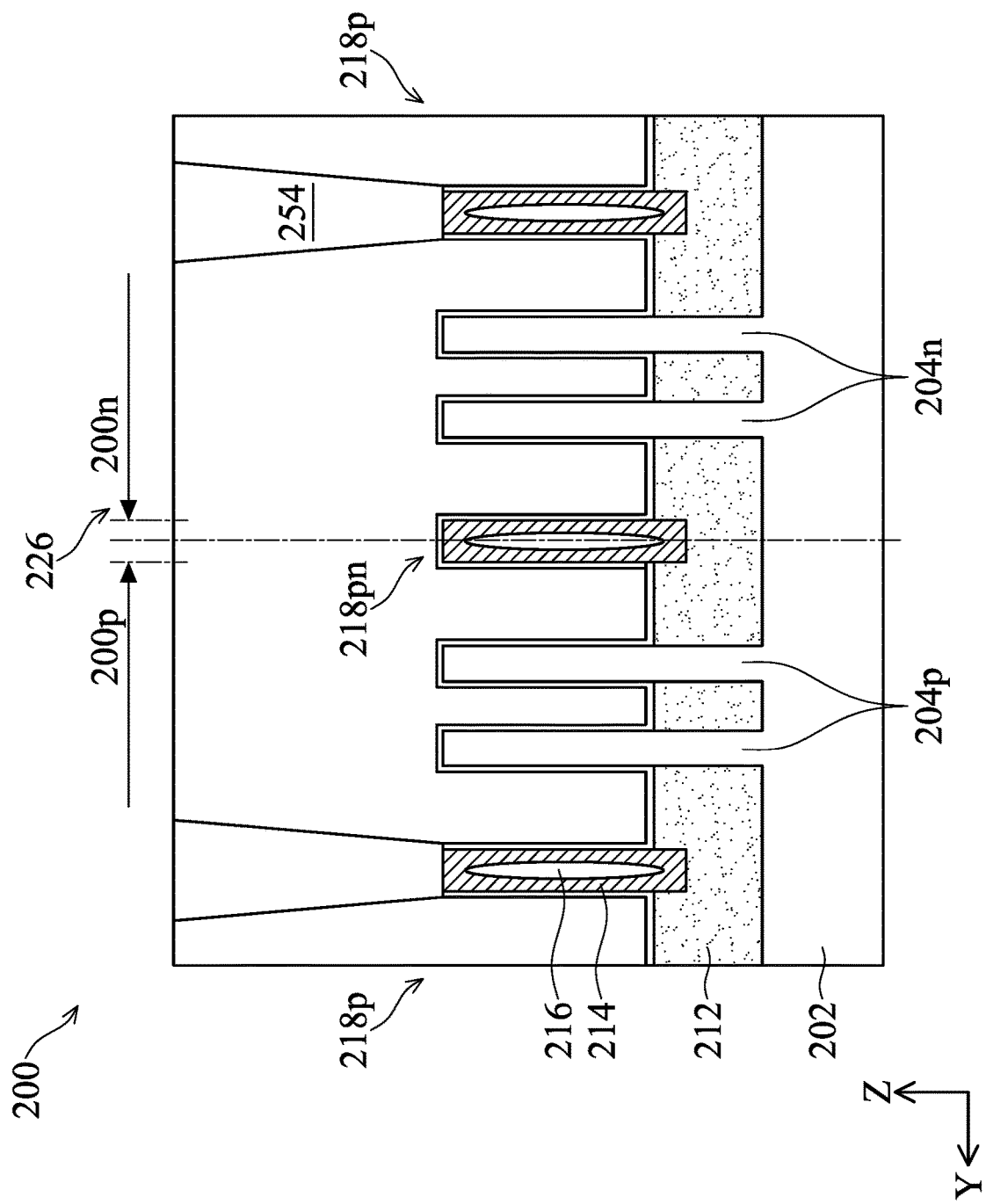

At operation 142 of the method 100, dielectric structures 254 are formed in the replacement gate structure 252, as shown in FIGS. 25 and 25A. FIG. 25A is a schematical sectional view of the semiconductor device 200 along the A-A line in FIG. 25. The dielectric structure 254 includes dielectric material and functions to divide the gate electrode layer 250 into electrically isolated sections. In some embodiments, the dielectric structure 254 is connected to one of the hybrid fins 218, and the gate electrode layer 250 is divided into electrically isolated sections by the dielectric structure 254 and the hybrid fin 218 connected to the dielectric structure 254 as shown in FIG. 25A. Alternatively, the dielectric structure 254 may extend the top surface 212t of the isolation layer 212 to the top of the replacement gate structure 252.

One or more etching processes are performed to remove portions of the gate dielectric layer 248 and the gate electrode layer 250 to divide the replacement gate structure 252 into two or more sections along the y-direction. The etching process may be a plasma etching process employing one or more etchants such as chlorine-containing gas, a bromine-containing gas, and/or a fluorine-containing gas. The etching process allows the gate dielectric layer 248 and the gate electrode layer 250 to be selectively etched from the ILD layer 246 and the CESL 240. The gate dielectric layer 248 and gate electrode layer 250 are etched back to a level lower than the top surface 218t of the hybrid fins 218 parallel to the semiconductor fins 204.

The dielectric structure 254 is formed by filling the trenches in the replacement gate structure 252 by one or more deposition processes and followed by a planarization process to expose the gate electrode layer 250. The dielectric structure 254 may include one or more layers of the dielectric materials. In some embodiments, the dielectric structure 254 may include silicon nitride, silicon oxynitride, silicon carbide, and the like, formed by PVD, CVD, ALD, or other suitable deposition method.

Figure 26:
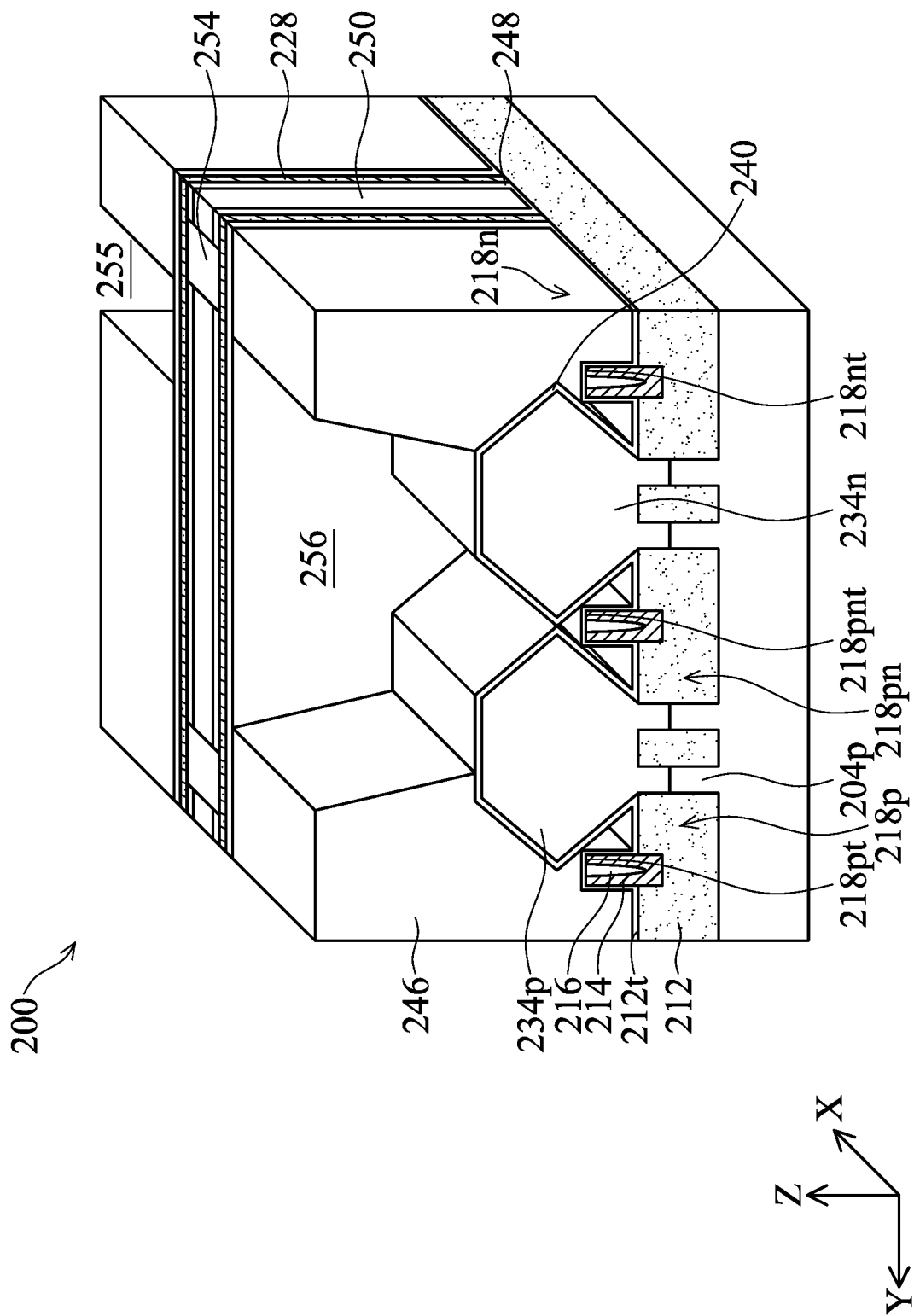

At operation 144 of the method 100, contact holes 255, 256 for the epitaxial source/drain contact features 234n and/or the epitaxial source/drain contact features 234p are formed by one or more patterning and suitable etching processes, as shown FIG. 26. At operation 144, the contact holes 255, 256 are formed by one or more patterning and etch processes to remove portions of the ILD layer 246 and expose the CESL 240 covering the epitaxial source/drain features 234n, 234p to be connected. The contact holes 255, 256 may be intended to form a contact feature to a single source/drain feature or a joint contact feature to connect two or more epitaxial source/drain features.

In FIG. 26, the contact hole 256 is intended to form a joint contact feature for connecting the epitaxial source/drain feature 234n and the epitaxial source/drain feature 234p, which are disposed on opposite sides of the hybrid fin 218pn. In some embodiments, after operation 144, portions of the CESL 240 over the epitaxial source/drain features 234n, 234p and the hybrid fin 218pn are exposed to the contact hole 256.

Figure 27:
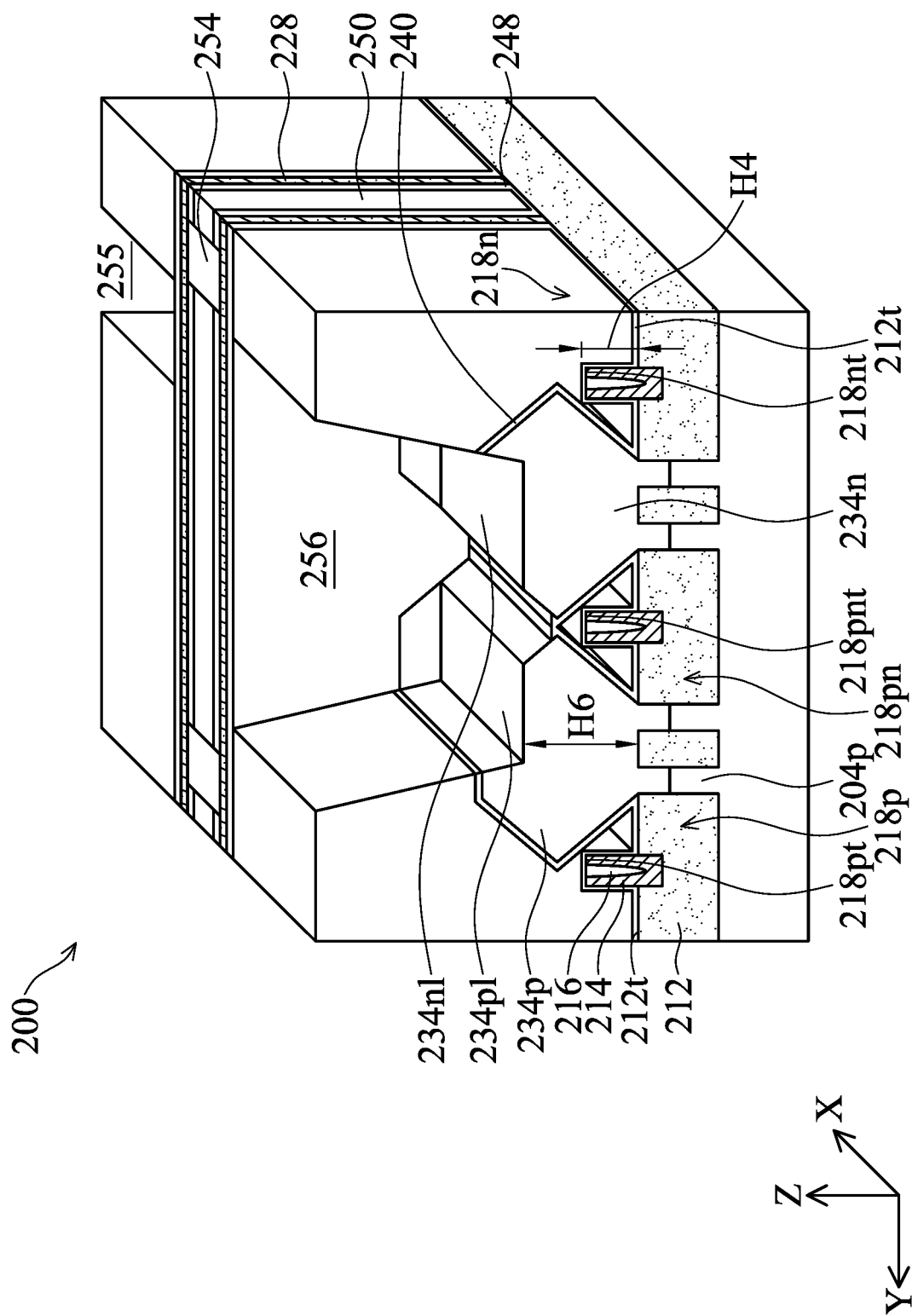

At operation 146 of the method 100, the CESL 240 is removed and epitaxial source/drain features 234n, 234p are etched back to create a contact landing plane, as shown in FIG. 27.

In some embodiments, the CESL 240 may be removed first using a suitable etching process. In some embodiments, the CESL 240 may be etched by an anisotropic etching. As discussed above, because the hybrid fin 218pn has been etched back to a level below the widest portions of the epitaxial source/drain features 234n, 234p, the CESL 240 over the cut top surface 218pnt of the hybrid fin 218pn has a greater thickness than the CESL 240 on other portions of the epitaxial source/drain features 234n, 234p. The thicker CESL 240 over the hybrid fin 218pn insures that the hybrid fin 218pn remains covered by the CESL 240 after the epitaxial source/drain features 234n, 234p are exposed to the contact hole 256.

After the CESL 240 is removed from the epitaxial source/drain features 234n, 234p, a portion of the epitaxial source/drain features 234n, 234p are then removed to generate contact surfaces in the epitaxial source/drain features 234n, 234p. In some embodiments, the epitaxial source/drain features 234n, 234p may be etched by an anisotropic etching method along the z-direction. The contact surfaces in each of the epitaxial source/drain features 234n, 234p may include a horizontal portion 234n1, 234p1 substantially parallel to the x-y plane, and various non-horizontal surfaces depending on the location and shape of the contact hole 256, and the shape of the epitaxial source/drain features 234n, 234p. The horizontal portion 234n1, 234p1 may be referred to as the landing plane. The horizontal portions 234n1, 234p1 of the epitaxial source/drain features 234n, 234p may be at substantially the same level in the z-direction. The level of the horizontal portions 234n1, 234p1 may be selected to obtain increased contact areas. In some embodiments, the horizontal portions 234n1, 234p1, i.e. the landing plane, may be a landing height H6 from the top surface 212t of the isolation layer 212. In some embodiments, the landing height H6 of the landing plane is higher than the protruding fin height H4 of the recessed hybrid fin 218pn, 218p, 218n. In some embodiments, the landing height H6 of the landing plane may be higher than the center height H5 of the widest portion of the epitaxial source/drain features 234n, 234p.

Figure 28:
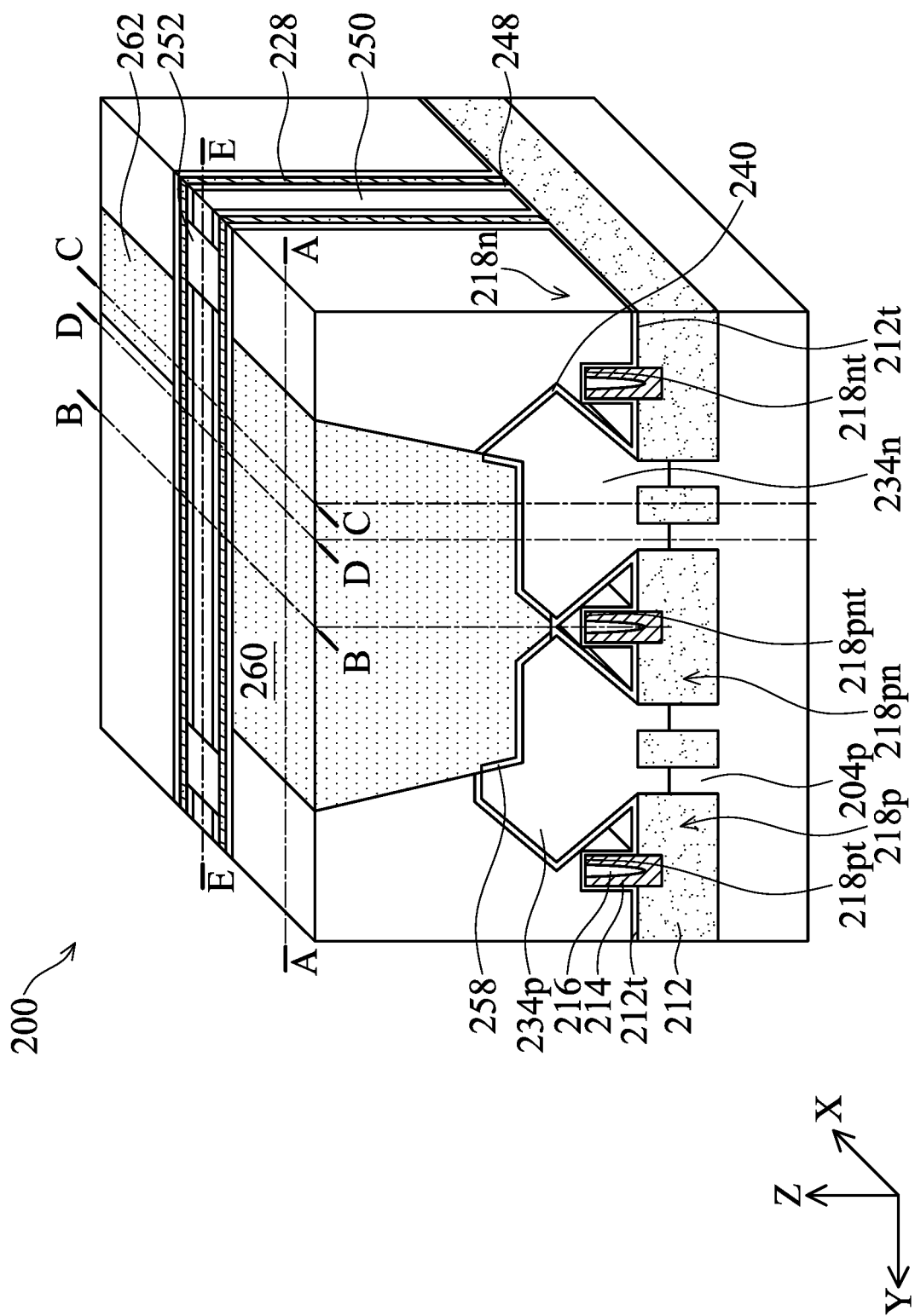
Figure 28A:
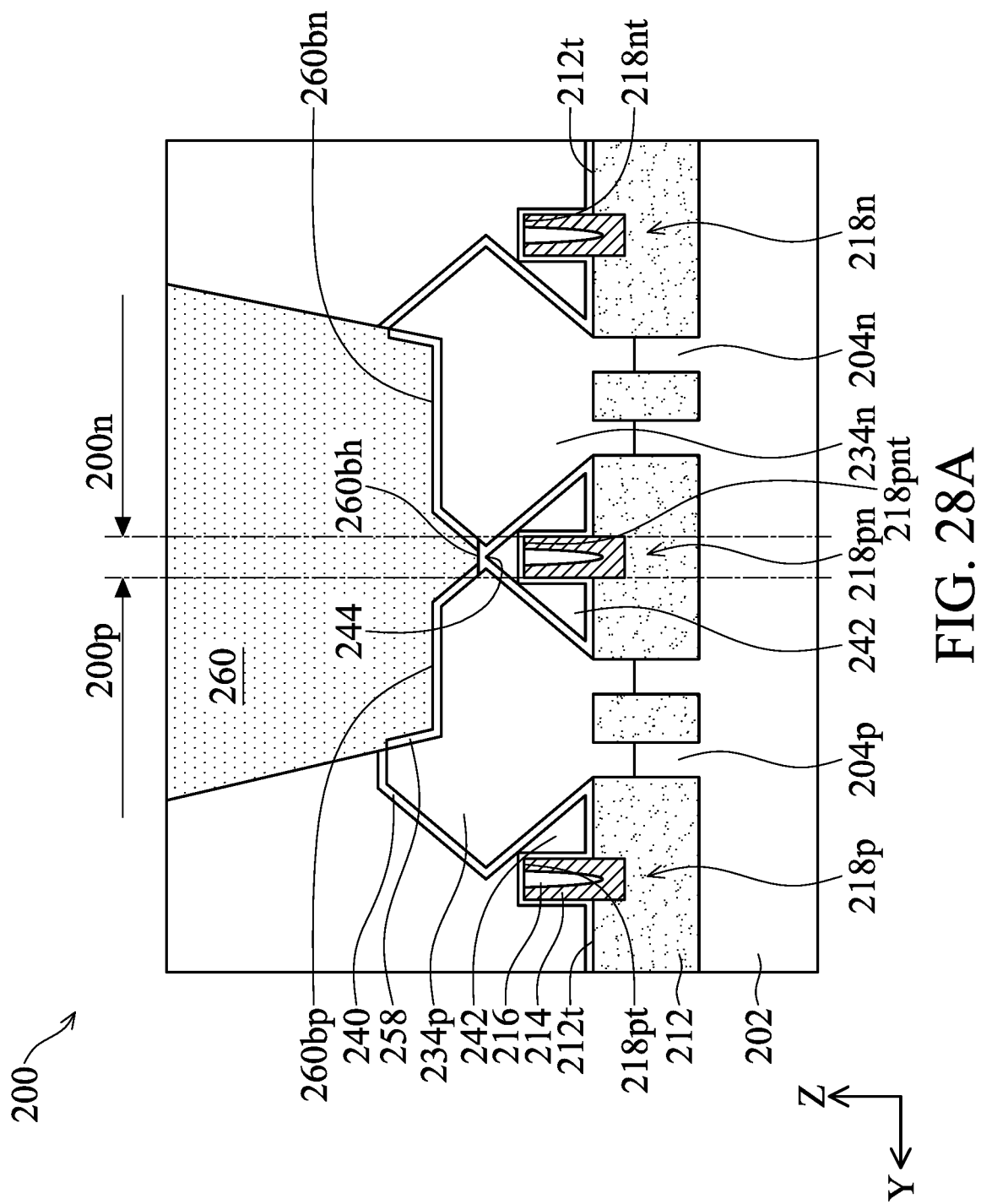
Figures 28B, 28C:
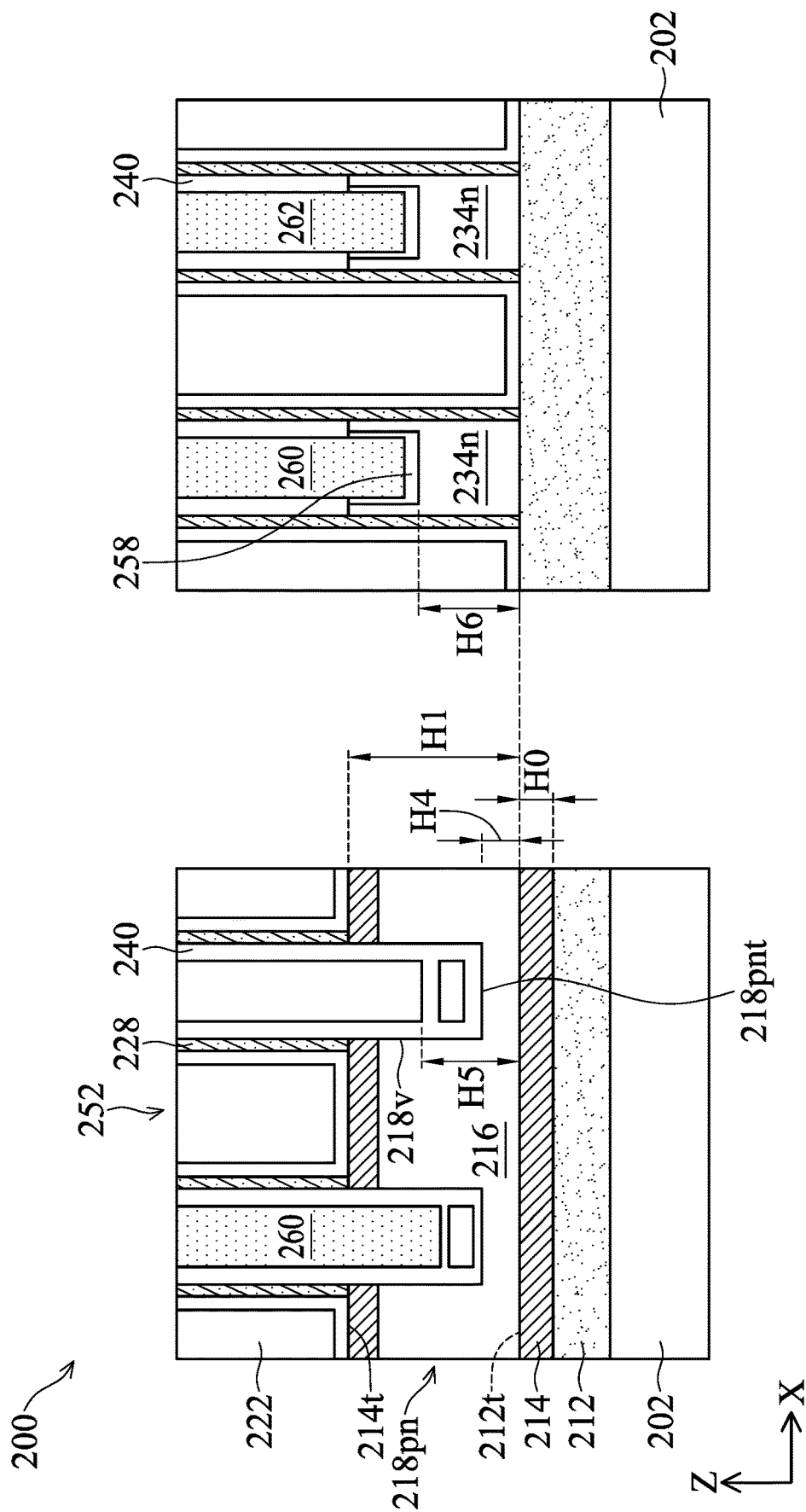
Figure 28E:
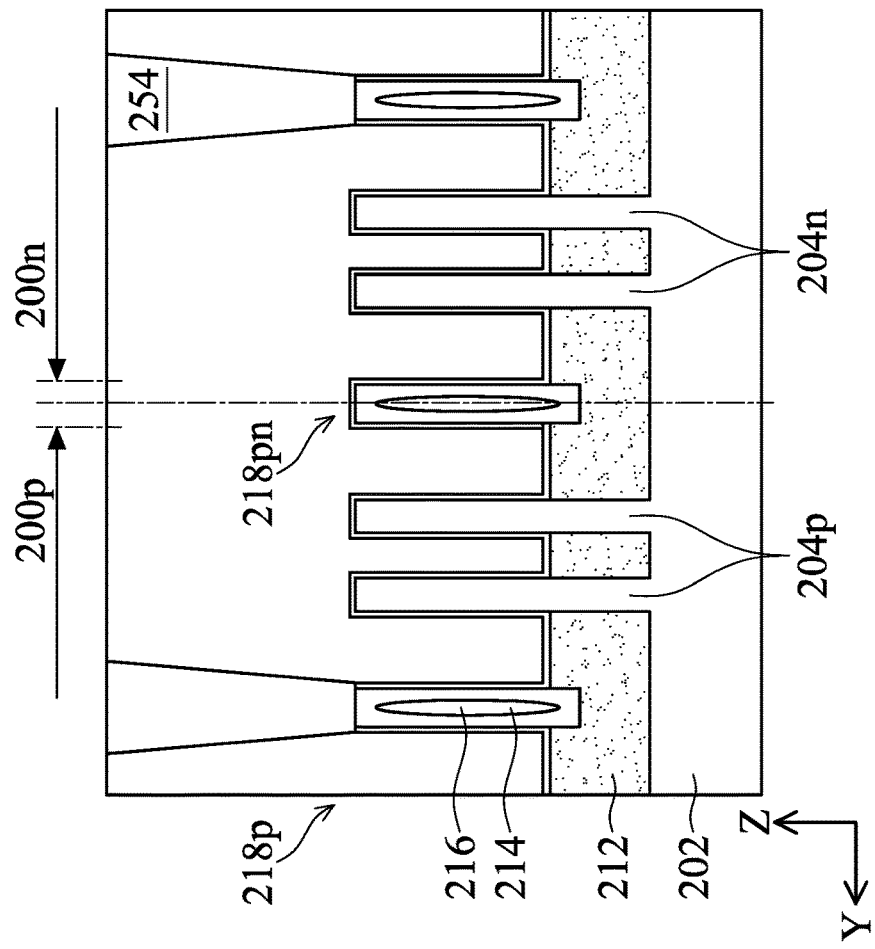
Figure 28D:
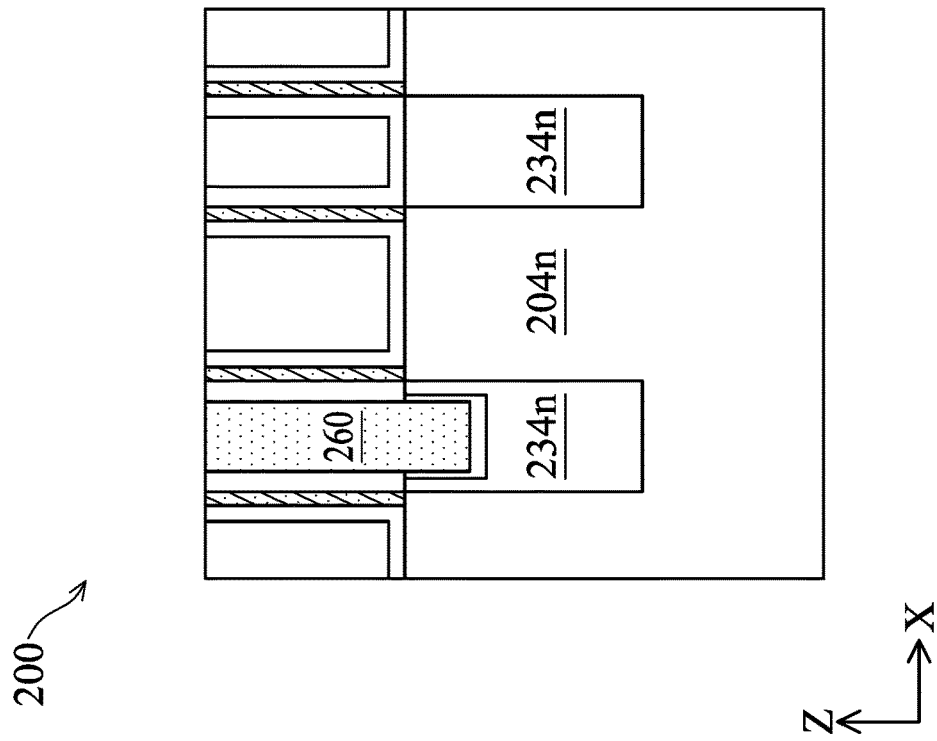
Figure 29:
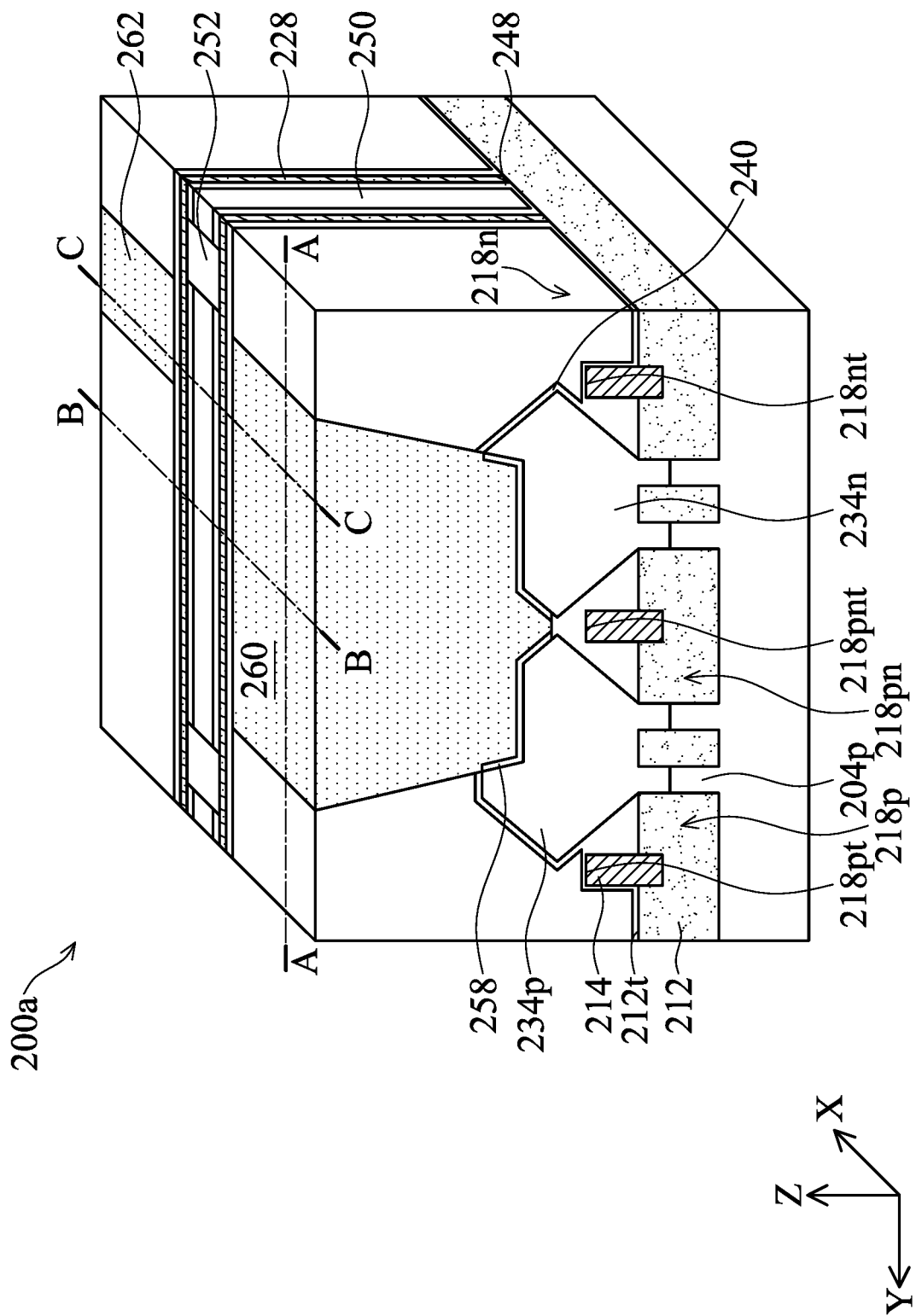
FIGS. 29, 29A, 29B, 29C illustrate various views of a semiconductor device according to embodiments of the present disclosure.
Figure 29A:
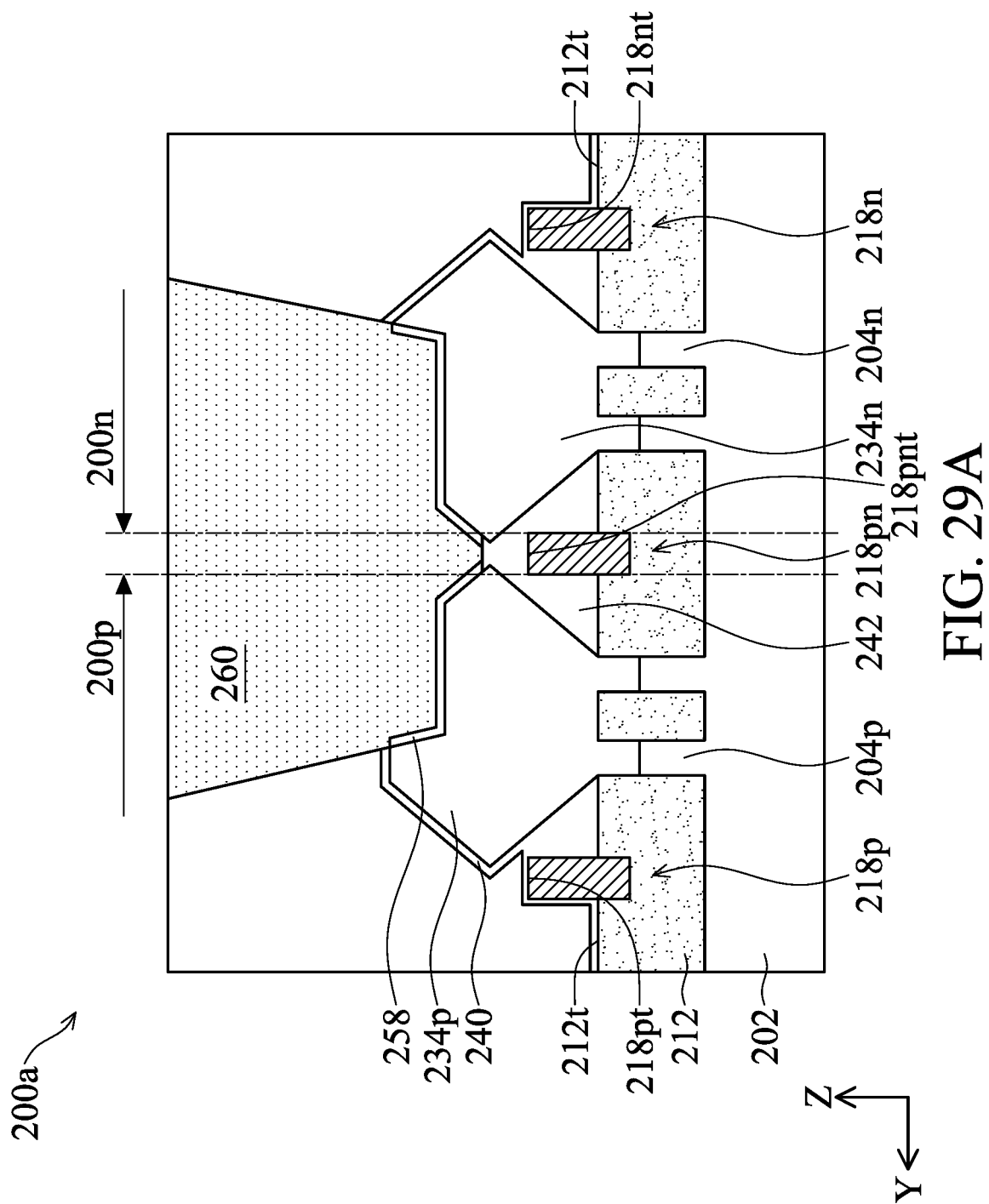
Figures 29B, 29C:
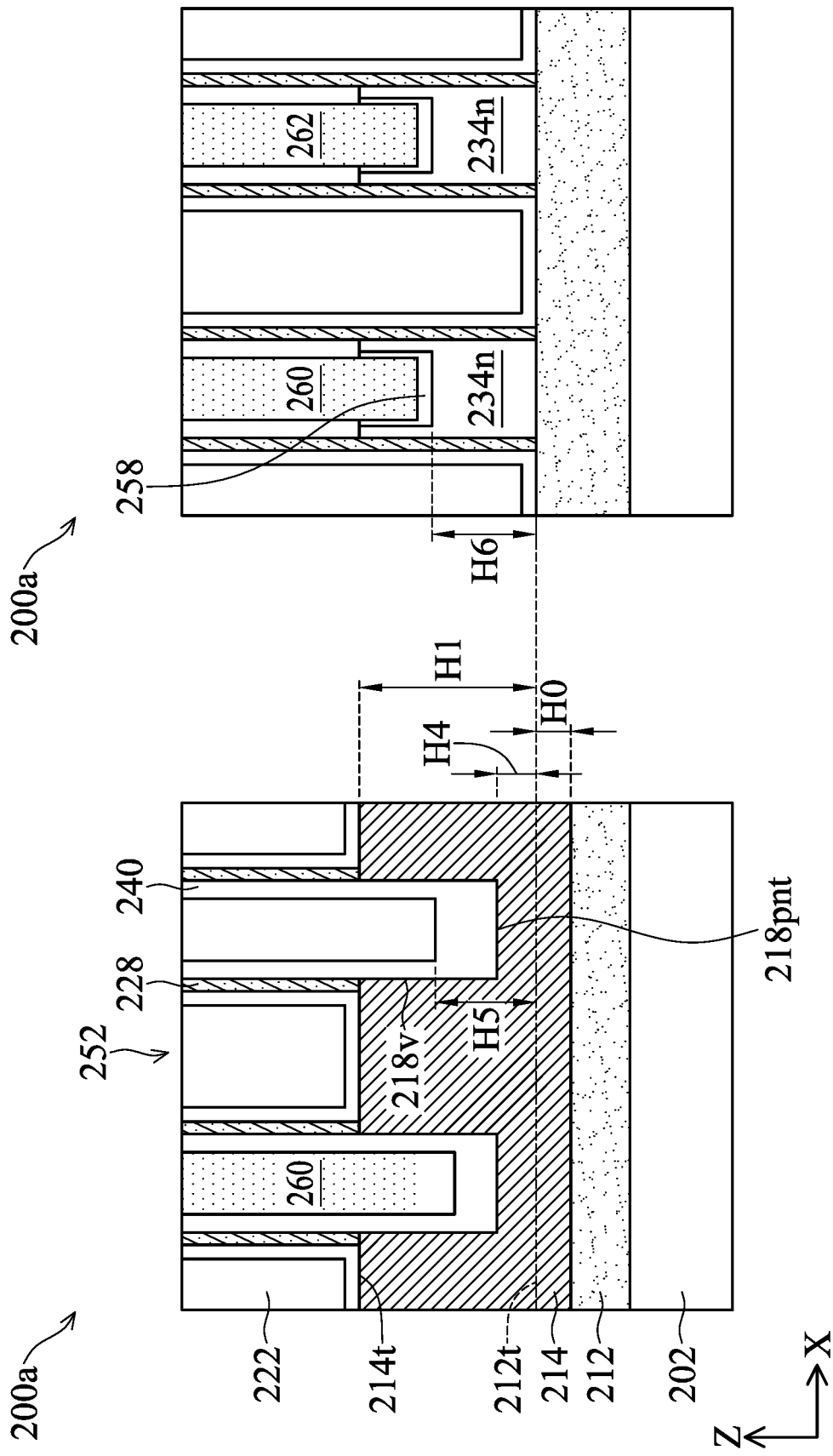

At operation 148 of the method 100, source/drain contact features 260, 262 are formed in the contact holes 255, 256, as shown in FIGS. 28, 28A, 28B, and 28C. FIG. 28A is a schematical sectional view of the semiconductor device 200 along the A-A line in FIG. 28. FIG. 28B is a schematical sectional view of the semiconductor device 200 along the B-B line in FIG. 28. FIG. 28C is a schematical sectional view of the semiconductor device 200 along the C-C line in FIG. 28.

In some embodiments, a silicide layer 258 is selectively formed over an exposed surface of the epitaxial source/drain features 234n, 234p exposed by the source/drain contact holes. In some embodiments, the silicide layer 258 is formed on the contact surfaces. In some embodiments, the silicide layer 258 includes one or more of WSi, CoSi, NiSi, TiSi, MoSi, and TaSi.

The source/drain contact features 260, 262 are then formed by filling a conductive material in the contact holes 255, 256. In some embodiments, the conductive material layer for the gate contact may be formed by CVD, PVD, plating, ALD, or other suitable technique. In some embodiments, the conductive material for the source/drain contact features 260, 262 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 246.

As shown in FIG. 28A, the source/drain contact feature 260, which is in connection to the epitaxial source/drain features 234p, 234n, may have a bottom surface 260b including at least three portions 260bn, 260bp, 260bh. The portion 260bn is in contact with the epitaxial source/drain feature 324n, the portion 260bp is in contact with the epitaxial source/drain feature 234p, and the portion 260bh is positioned over the hybrid fin 218pn. The portion 260bh may be in contact with a section of the CESL 240 that is positioned between the portion 260bp and the hybrid fin 218pn. In some embodiments, the portion 260bh is at a level below the portions 260bn and 260bp.

As shown in FIG. 28B, the hybrid fin 218pn positioned between the p-type epitaxial source/drain feature 234p and the n-type epitaxial source/drain feature 234n have two levels of height. In some embodiments, the hybrid fin 218pn under the gate having a first protruding fin height, H1, from the top surface 212t of the isolation layer 212. The hybrid fin 218pn outside the gate structure having a second protruding height, H4, from the top surface 212t of the isolation layer 212. The hybrid fin 218pn is taller under the gate structure and shorter between outside gate structure, or the first protruding height is taller than the second protruding height. In some embodiment, the cut top surface 218pnt is lower than the middle point of the semiconductor fin 204, or the widest portion of the epitaxial source/drain feature 234. In some embodiments, the second height is less than 50% of the first height. Because the cut top surface 218pnt of the hybrid fin 218pn is lower than the middle portion of the semiconductor fin 204, the contact hole for the source/drain contact feature, such as the source/drain contact feature 260, would not expose the hybrid fin 218pn. As a result, conductive material will not fill any air gaps in the hybrid fin 218pn when filling the contact hole with conductive material.

The portion of the hybrid fin 218 under the gate structure and the portion of the hybrid fin 218 outside the gate structure is connected by the vertical cut surfaces 218v. The vertical cut surfaces 218v of the hybrid fin 218 is in contact with the CESL 240. The hybrid fin 218pn outside the gate structure is defined by the cut top surface 218pnt. In some embodiments, the cut top surface 218pnt is in contact with the CESL 240. In some embodiments, the portion of CESL 240 on the hybrid fin 218pn has a thickness greater than the CESL 240 on the epitaxial source/drain features 234n, 234p.

In some embodiments, as shown in FIG. 28B, an air gap is included in the CESL 240 above the hybrid fins 218*pn*.

FIGS. 29, 29A, 29B, 29C schematically demonstrate a semiconductor device 200*a* according to the present disclosure. The semiconductor device 200*a* is substantially similar to the semiconductor device 200 of FIG. 28 except that there is no air gap presented in the CESL 240. Similar to the semiconductor device 200, the semiconductor device 200*a* may be fabricated using the method 100.

Figure 30:
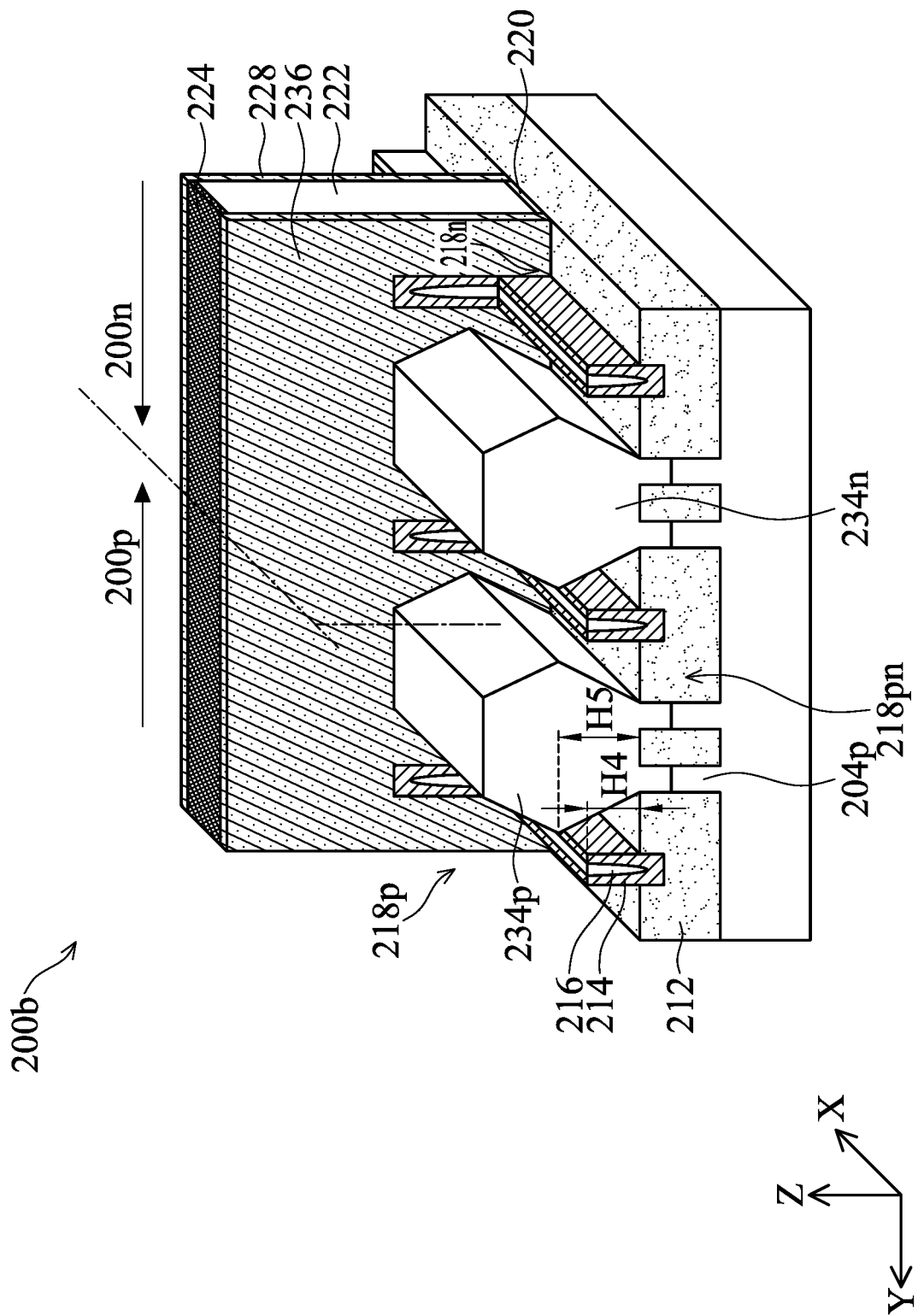
FIGS. 30-33, and 33A-33B illustrate various stages of a semiconductor device according to embodiments of the present disclosure.
Figure 31:
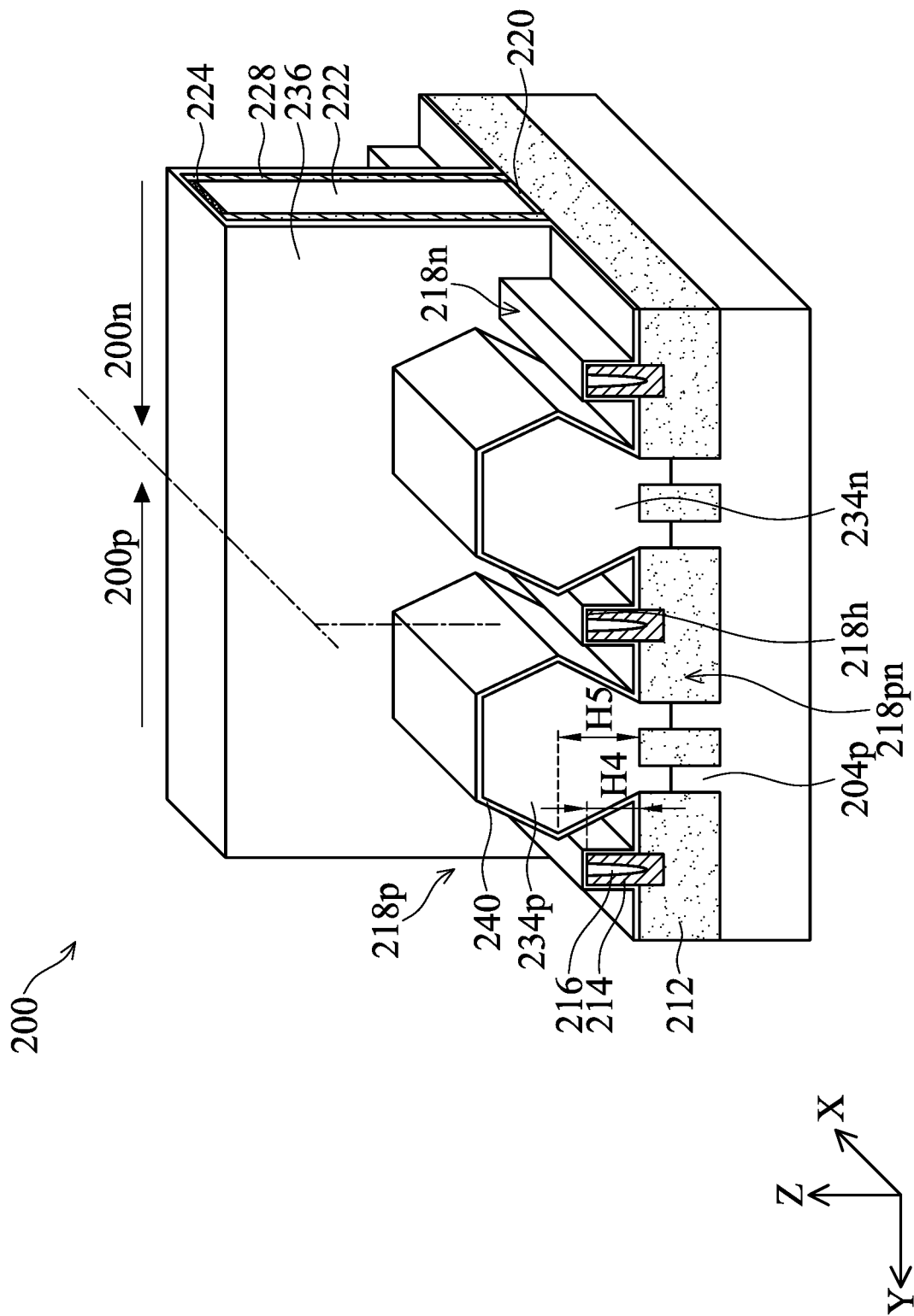

FIGS. 30-33 illustrate various stages of a semiconductor device 200*b* according to embodiments of the present disclosure. The semiconductor device 200*b* may be fabricated using the method 100 discussed above. The semiconductor device 200*b* is similar to the semiconductor device 200 with epitaxial source/drain features of different shapes. FIG. 30 is a schematic perspective view of the semiconductor device 200*b* after operation 132. As shown in FIG. 30, the epitaxial source/drain features 234*p*, 234*n* do not expand over the hybrid fin 218. FIG. 31 is a schematic perspective view of the semiconductor device 200*b* after operation 134, in which the CESL 240 is deposited. Because the epitaxial source/drain features 234*p*, 234*n* are further away from the cut top surface 218*pnt* of the hybrid fin 218*pn*, the CESL 240 has only a single thickness T1 formed thereon.

Figure 32:
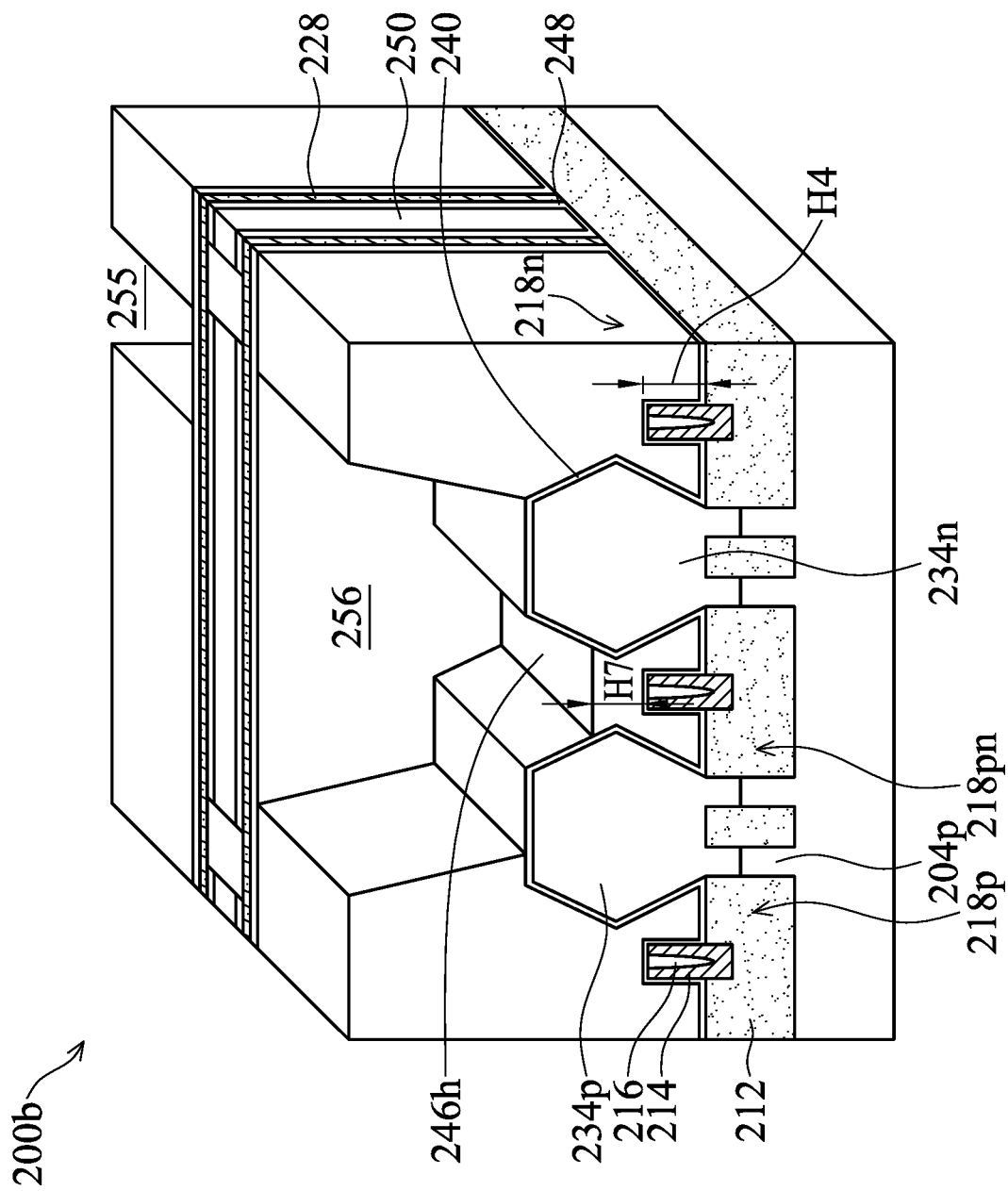

FIG. 32 is a schematic perspective view of the semiconductor device 200*b* after operation 144, in which the ILD layer 246 is removed to form the contact holes 255, 256. The ILD layer 246 is removed to a level 246*h* at a height H7 above the cut top surface 218*pnt* of the hybrid fin 218*pn*. The height H7 is a thickness adequate to protect the CESL 240 during operation 148, In some embodiments, the height H7 in a range between about 10 nm and 30 nm.

Figure 33:
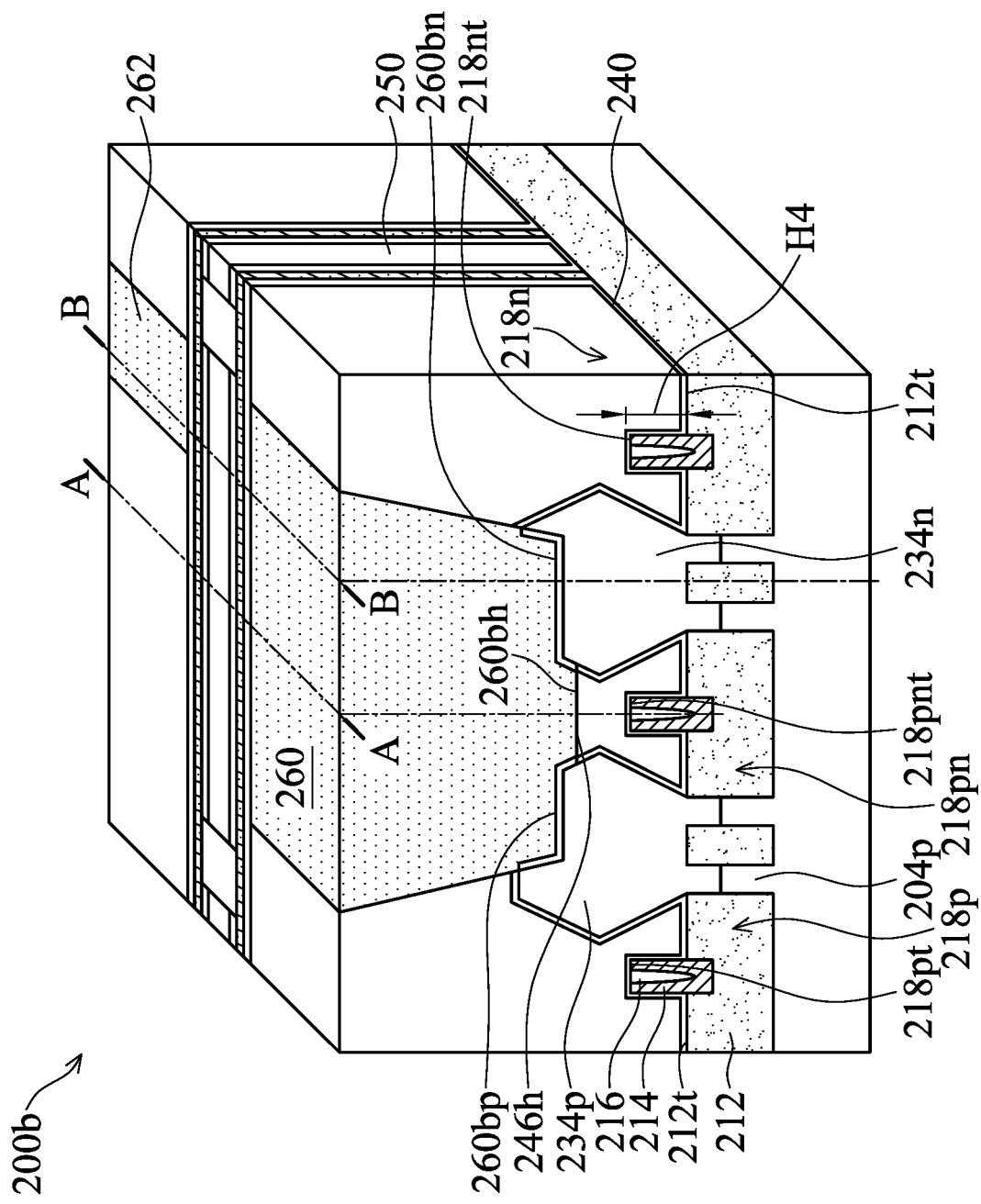
Figures 33A, 33B:
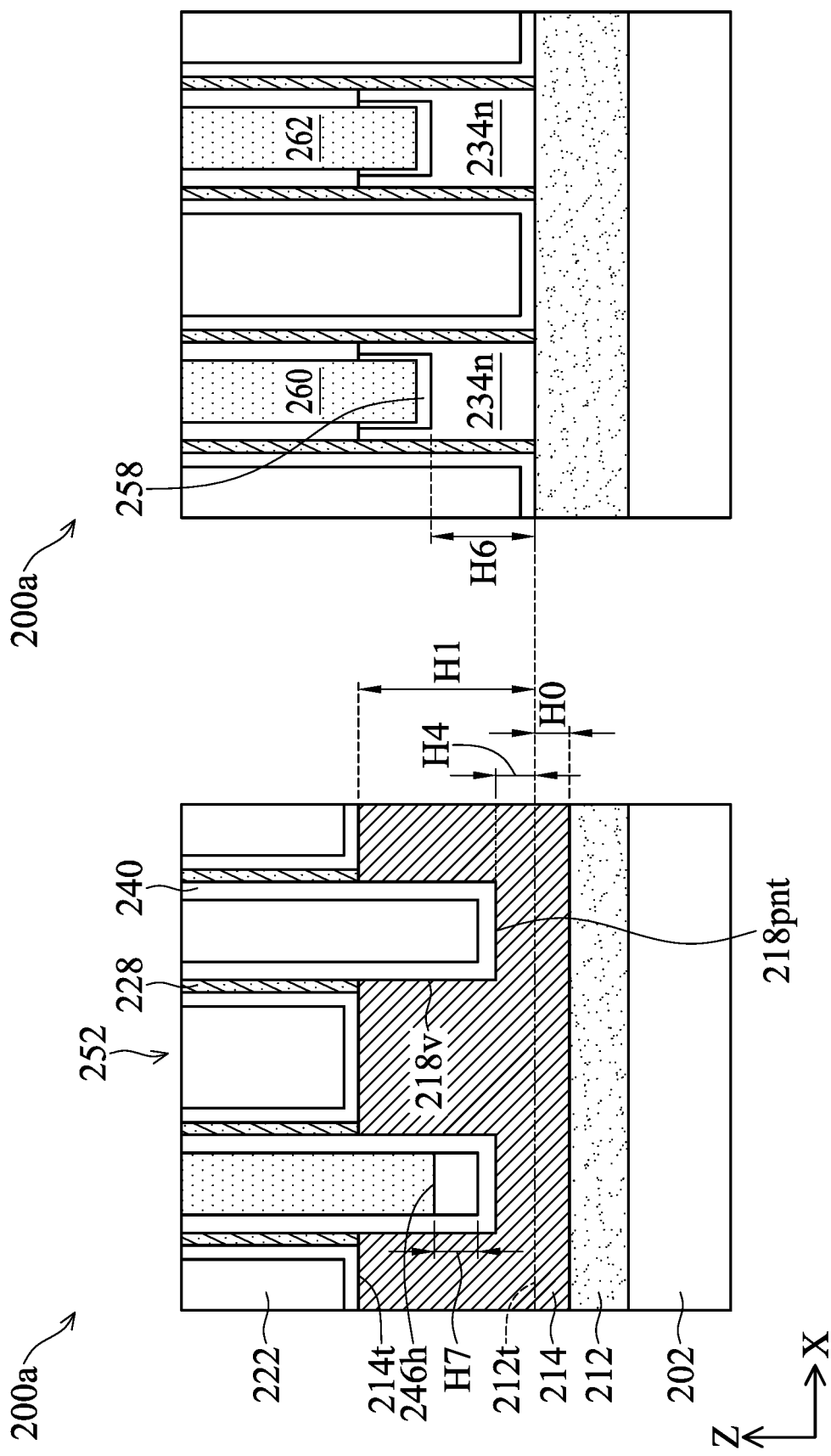

FIG. 33 is a schematic perspective view of the semiconductor device 200*b* after operation 148, in which the source/drain contact features 260 and 262 are formed. FIG. 33A is a sectional view of the semiconductor device 200*b* along the line A-A of FIG. 33. FIG. 33B is a sectional view of the semiconductor device 200*b* along the line B-B of FIG. 33.

As shown in FIG. 33, the portion 260*bh* of the bottom surface 260*b* of the source/drain contact feature 260 is positioned over the hybrid fin 218*pn*. The portion 260*bh* is in contact with the ILD layer 246 that is positioned between the portion 260*bp* and the hybrid fin 218*pn*.

As shown in FIG. 33A, the hybrid fin 218*pn* positioned between the p-type epitaxial source/drain feature 234*p* and the n-type epitaxial source/drain feature 234*n* have two levels of height. In some embodiments, the hybrid fin 218*pn* is taller under the gate structure and shorter between outside gate structure. The vertical cut surfaces 218*v* of the hybrid fin 218 is in contact with the CESL 240. In some embodiments, the cut top surface 218*pnt* is in contact with the CESL 240. In some embodiments, the portion of CESL 240 on the hybrid fin 218*pn* has substantially the same thickness of the CESL 240 on the epitaxial source/drain features 234*n*, 234*p*.

FIGS. 34-40 illustrate various stages of a semiconductor device 200*c* according to one embodiment of the present disclosure. The semiconductor device 200*c* may be fabricated using without etching back the hybrid fin 218*pn* positioned between the n-type device area 200*n* and the p-type device area 200*p* during formation of the epitaxial source/drain features 234*n*, 234*p*.

Figure 34:
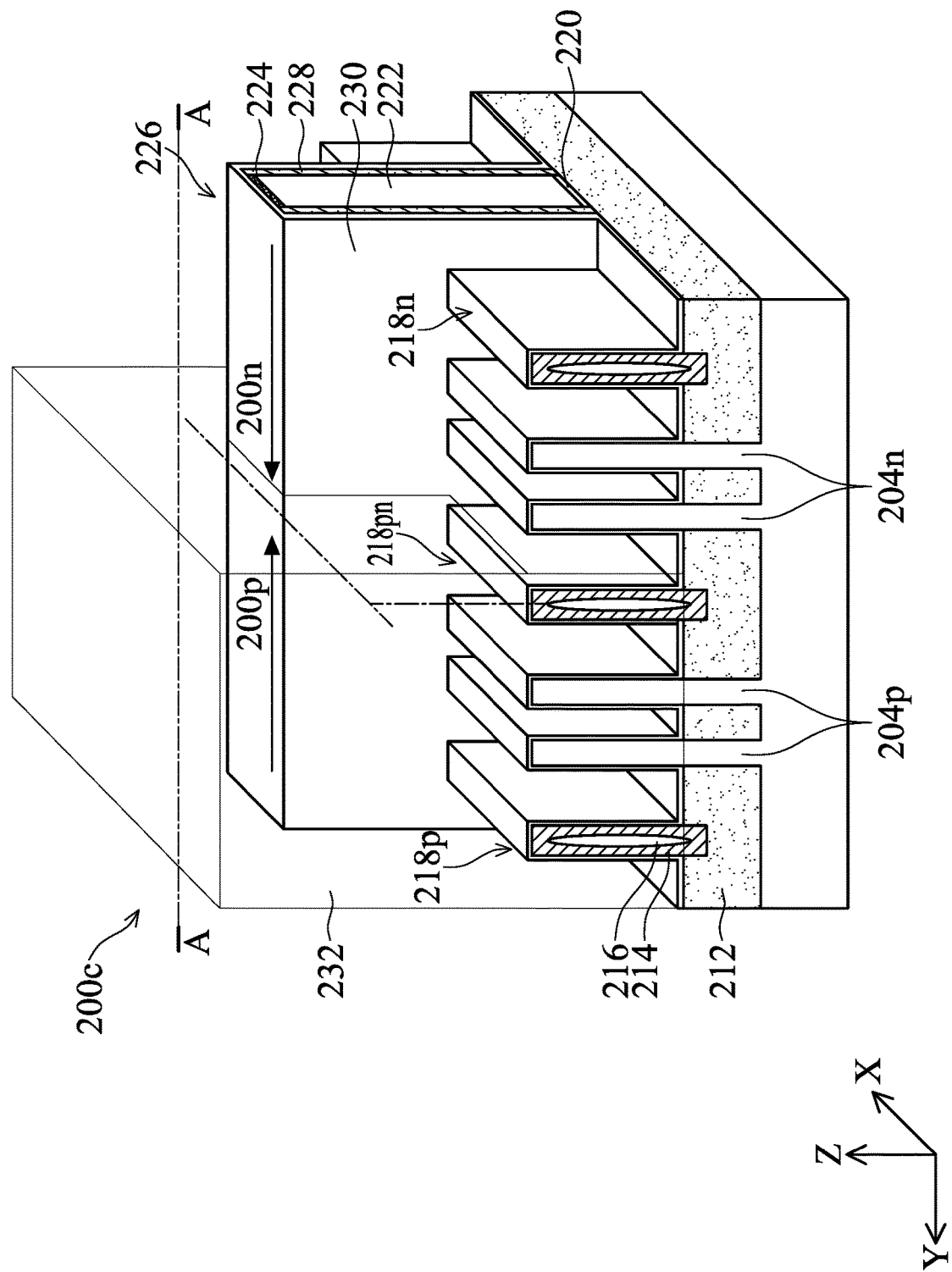
FIGS. 34-40, and 40A-40B illustrate various stages of a semiconductor device according to one embodiment of the present disclosure.

FIG. 34 is a schematic perspective view of the semiconductor device 200*c* during operation 116, in which the photoresist layer 232 is patterned to remove expose the n-type device area 200*n* for further processing. As shown in FIG. 34, the photoresist layer 232 is patterned to expose the sacrificial spacer layer 230 over the n-type device area 200*n* while the hybrid fin 218*pn* is not exposed.

Figure 35:
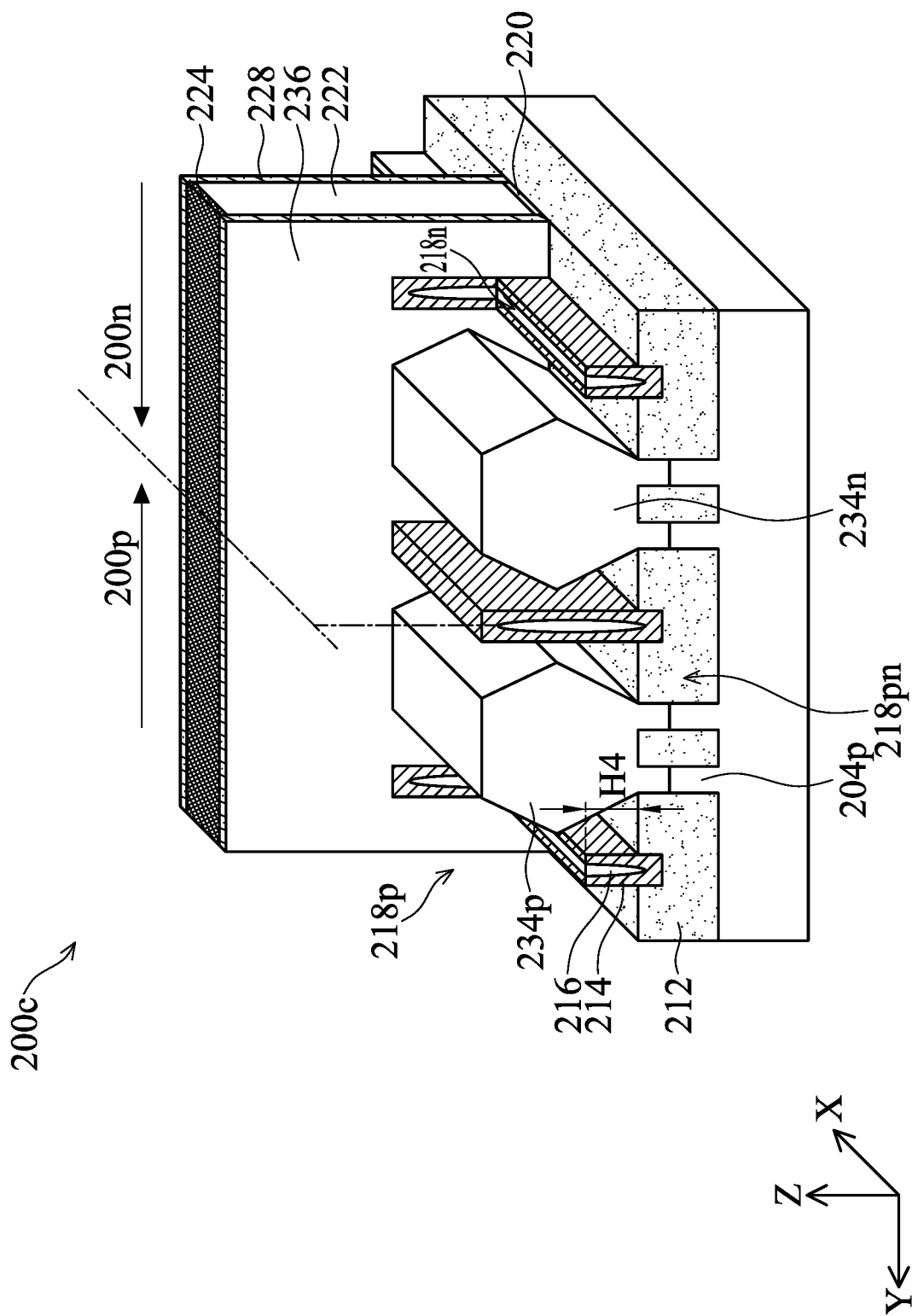
Figure 36:
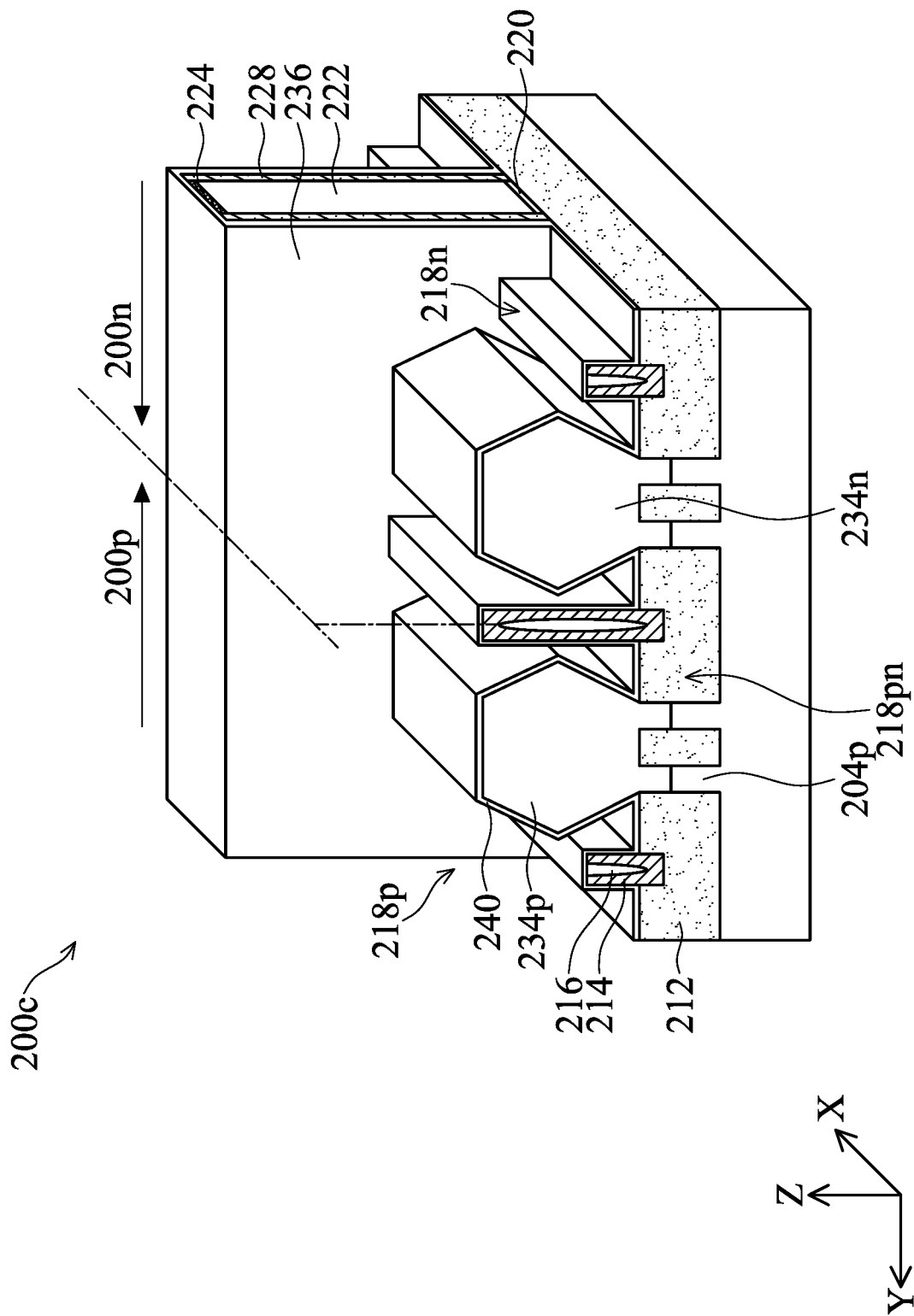

FIG. 35 is a schematic perspective view of the semiconductor device 200*c* after operation 132. The hybrid fin 218*pn* remains the original protruding fin height H1. FIG. 36 is a schematic perspective view of the semiconductor device 200*c* after operation 134, in which the CESL 240 is disposed over the exposed surfaces. The hybrid fin 218*pn* is covered by the CESL 240.

Figure 37:
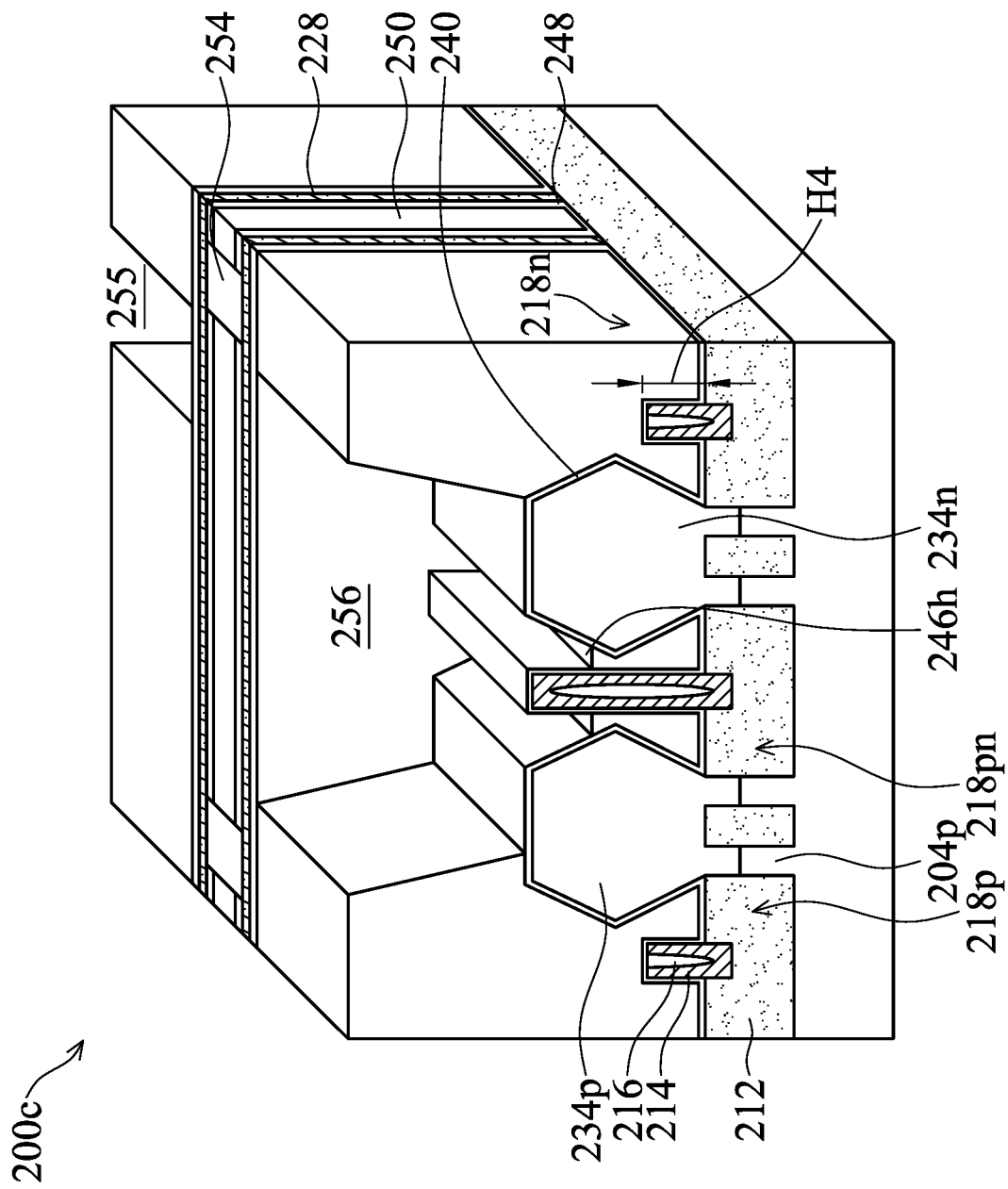

FIG. 37 is a schematic perspective view of the semiconductor device 200*b* after operation 144, in which the ILD layer 246 is removed to form the contact holes 255, 256. The ILD layer 246 is etched back to the level 246*h*. The hybrid fin 218*pn* along with the CESL 240 partially extends above the level 246*h*.

Figure 38:
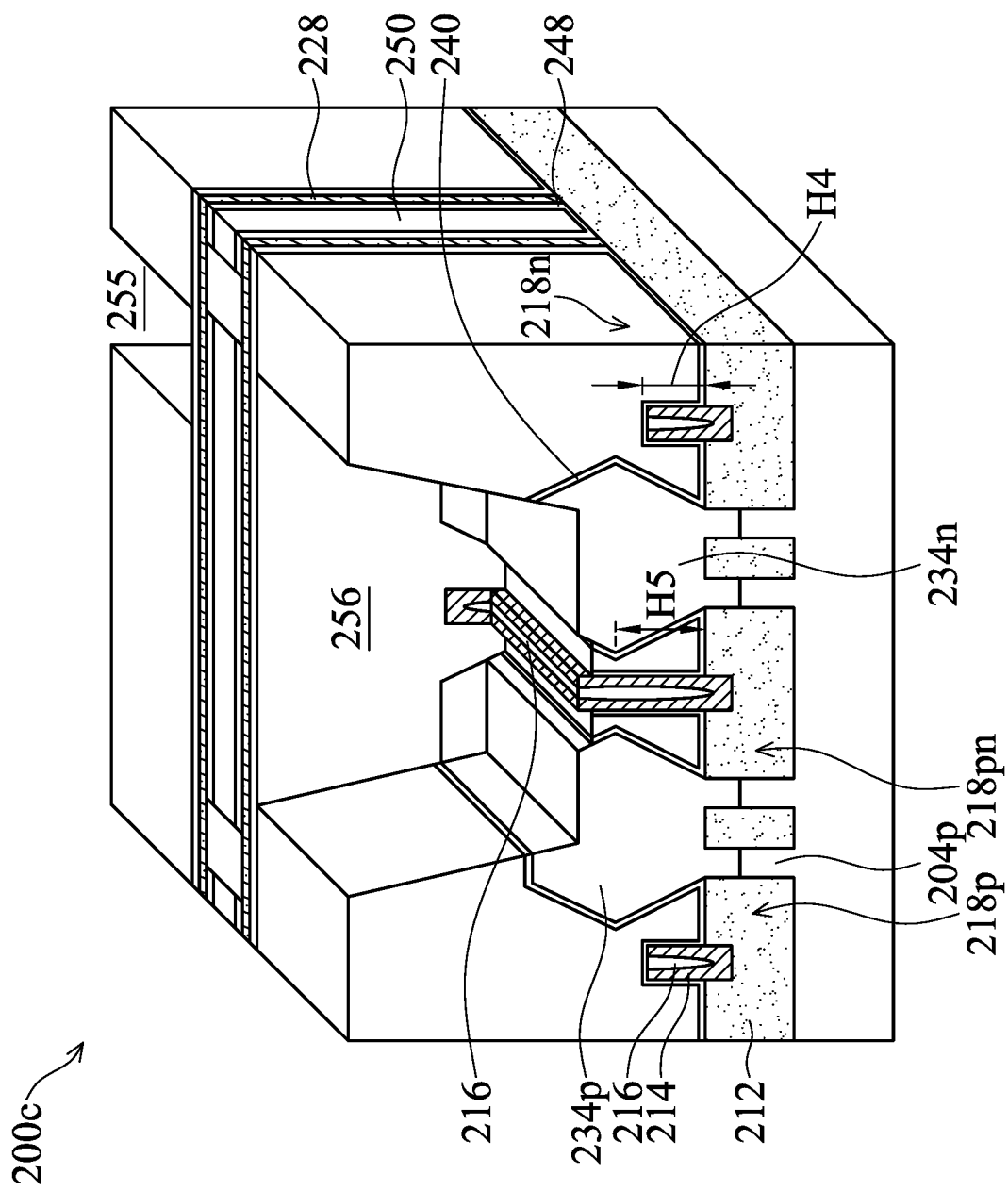

FIG. 38 is a schematic perspective view of the semiconductor device 200*b* after operation 146, in which an etch process is performed to remove the exposed CESL 240 to expose the epitaxial source/drain features 234*n*, 234*p*. During the removal of CESL 240, the hybrid fin 218*pn* may be also partially etched to a cut top surface 218*pnt'* exposing the air gaps 216.

Figure 39:
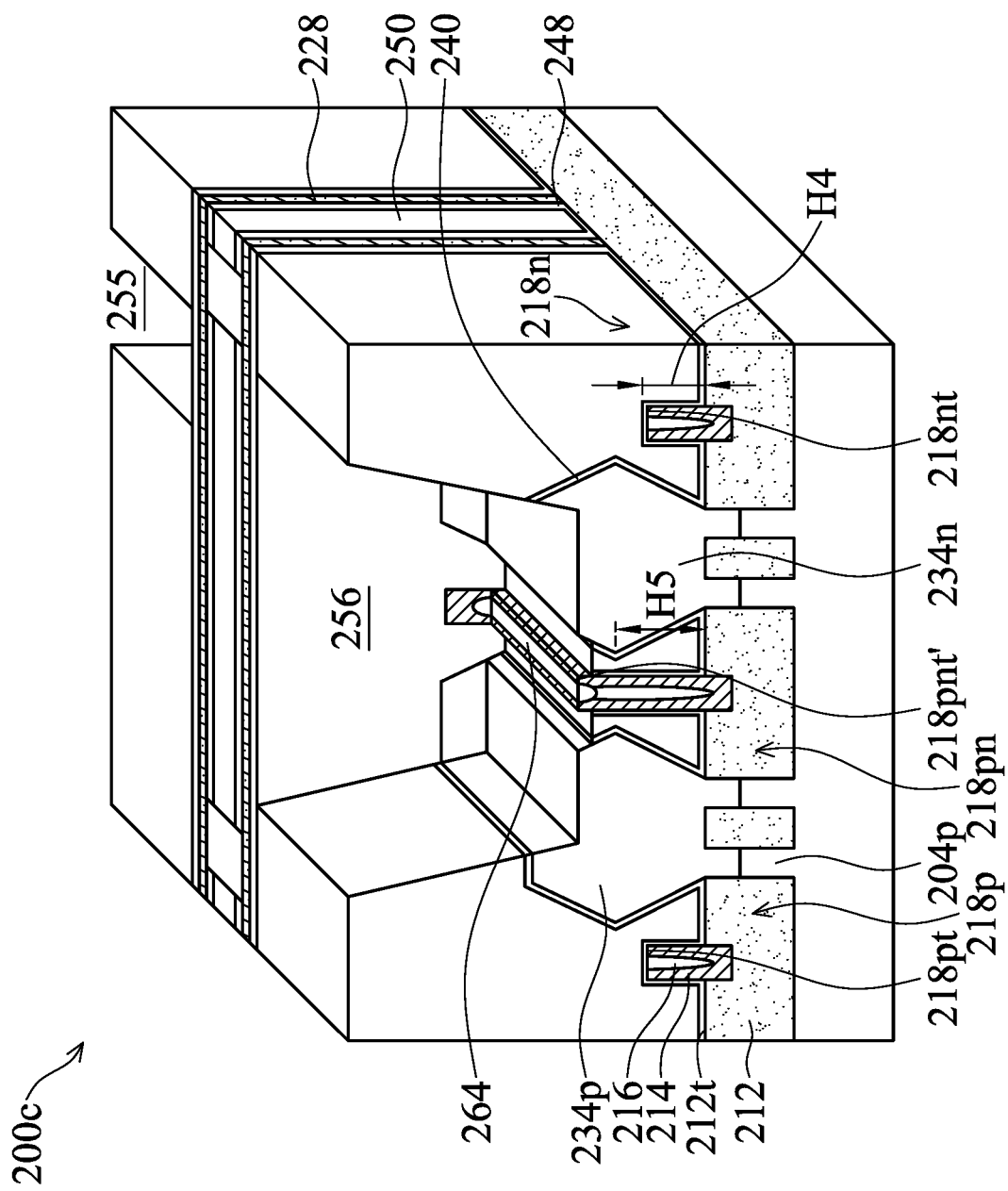

According to embodiments of the present disclosure, a deposition process followed by an etch back process may be performed after operation 146 and before operation 148 to fill the air gap 216 in the hybrid fin 218*pn* with a dielectric filling material 264, as shown in FIG. 39. In some embodiment, the dielectric filling material 264 may be silicon nitride (SiN), oxynitride, silicon carbon (SiC), silicon oxynitride (SiON), oxide, $SiO_2$, $Si_3N_4$, SiOCN, and the like. In some embodiments, the dielectric filling material 264 may include a high-k dielectric material, such as metal oxides, such as $HfO_2$, $ZrO_2$, $HfAlO_x$, $HfSiO_x$ and the like. The dielectric filling material 264 may be formed by methods utilized to form such a layer, such as CVD, plasma enhanced CVD, sputter, or other suitable methods to fill or at least partially fill the air gaps 216.

After the deposition process, an etch process is performed to remove any excess dielectric filling material 264 outside the air gaps 216. Any suitable etching methods may be used to remove the excess dielectric filling material 264.

In some embodiment, an over etch process may be performed to the epitaxial source/drain features 234*n*, 234*p* to produce contact surfaces in the epitaxial source/drain features 234*n*, 234 for the processes at operation 148.

Figure 40:
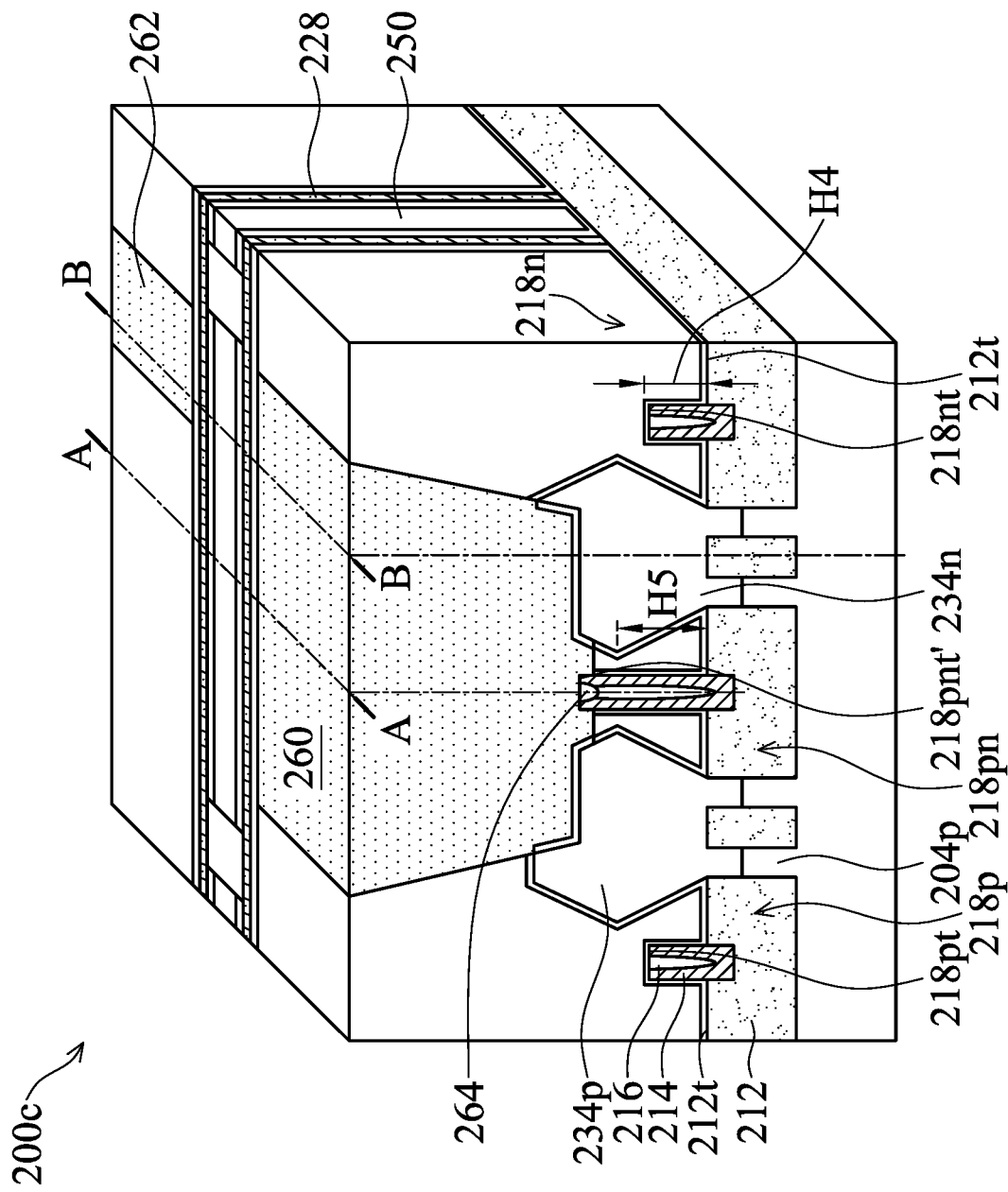
Figures 40A, 40B:
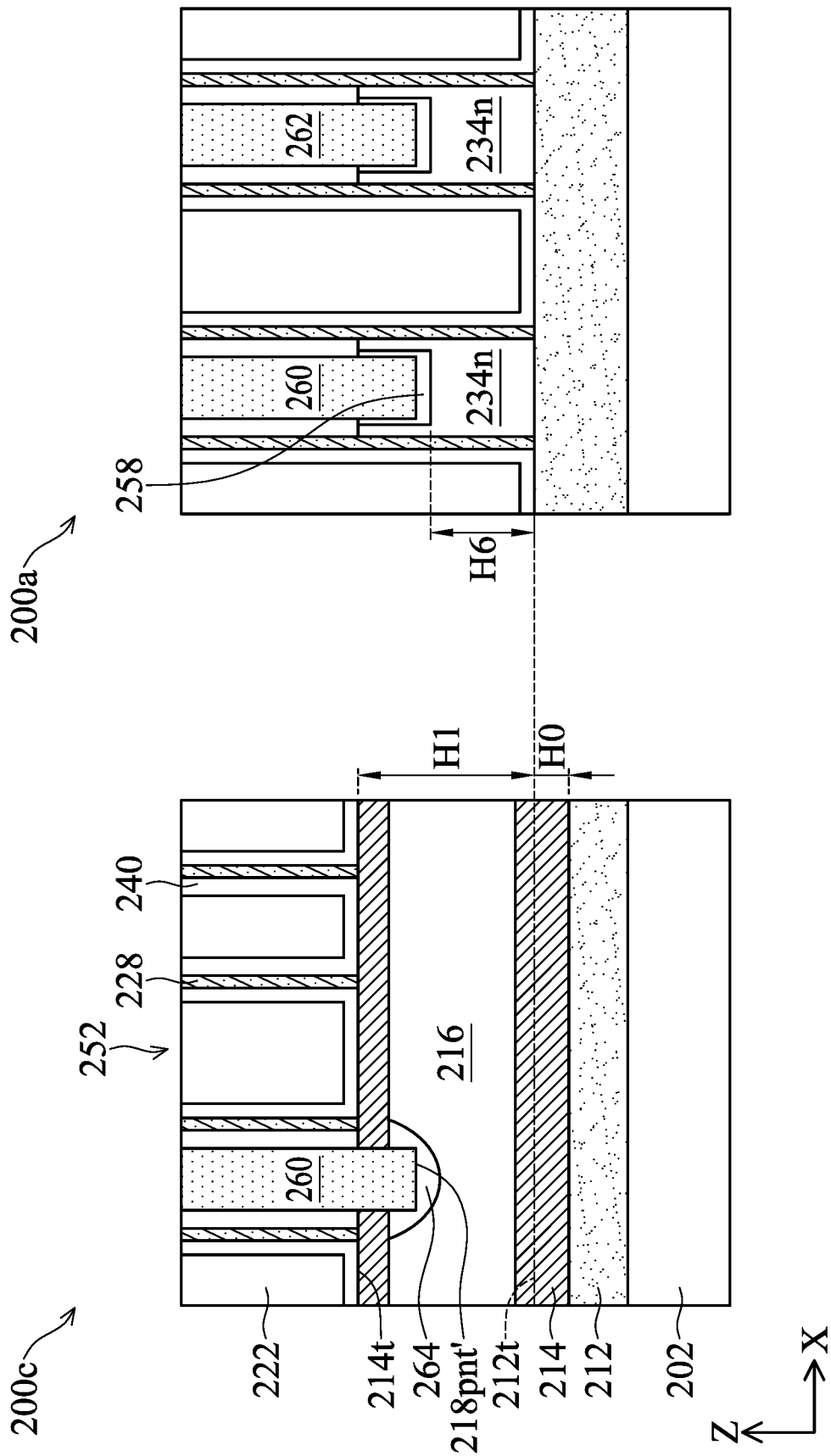

FIG. 40 is a schematic perspective view of the semiconductor device 200*c* after operation 148, in which the source/drain contact features 260 and 262 are formed. FIG. 40A is a sectional view of the semiconductor device 200*b* along the line A-A of FIG. 40. FIG. 40B is a sectional view of the semiconductor device 200*b* along the line B-B of FIG. 40.

As shown in FIG. 40, a top portion of the hybrid fin 218*pn* extends into the source/drain contact feature 260 from the portion 260*bh* of the bottom surface 260*b*. Exposed air gaps in the hybrid fin 218*pn* are filled with the dielectric filling material 264. The top portion of the hybrid fin 218*pn* is in direct contact with the source/drain contact feature 260. Because the air gaps on surfaces of the hybrid fin 218 are filled with the dielectric filling material 264, the dielectric filling material 264 prevents the conductive material from entering the interior of the hybrid fin 218*pn*, particularly, the interior portion under the gate structures.

By recessing portions of hybrid fins positioned between two different epitaxial source/drain features, embodiments of the present disclosure prevent conductive material from entering interior air gaps of the hybrid fin, thus, preventing short circuit between source/drain contacts and gate electrodes. Recessing the hybrid fins may be achieved by enlarging mask during semiconductor fin etch back, therefore, without increasing production cost.

It will be understood that not all advantages have been necessarily discussed herein, no particular advantage is required for all embodiments or examples, and other embodiments or examples may offer different advantages.

Some embodiments of the present disclosure provide a semiconductor device comprising an isolation layer having a top surface; a first epitaxial source/drain feature extending from the isolation layer above the top surface, wherein the first epitaxial source/drain feature is for an n-type device; a second epitaxial source/drain feature extending from the isolation layer above the top surface, wherein the second epitaxial source/drain feature is for p-type device; a hybrid fin disposed between the first epitaxial source/drain feature and the second epitaxial source/drain feature, wherein the hybrid fin has a first end embedded in the isolation layer and a second end extending above the top surface of the isolation layer; and a source/drain contact feature in electrical contact with the first and second epitaxial source/drain features at a bottom surface, wherein the bottom surface of the source/drain contact feature is above the second end of the hybrid fin.

Some embodiments of the present disclosure provide a semiconductor device comprising a first semiconductor fin; a second semiconductor fin; a first epitaxial source/drain feature in electrical contact with the first semiconductor fin, wherein the first epitaxial source/drain feature is doped with n-type dopants; a second epitaxial source/drain feature in electrical contact with the second semiconductor fin, wherein the second epitaxial source/drain feature is doped with p-type dopants; a hybrid fin disposed between the first and second semiconductor fins and the first and second epitaxial source/drain features; and a gate structure disposed over the first semiconductor fin, the second semiconductor fin, and the hybrid fin, wherein the hybrid fin has a first top surface below the gate structure, a second top surface between the first and second epitaxial source/drain features, and the second top surface is lower than the first top surface.

Some embodiments of the present disclosure provide a method for fabricating a semiconductor device, comprising forming a first semiconductor fin, a second semiconductor fin, and a hybrid fin between the first and second semiconductor fins; recess etching the first semiconductor fin and the hybrid fin while covering the second semiconductor fin with a first mask; forming a first epitaxial source/drain feature connected to the first semiconductor fin and doping the first epitaxial source/drain feature with n-type dopants; recess etching the second semiconductor fin while covering the hybrid fin and the second semiconductor fin with a second mask; and forming a second epitaxial source/drain feature connected to the second semiconductor fin and doping the second epitaxial source/drain feature with p-type dopants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a semiconductor device, comprising:
   forming a first semiconductor fin, a second semiconductor fin, and a dummy fin between the first and second semiconductor fins;
   recessing the first semiconductor fin and the dummy fin simultaneously without etching the second semiconductor fin, thereby forming a first source/drain opening;
   forming a first epitaxial source/drain feature connected to the first semiconductor fin and in the first source/drain opening;
   recessing the second semiconductor fin without etching the dummy fin and the first semiconductor fin, thereby forming a second source/drain opening; and
   forming a second epitaxial source/drain feature connected to the second semiconductor fin and in the second source/drain opening.

2. The method of claim 1, further comprising:
   depositing an etch stop layer (ESL) over the first and second epitaxial source/drain features and the dummy fin; and
   depositing an interlayer dielectric (ILD) layer over the ESL.

3. The method of claim 2, further comprising:
   forming an opening in the ILD layer over the first and second epitaxial source/drain features.

4. The method of claim 3, further comprising:
   etching the ESL from the first and second epitaxial source/drain features;
   forming a first silicide layer and a second silicide layer over the first epitaxial source/drain feature and the second epitaxial source/drain feature, respectively; and
   forming a conductive feature in the opening and on the first silicide layer and the second silicide layer.

5. The method of claim 1, wherein forming the first semiconductor fin, the second semiconductor fin, and the dummy fin comprises forming the first semiconductor fin, the second semiconductor fin, and the dummy fin to a first protruding height from a top surface of an isolation layer.

6. The method of claim 5, further comprising: forming a gate structure over the first semiconductor fin, the second semiconductor fin, and the dummy fin.

7. The method of claim 5, wherein the recessing of the first semiconductor fin and the dummy fin comprises recessing the dummy fin to a second protruding height from the top surface of the isolation layer, wherein the second protruding height is shorter than 50% of the first protruding height.

8. A method, comprising:
   forming a first semiconductor fin and a second semiconductor fin protruding from a substrate;
   forming a dummy fin disposed between the first semiconductor fin and the second semiconductor fin;
   performing a first etching process to remove a portion of the first semiconductor fin and a second etching process to remove a portion of the second semiconductor fin, thereby forming a first source/drain opening and a second source/drain opening, respectively, wherein the performing of the first etching process further recesses a portion of the dummy fin;
   forming a first source/drain feature and a second source/drain feature in the first source/drain opening and the second source/drain opening, respectively; and
   forming an etch stop layer extending over the first source/drain feature and the second source/drain feature.

9. The method of claim 8, further comprising:
forming an isolation feature extending between lower portions of the first semiconductor fin and the second semiconductor fin,
wherein the dummy fin extends into the isolation feature.

10. The method of claim 8, further comprising:
forming a dummy gate structure intersecting the first semiconductor fin, the second semiconductor fin, and the dummy fin,
wherein the etch stop layer further extends along a sidewall surface of a portion of the dummy fin disposed directly under the dummy gate structure.

11. The method of claim 10, wherein a height of the recessed portion of the dummy fin disposed laterally between the first and second source/drain features is less than a height of the portion of the dummy fin disposed directly under the dummy gate structure.

12. The method of claim 8, further comprising:
forming an interlayer dielectric (ILD) layer over the etch stop layer;
forming an opening extending through the ILD layer and the etch stop layer to expose both the first source/drain feature and the second source/drain feature, wherein the opening does not expose the dummy fin; and
forming a conductive feature in the opening.

13. The method of claim 12, further comprising:
before forming the conductive feature, forming a first silicide layer on the first source/drain feature and a second silicide layer on the second source/drain feature,
wherein the first silicide layer is physically separated from the second silicide layer by a portion of the conductive feature.

14. The method of claim 13, wherein the portion of the conductive feature is in direct contact with the etch stop layer.

15. The method of claim 8, wherein the first source/drain feature comprises an n-type dopant, and the second source/drain feature comprises a p-type dopant.

16. A method, comprising:
forming an active region over a substrate and extending lengthwise along a first direction, the active region comprising a channel region and a source/drain region;
forming a dummy fin alongside the active region, the dummy fin having a first portion adjacent to the channel region and a second portion adjacent to the source/drain region;
performing an etching process to form a source/drain opening in the source/drain region, wherein the etching process further reduces a height of the second portion of the dummy fin;
forming a source/drain feature in the source/drain opening;
conformally depositing an etch stop layer over the substrate;
forming an interlayer dielectric (ILD) layer over the etch stop layer;
forming an opening extending through the ILD layer and the etch stop layer to expose the source/drain feature; and
forming a conductive feature in the opening,
wherein a bottommost surface of the conductive feature is above a top surface of the dummy fin.

17. The method of claim 16, wherein the etch stop layer comprises a first portion in direct contact with the dummy fin and a second portion directly over the first portion, wherein the forming of the opening comprises performing an etching process to partially remove the second portion of the etch stop layer and the source/drain feature.

18. The method of claim 16, further comprising:
before the forming of the conductive feature, forming a silicide layer in the opening,
wherein, a bottommost surface of the silicide layer is in direct contact with the etch stop layer.

19. The method of claim 16, wherein the etch stop layer encloses an air gap disposed vertically between the dummy fin and the conductive feature.

20. The method of claim 16, wherein, a bottommost surface of the conductive feature is in direct contact with the etch stop layer.

* * * * *